(12) United States Patent
Kuenanz et al.

(10) Patent No.: US 10,770,324 B2
(45) Date of Patent: Sep. 8, 2020

(54) SUBSTRATE HOLDING DEVICE, SUBSTRATE TRANSPORT DEVICE, PROCESSING ARRANGEMENT AND METHOD FOR PROCESSING A SUBSTRATE

(71) Applicant: VON ARDENNE Asset GmbH & Co. KG, Dresden (DE)

(72) Inventors: Robert Kuenanz, Dresden (DE); Jens Melcher, Dresden (DE); Georg Laimer, Meissen (DE); Erwin Zschieschang, Dresden (DE); Bjoern Hornbostel, Dresden (DE); Christoph Haeusler, Freital (DE)

(73) Assignee: VON ARDENNE Asset GmbH & Co. KG, Dresden (DE)

( * ) Notice: Subject to any disclaimer, the term of this patent is extended or adjusted under 35 U.S.C. 154(b) by 505 days.

(21) Appl. No.: 15/531,007

(22) PCT Filed: Nov. 26, 2015

(86) PCT No.: PCT/EP2015/077778
§ 371 (c)(1),
(2) Date: May 26, 2017

(87) PCT Pub. No.: WO2016/083508
PCT Pub. Date: Jun. 2, 2016

(65) Prior Publication Data
US 2017/0323815 A1    Nov. 9, 2017

(30) Foreign Application Priority Data

Nov. 26, 2014 (DE) .......... 10 2014 117 347
Jan. 28, 2015 (DE) .......... 10 2015 101 221
(Continued)

(51) Int. Cl.
*H01L 21/687* (2006.01)
*H01L 21/673* (2006.01)
(Continued)

(52) U.S. Cl.
CPC ........ *H01L 21/67346* (2013.01); *C23C 14/34* (2013.01); *C23C 14/50* (2013.01);
(Continued)

(58) Field of Classification Search
CPC ......... H01L 21/67346; H01L 21/68707; H01L 21/68735; H01L 21/68721; C23C 14/50;
(Continued)

(56) References Cited

U.S. PATENT DOCUMENTS 4,512,841 A   4/1985   Cunningham, Jr. et al.
5,012,924 A   5/1991   Murphy
(Continued)

FOREIGN PATENT DOCUMENTS

CN    101399173 A    4/2009
DE    197 43 211 A1   6/1998
(Continued)

OTHER PUBLICATIONS

Japanese Office Action and Search Report based on application No. 2017-528965 (25 pages) dated Jun. 26, 2018 (Reference Purpose Only).
(Continued)

*Primary Examiner* — Orlando E Aviles
*Assistant Examiner* — Mahdi H Nejad
(74) *Attorney, Agent, or Firm* — Viering, Jentschura & Partner mbB

(57) ABSTRACT

In accordance with various embodiments, provision is made of a substrate holding device, wherein the latter may comprise a carrier plate with a recess, the recess extending from an upper side of the carrier plate to a lower side of the carrier
(Continued)

plate through the carrier plate, a holding frame, which has a frame opening and a support area, surrounding the frame opening, for holding a substrate in the recess, wherein the holding frame inserted into the recess lies on the carrier plate in sections.

19 Claims, 22 Drawing Sheets

(30) Foreign Application Priority Data

Jul. 6, 2015 (DE) .................. 10 2015 110 854
Aug. 17, 2015 (DE) .................. 10 2015 113 529

(51) Int. Cl.
*C23C 14/34* (2006.01)
*C23C 14/50* (2006.01)
C23C 16/458 (2006.01)

(52) U.S. Cl.
CPC .... *C23C 16/4585* (2013.01); *H01L 21/68707* (2013.01); *H01L 21/68735* (2013.01)

(58) Field of Classification Search
CPC ..... C23C 16/4585; B05C 13/00; B05C 13/02; B05C 13/025
USPC ........................................................ 29/281.1
See application file for complete search history.

(56) References Cited

U.S. PATENT DOCUMENTS

| | | | |
|---|---|---|---|
| 5,101,975 A | 4/1992 | Runyon et al. | |
| 5,103,976 A | 4/1992 | Murphy | |
| 5,951,720 A | 9/1999 | Arakawa et al. | |
| 6,051,122 A * | 4/2000 | Flanigan | C23C 16/4585 118/720 |
| 6,168,669 B1 * | 1/2001 | Yasuda | H01L 21/68707 118/719 |
| 6,355,108 B1 * | 3/2002 | Won | C23C 16/24 118/500 |
| 8,528,889 B2 * | 9/2013 | Nakano | H01L 21/67742 269/289 R |
| 2005/0031497 A1 * | 2/2005 | Siebert | H01L 21/68707 279/4.12 |
| 2005/0061665 A1 * | 3/2005 | Pavani | C25D 17/08 204/297.06 |
| 2010/0186669 A1 | 7/2010 | Shin et al. | |
| 2010/0216313 A1 * | 8/2010 | Iwai | H01J 37/32623 438/729 |
| 2011/0159200 A1 | 6/2011 | Kogure | |
| 2011/0303154 A1 | 12/2011 | Kim et al. | |
| 2012/0067274 A1 * | 3/2012 | Hara | C23C 16/4583 117/88 |
| 2012/0213500 A1 * | 8/2012 | Koelmel | F27D 11/12 392/416 |
| 2012/0280442 A1 | 11/2012 | Hertel et al. | |
| 2013/0029479 A1 | 1/2013 | Jost et al. | |
| 2013/0210183 A1 | 8/2013 | Soga et al. | |
| 2014/0017900 A1 * | 1/2014 | Doba | H01J 37/32091 438/710 |
| 2014/0030048 A1 * | 1/2014 | Kosuge | H01L 21/677 414/225.01 |
| 2016/0060756 A1 * | 3/2016 | Park | C23C 16/042 118/725 |
| 2017/0278681 A1 * | 9/2017 | Qi | H01J 37/32715 |

FOREIGN PATENT DOCUMENTS

| | | |
|---|---|---|
| DE | 20 2009 001 817 U1 | 6/2009 |
| DE | 102011006833 A1 | 10/2012 |
| DE | 20 2014 002 365 U1 | 7/2014 |
| DE | 10 2015 101 221 A1 | 6/2016 |
| EP | 2360721 A1 | 8/2011 |
| JP | H08330397 A | 12/1996 |
| JP | H11131232 A | 5/1999 |
| JP | 2002280441 A | 9/2002 |
| JP | 2004022571 A1 | 1/2004 |
| JP | 2009081259 A | 4/2009 |
| JP | 2009228050 A | 10/2009 |
| JP | 2010274927 A | 12/2010 |
| JP | 2011061023 A | 3/2011 |
| JP | 2011108928 A | 6/2011 |
| JP | 2012004548 A | 1/2012 |
| JP | 2012186226 A | 9/2012 |
| JP | 2012234924 A | 11/2012 |
| JP | 2013004613 A | 1/2013 |
| JP | 3182013 U | 2/2013 |
| JP | 2013165131 A | 8/2013 |
| JP | 2013201432 A | 10/2013 |
| WO | 9903139 A1 | 1/1999 |
| WO | 2010085949 A2 | 8/2010 |
| WO | 2012136586 A1 | 10/2012 |
| WO | 2013188519 A1 | 12/2013 |
| WO | 2014143703 A1 | 9/2014 |

OTHER PUBLICATIONS

German Office Action based on application No. 10 2015 101 221.9 (9 pages) dated Aug. 31, 2015 (for reference purpose only).
German Office Action based on application No. 10 2015 110 854.2 (9 pages) dated Apr. 29, 2016 (for reference purpose only).
German Search Report based on application No. 10 2015 113 529.9 (10 pages) dated Jul. 25, 2016 (for reference purpose only).
International Search Report based on application No. PCT/EP2015/ 077778 (6 pages+3 pages English translation) dated Feb. 22, 2016 (for reference purpose only).
Japanese Notice of Rejection issued for Japanese counterpart application 2017528965, dated Dec. 11, 2018, 4 pages and 4 pages translation (for reference purpose only).
German Office Action based on application No. 11 2015 004 190.7 (10 pages) dated Feb. 14, 2018 (Reference Purpose Only).
Chinese Office Action for corresponding Chinese Patent Application 201580074610.9, dated Nov. 1, 2019, 19 pages (10 pages+9 pages Translation) (for reference purpose only).

* cited by examiner

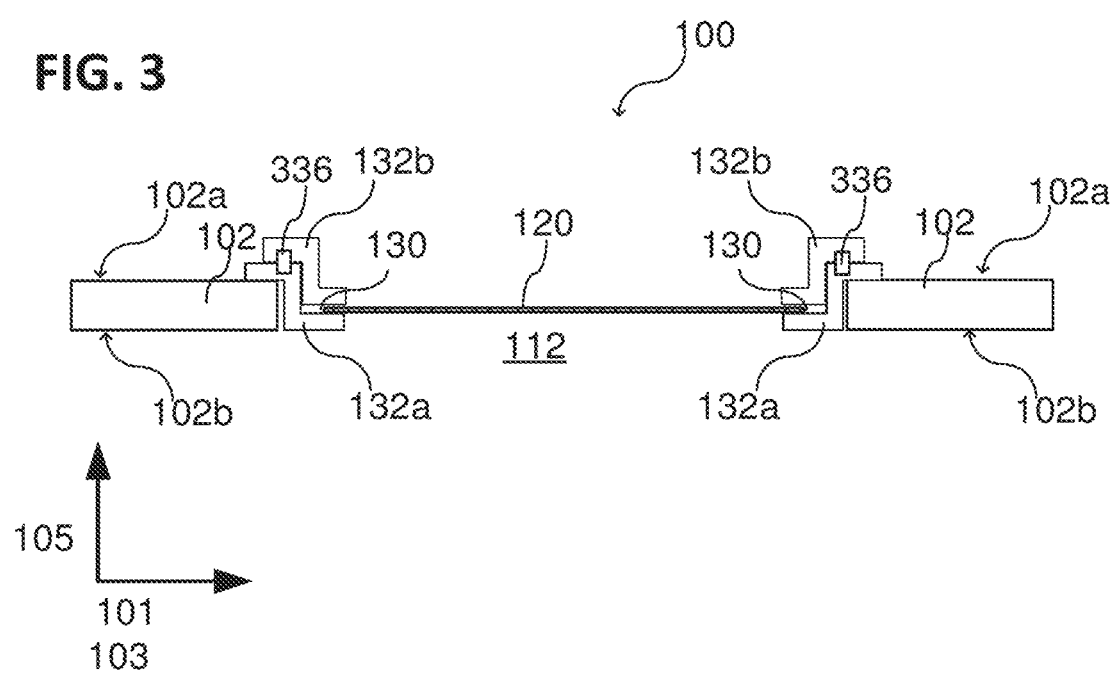

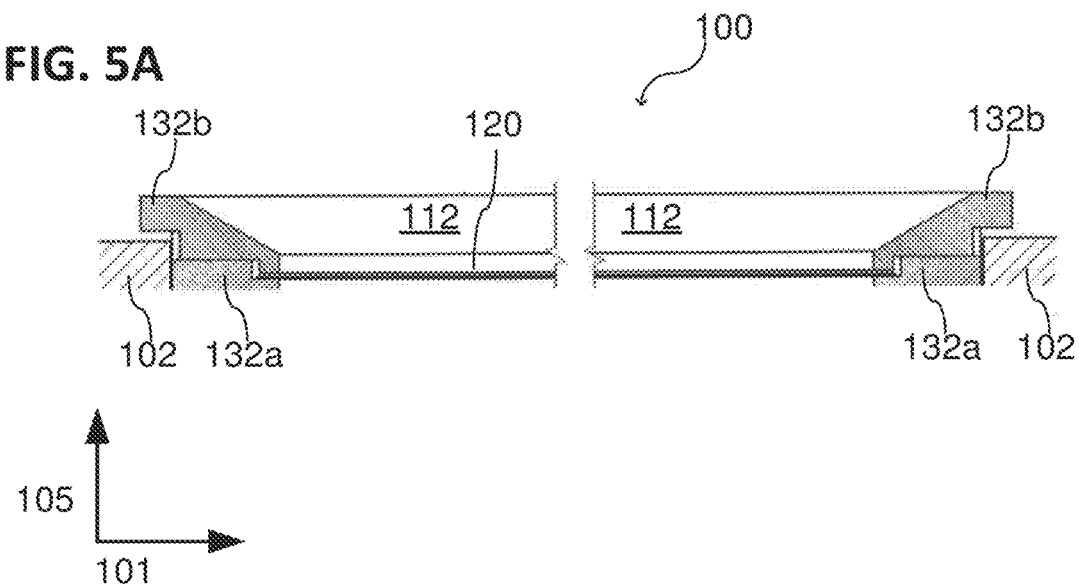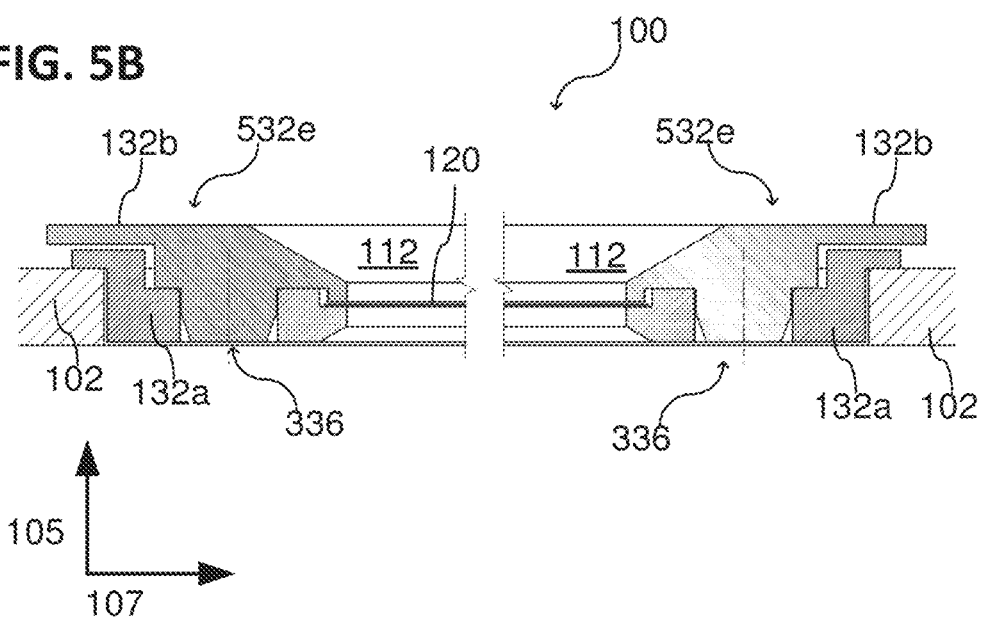

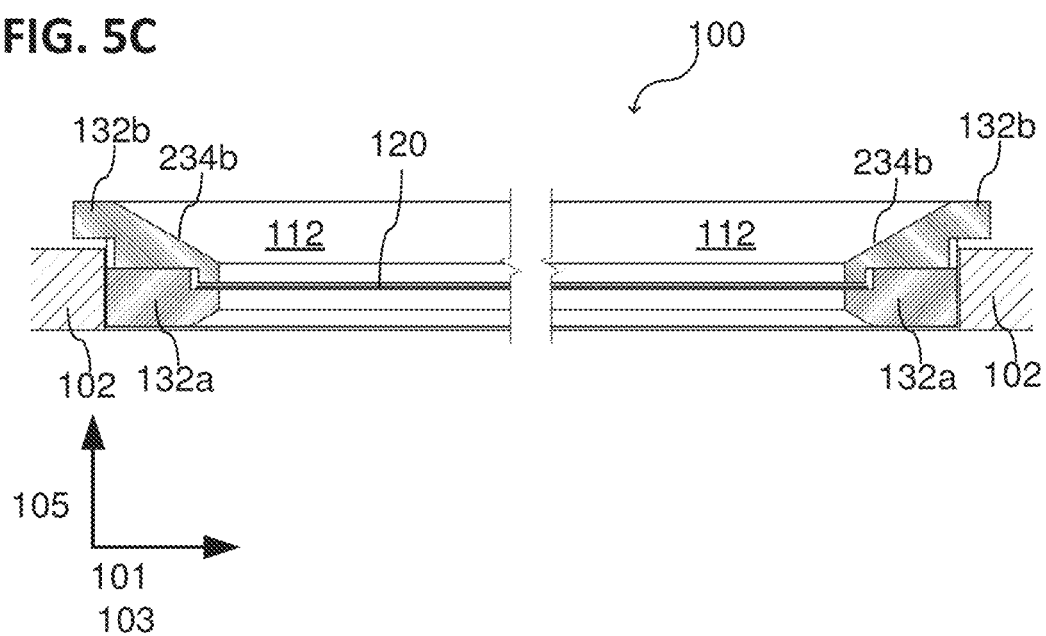

FIG. 6A
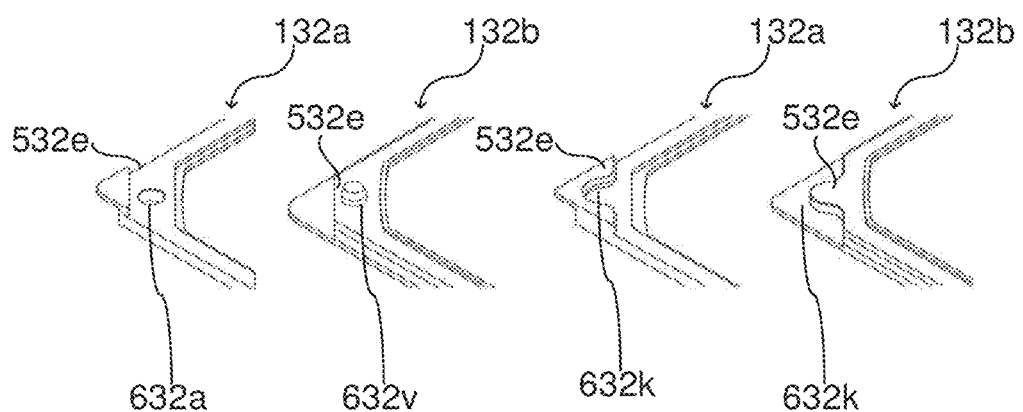
FIG. 6B
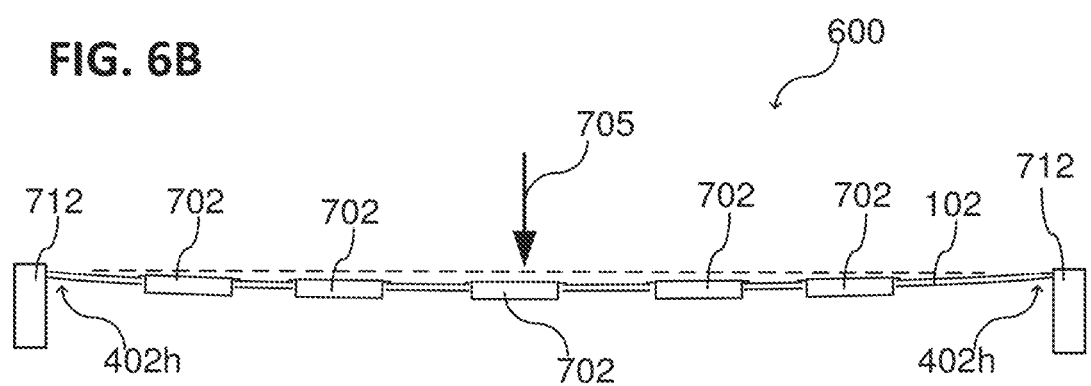
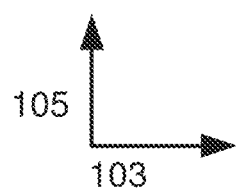

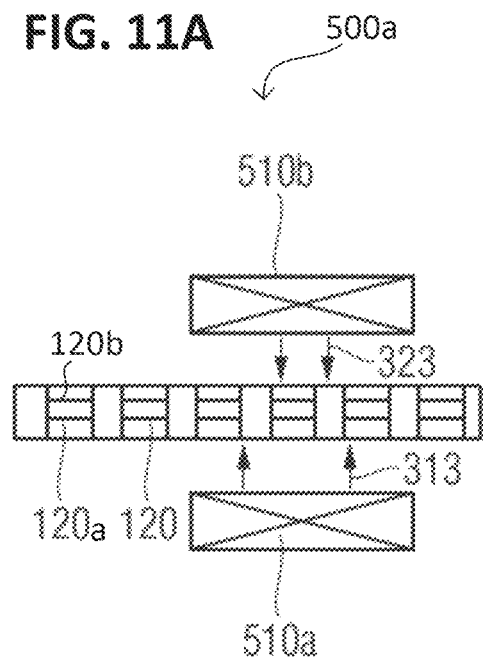
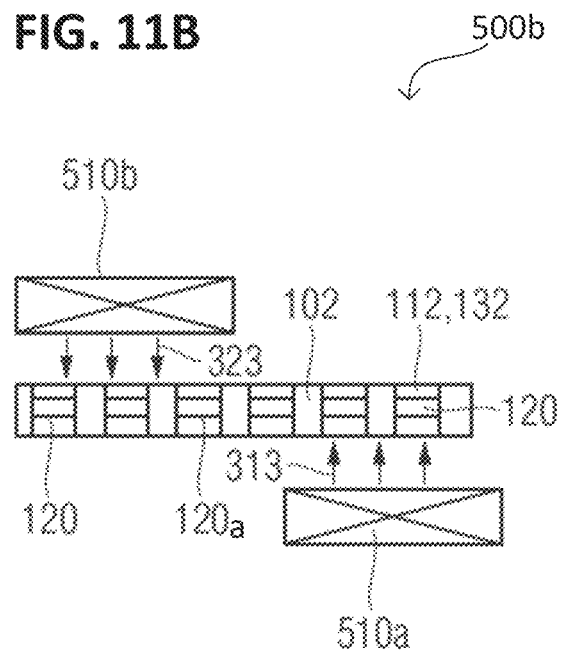
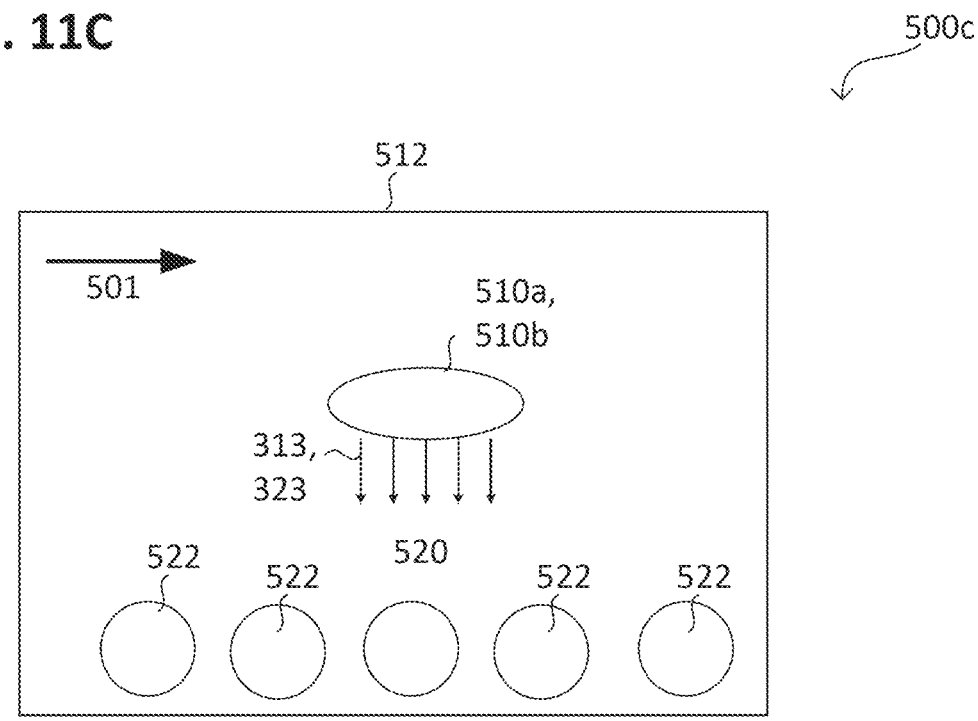

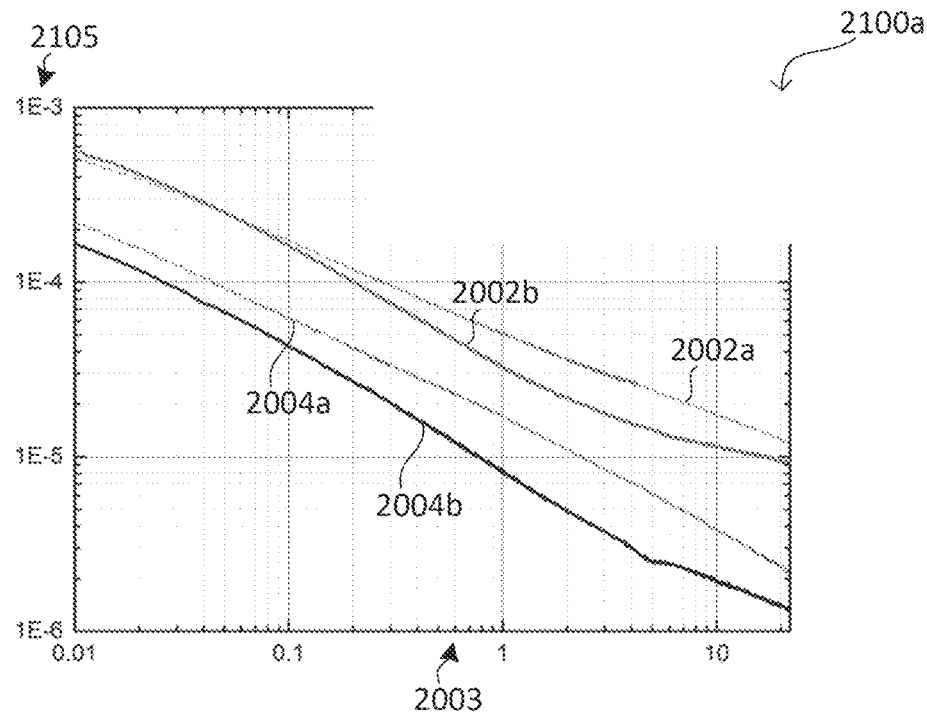
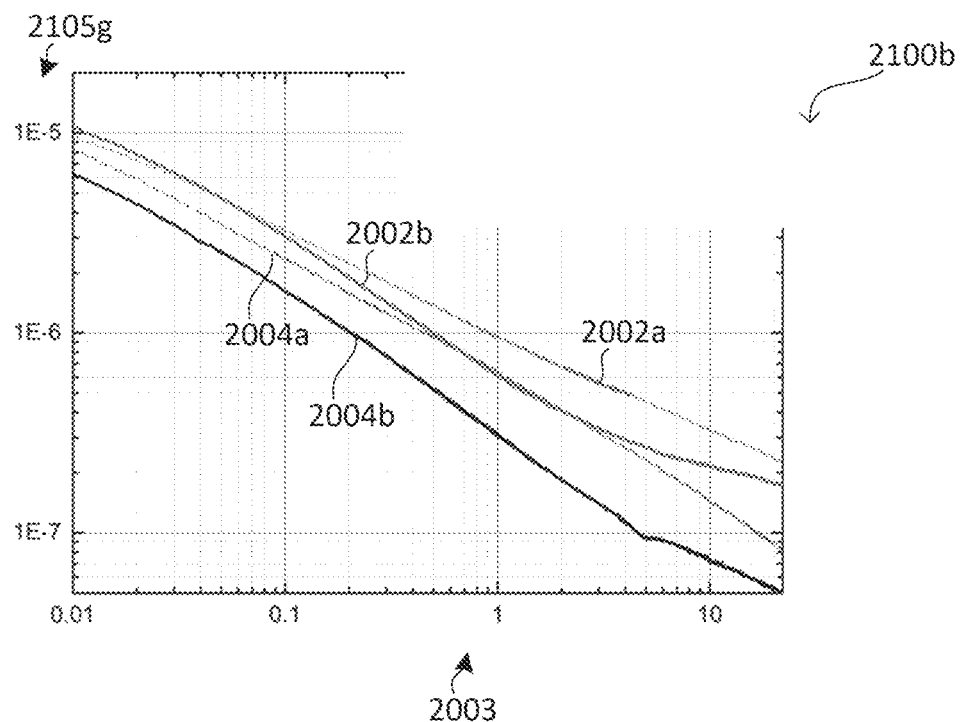

US 10,770,324 B2

SUBSTRATE HOLDING DEVICE, SUBSTRATE TRANSPORT DEVICE, PROCESSING ARRANGEMENT AND METHOD FOR PROCESSING A SUBSTRATE

RELATED APPLICATIONS

The present application is a national stage entry according to 35 U.S.C. § 371 of PCT application No.: PCT/EP2015/077778 filed on Nov. 26, 2015, which claims priorities from German application Nos.: 10 2014 117 347.3 filed on Nov. 26, 2014, 10 2015 101 221.9 filed on Jan. 28, 2015, 10 2015 110 854.2 filed on Jul. 6, 2015, and 10 2015 113 529.9 filed on Aug. 17, 2015, and is incorporated herein by reference in its entirety.

TECHNICAL FIELD

The present disclosure relates to a substrate holding device, a substrate transportation device, a processing assembly, and to a method for processing a substrate.

BACKGROUND

A substrate or a plurality of substrates, for example wafers or other plate-shaped substrates, can in general be held by means of a substrate carrier for example during a coating process (or any other processes for treating substrates). The substrate carrier herein can be utilized for holding the substrate or the substrates at a predefined position in a coating chamber, for example, or for transporting said substrate or substrates though a coating chamber, and/or for moving said substrate or substrates in the coating chamber. Substrate carriers in which substrates are placed in only a loose manner are conventionally used, for example, wherein the substrates in this case can easily fall out of the substrate carrier, for example by virtue of the air that is admitted when a vacuum chamber is being ventilated. Therefore, conventional substrate carriers can have a cover element, which rests on the substrate and weighs down the latter, or presses the substrate onto the substrate carrier, respectively. Alternatively, wafers are jammed between two flexible structures (for example between two rubber rings) and thus fixed in a mounting, for example.

Mechanical fixing between the substrate carrier and the substrates or the supporting surfaces for the substrates, respectively, can generate mechanical stress which can damage the substrates. For example, even minor deformations of the supporting surfaces can lead to punctiform stress on the substrate resting thereon, and/or to parasitic coating of those portions of the substrate that do not fully rest thereon (insufficient sputtering).

Substrate carriers are conventionally used in conjunction with coating installations which enable the coating of one side of substrates that are held beside one another (that is to say the front side of said substrates). Should coating of the reverse side be required, the substrates are turned over and again processed on one side only, even when identical or dissimilar coating of the reverse side is performed, for example. Alternatively, substrate carriers are used in conjunction with coating installations which enable the coating of both sides of substrates that are held beside one another (that is to say the front and the reverse side of said substrates).

However, should only one-sided coating be performed (that is to say that illustratively only the front side of substrates are coated) in a coating installation which is conceived for coating both sides of a substrate tier, the processing capacity of the coating installation is halved, this compromising the economy of said coating installation.

SUMMARY

According to various embodiments, mechanical and/or geometrical decoupling between the substrate carrier (can also be referred to as the carrier frame or carrier) and one or a plurality of substrate placement regions thereof (can also be referred to as pockets) is provided. To this end, one or a plurality of holding frames (can also be referred to as masks) by means of which a respective substrate can be held in a substrate placement region is/are provided.

The mechanical decoupling enables reliable substrate supporting in each substrate placement region (individual pocket), independently from any deformation of the substrate carrier, for example. On account thereof, the influence of thermomechanical deformation, in other words thermal warping, (for example at temperatures of up to 200° C.) acting on the supporting of the substrate is reduced, for example.

The geometrical decoupling enables a modification and/or refinement to be carried out on the substrate or the substrate placement region, respectively, independently of the substrate carrier. Alternatively or additionally, individual substrate placement regions or holding frames, respectively, can be individually replaced in the case of wear or damage to said individual substrate placement regions or holding frames. This enables the substrate carrier to continue to be used and not to have to be modified and/or exchanged.

According to various embodiments, one or a plurality of substrates (wafers, for example) can be precisely positioned, for example also in relation to the peripheral coverage of the latter (in other words, the substrate can rest fully by way of the peripheral region). Furthermore, according to various embodiments, a holding frame is provided, the supporting surface thereof enabling the tolerance that is provided in relation to the substrate to be adapted. This can facilitate the use of substrates having production-related deviations, for example from dissimilar production units. Alternatively or additionally, automated picking and placing of the substrate carrier with substrates can thus be facilitated, for example by means of robotic picking and placing. For example, the tolerance can be adapted to variations when a substrate is being placed by way of an automated device (for wafer handling) and/or to production deviations of said substrate, for example without having to modify the substrate carrier. Furthermore, a standard substrate carrier can be used for dissimilar substrate types and/or methods, for example in that the holding frames that are placed therein are adjusted to the required conditions and/or are exchanged. For example, even dissimilar substrate types can be conjointly transported by means of a substrate carrier. This enables more flexibility, reduces the inventory of matching substrate carriers, and reduces the costs for operating or retrofitting, respectively.

According to various embodiments, masking of the substrates on both sides can be provided, for example in that an additional upper mask (for example a second or third holding frame) is placed onto a substrate (and illustratively partially covers the latter). For example, a substrate holding having masking on both sides can be provided (illustratively a sandwich holding).

According to various embodiments, precise and reproducible masking is provided. For example, a lower mask and an upper mask can be aligned (by means of a centering feature, for example) to each other. This permits congruent masking of the upper and the lower side of the substrate and/or of sequentially processed substrates. Alternatively or additionally, centering on the upper and the lower mask permits automated picking and placing of the substrate carrier with masks (automated handling), for example by means of robotic picking and placing.

According to various embodiments, a substrate can be held more reliably in the placed position, for example during transportation and/or during processing. It can thus be prevented that forces dislocate the substrate (for example on account of vibrations during transportation and/or vibrations caused by pressure differentials). For example, an upper mask can be placed onto the substrate, the former causing the substrate to be held down (downholder effect), for example to counter the substrate from jumping out of the substrate carrier.

According to various embodiments, the geometry of a holding frame and of the substrate placed therein can be adapted to each other in such a manner that said holding frame and said substrate act as mutual screens against processing. For example, the peripheral region of the substrate can reliably protect the supporting surface and/or the inserting contour of the holding frame against an effect of processing. A protection of the mask base (inserting contour) of the lower mask against coverage by sputtering can be thus provided, for example.

According to various embodiments, a holding frame is provided in such a manner that any impairment of the supporting of a substrate in the former by virtue of parasitic coating can be reduced. Illustratively, a recess (for example a recess and/or an undercut) can be provided in a holding frame, for example in the lower mask base (pocket). The recess reduces the deposition of the material (parasitic coating) on the supporting surface (for example in the mask base) when the substrate is being coated (for example by sputtering) without an upper mask. It can thus be prevented that the parasitic coating forms localized elevations which would lead to a modification in the supporting (deviating from a planar supporting surface) of the substrate.

The production of a holding frame can be simplified and rendered more cost-effective according to various embodiments. A holding frame (for example an upper mask) can illustratively be produced from a vacuum-suitable plastics material and/or composite material, for example by the injection molding method. Large production volumes can thus be made in a cost-effective manner with high precision and/or at relatively low investment costs. Large production volumes of holding frames can be produced quickly by injection molding and said holding frames are transportable.

According to various embodiments, holding frames that are cost-effective to produce can be used as single-use parts (new parts). This enables a checked and uniform quality in terms of dimensional accuracy and surface roughness to be provided. Incidental costs that are foreseeable and unforeseeable and can arise in the case of multi-use parts in the recycling (reconditioning) of the holding frames, for example on account of risks of mechanical deformation in the case of peripheral processes, on account of transportation, on account of cleaning, on account of re-scarification, on account of warehousing, and on account of rechecking the holding frames following each instance of recycling can thus be reduced.

Alternatively or additionally, the plastics material and/or the composite material permit(s) permit chemical cleaning (for example by means of an etching agent) of a holding frame. Incidental costs that are foreseeable and unforeseeable in the recycling (reconditioning) of the holding frames, for example on account of risks of mechanical deformation in the case of peripheral processes, on account of cleaning, on account of re-scarification, and on account of rechecking the holding frames following each instance of recycling can be reduced by. The plastics material and/or the composite material can illustratively act as an etching stop.

According to various embodiments, a carrier plate having a cavity, and a holding frame having a frame opening for holding a substrate in the cavity are provided.

The holding frame can optionally include or be formed from a plastics material or a composite material. A second holding frame can optionally be used. The holding frame can optionally have a recess. Simultaneous processing of two substrates on a side per inserting region is optionally provided for increasing productivity.

According to various embodiments, a substrate holding device can have the following: a carrier plate having a cavity, wherein the cavity extends from an upper side of the carrier plate through the carrier plate to a lower side of the carrier plate; a holding frame (also referred to as the first holding frame) which has a frame opening and a supporting surface for holding a substrate in the cavity, said supporting surface surrounding the frame opening; wherein the holding frame, when inserted into the cavity, partially rests on the carrier plate.

According to various embodiments, the substrate holding device can furthermore have a further holding frame (also referred to as the second holding frame) which partially rests on the holding frame.

According to various embodiments, the two holding frames (first holding frame and second holding frame) can be adapted in such a manner that a receiving space for receiving a peripheral portion of the substrate is provided between the two holding frames, when disposed in the cavity.

According to various embodiments, the further holding frame can have a further supporting surface (also referred to as the second supporting surface) for holding a further substrate (also referred to as the second substrate) above the substrate (also referred to as the first substrate).

According to various embodiments, the two holding frames can be adapted in such a manner that they mutually engage in a form-fitting manner when the further holding frame is placed on the holding frame.

According to various embodiments, the two holding frames can have a plurality of centering structures that mutually match in pairs such that the two holding frames are centered to each other, when the further holding frame is placed onto the holding frame.

According to various embodiments, a respective inner circumferential wall of the two holding frames can have a chamfer.

According to various embodiments, a substrate holding device can furthermore have another further holding frame (also referred to as the third holding frame), wherein the another further holding frame when inserted into the cavity is disposed above the further holding frame in such a manner that a receiving space for receiving a peripheral portion of the further substrate is provided between the another further holding frame and the further holding frame.

According to various embodiments, a substrate holding device can furthermore have a vent opening for evacuating a gap between the holding frame and the further holding frame.

According to various embodiments, the holding frame can furthermore have a recess which is adjacent to the supporting surface and surrounds the latter at least partially.

According to various embodiments, the recess can be adjacent to an inner circumferential wall of the holding frame.

According to various embodiments, the cavity can be substantially cuboid shaped and have four corner regions, wherein the holding frame rests on the carrier plate only in the corner regions of the cavity.

According to various embodiments, the two holding frames, in a manner so as to match the cavity, can have a substantially cuboid shaped external contour having four external corner portions, and wherein the two holding frames in the four external corner portions each have centering structures that mutually match in pairs.

According to various embodiments, the supporting surface can be planar.

According to various embodiments, the holding frame can include or is formed from a metal.

According to various embodiments, the holding frame can include or be formed from a plastics material and/or a composite material.

According to various embodiments, a substrate holding device can furthermore have two holding regions at which the carrier plate can be supported for transporting the carrier plate, wherein the cavity is disposed between the two holding regions.

According to various embodiments, a substrate transportation device can have the following: a substrate holding device according to various embodiments; and a transportation system for transporting the substrate holding device, wherein the transportation system has two holding elements in such a manner that the carrier plate of the substrate holding device is held only in the two holding regions.

According to various embodiments, a processing assembly can have the following: a processing chamber for processing both sides of a plurality of substrates in a processing region of the processing chamber; and a substrate transportation device according to various embodiments, for transporting and/or positioning the plurality of substrates in the processing region (also referred to as the processing region).

According to various embodiments, a processing assembly can furthermore have the following: two processing devices (also referred to as the processing device), wherein the transportation system is adapted for transporting and/or positioning the substrate holding device between the two processing devices.

According to various embodiments, a method for processing a substrate can include the following steps: inserting a holding frame for holding the substrate into a cavity in a carrier plate, wherein the holding frame has a supporting surface for placing the substrate; inserting the substrate onto the supporting surface of the holding frame; and processing the substrate through the frame opening while the former is being held in the cavity by means of the holding frame, and/or transporting the substrate while the latter is being held in the cavity by means of the holding frame.

According to various embodiments, a substrate holding device can have the following: a carrier plate; two supporting regions that extend parallel to each other and at which the substrate holding device can be supported in order for the latter to be transported; and a plurality of substrate placement regions that are disposed between the two supporting regions, each of said substrate placement regions having a cavity which from an upper side of the carrier plate extends through the carrier plate to a lower side of the carrier plate, and each of said substrate placement regions having a holding frame which has a frame opening and a supporting surface for holding a substrate in the cavity, said supporting surface surrounding the frame opening, wherein the holding frame, when inserted into the cavity, partially rests on the carrier plate.

According to various embodiments, a substrate holding device (also referred to as the substrate holder, substrate carrier, or wafer carrier) is provided, by means of which a substrate or a plurality of substrates can be held, wherein the substrate holding device has a carrier plate having one or a plurality of cavities in which a respective substrate can be held by means of two frames (also referred to as the holding frame or the holding mask, or the lower frame and upper frame, or lower mask and upper mask, respectively) that are inserted into the respective cavity, wherein the substrate is disposed between the two frames. For example, the respective substrate can rest on a lower frame (the lower frame) and not have any direct physical contact with an upper frame (the upper frame) that lies thereabove. The substrate holding device herein can be adapted in such a manner that the two frames (or at least one frame) in the carrier plate, when being inserted into the respective cavity of the carrier plate, are centered and assume a predefined position and/or alignment. The upper frame herein can rest exclusively on the lower frame, or in other words only one of the two frames can contact the carrier plate such that the relative position of the two frames is not modified when there is any modification to the carrier plate, for example when the carrier plate flexes. This can be required in order for a receiving space for receiving a portion of the substrate between the two frames to be able to be provided, for example, said receiving space being higher than the substrate thickness by only a minimum amount; for example, a substrate that is received in the receiving space between the two frames can have a spacing from the upper frame of less than 0.5 mm. In other words, the receiving space between the two frames can be higher than the substrate thickness of the substrate to be received by less than approximately 0.5 mm (for example 0.1 mm to 0.5 mm).

According to various embodiments, the two frames can be adapted to the shape and thickness of the substrate to be received such that a first frame pair is used for a first substrate, and a second frame pair that is dissimilar to the first frame pair is used for a second substrate that is dissimilar to the first substrate, for example.

According to various embodiments, the lower frame and the upper frame can be adapted in such a manner, for example have respective mutually matching centering structures, that the upper frame can engage in the lower frame in a form-fitting manner, and the upper frame remains in a predefined position relative to the lower frame. Furthermore, the lower frame having one or a plurality of portions, for example peripheral portions or corner portions, can rest on the carrier plate so that the lower frame (for example, conjointly with the upper frame resting on the lower frame) can be disposed in the cavity of the carrier plate.

According to various embodiments, the lower frame and the carrier plate can be adapted in such a manner, for example, the inner contour of the cavity in the carrier plate can be provided so as to match the external contour of the lower frame, such that the lower frame can engage in the cavity in a form-fitting manner, and the lower frame remains in a predefined position relative to the cavity. Furthermore, a gap between the lower frame and the carrier plate, for example between the inner contour of the cavity and the external contour of the lower frame, can be provided in such a manner that the lower frame is influenced as little as possible when the carrier plate is being modified, for example when the carrier plate flexes. The lower frame herein can be in physical contact exclusively with the surface of the carrier plate.

The position of both frames in the carrier plate can thus be defined by virtue of gravitational force, for example. For example, the substrate carrier described herein can be suitable for the horizontal handling of substrates (for example, the carrier plate having the substrates cannot be placed vertically or turned over when the substrates are supposed to remain in their positions), since the frame or the frames remain in the cavity by virtue of gravitational force.

According to various embodiments, the holding frames can cover part of the substrate when the substrate is disposed between the two holding frames. The upper frame can illustratively partially cover an upper surface of the substrate. For example, the upper frame can cover a peripheral region of the substrate from above. Furthermore, a central region of the upper surface of the substrate can remain free such that the central region of the substrate can be treated, for example coated. The lower frame can illustratively partially cover a lower surface (opposite the upper surface) of the substrate. The lower frame can cover a peripheral region of the substrate from below, for example. Furthermore, a central region of the lower surface of the substrate can remain free such that the central region of the substrate can be treated, for example coated.

According to various embodiments, a substrate holding device can have the following: a carrier plate having a cavity for (at least partially) receiving a first holding frame and a second holding frame for holding a substrate in the cavity by means of the two holding frame, wherein the cavity extends from a upper side of the carrier plate through the carrier plate to a lower side of the carrier plate, wherein the first holding frame, when inserted into the cavity, partially rests on the carrier plate, and wherein the second holding frame partially (for example exclusively) rests on the first holding frame, and wherein the two holding frames are adapted in such a manner that a receiving space for receiving a peripheral portion of the substrate is provided between the two holding frames, when disposed in the cavity, or the holding frames that are inserted into the cavity. The substrate herein can rest exclusively on the first holding frame. The first holding frame can or will also be referred to as the lower frame or the lower mask. The second holding frame can or will also be referred to as the upper frame or the upper mask. The substrate can thus be held by means of the substrate holding device and be treated on both sides, for example.

Furthermore, the two holding frames can be adapted in such a manner that (for example have a lateral centering structure) that the two holding frames mutually engage in a form-fitting manner when the second holding frame is being placed onto the first holding frame. Furthermore, the two holding frames can be adapted in such a manner (for example have a lateral centering structure and a resting structure) that the two holding frames form a form-fit in two different (for example perpendicular to each other) directions when the second holding frame is being placed onto the first holding frame. The force-fit herein can be established exclusively by virtue of gravitational force, for example. Alternatively, at least one of the holding frames can be clamped.

Furthermore, the two holding frames can have a plurality of centering structures (also referred to as centering elements or centering contours) that mutually match in pairs such that the two holding frames are (for example laterally) centered to each other, when the second holding frame is being placed onto the first holding frame.

For example, a cavity can be provided as the centering structure in the first holding frame. Furthermore, the second holding frame can have a protrusion as a centering structure that matches the cavity in the first holding frame. According to various embodiments, the two centering structure that mutually match in pairs can be adapted in such a manner that placing and centering of the second holding frame on the first holding frame is simplified (for example, the centering structures can have or provide chamfers or introduction ramps).

Furthermore, a respective inner circumferential wall of the two holding frames can have a chamfer. In other words, the first holding frame and/or the second holding frame can be beveled on the inner circumferential wall thereof. The substrate can thus be subjected to a smaller shadow by the two holding frames when coating for example.

Furthermore, the cavity can be substantially rectangular-box shaped and have four corner regions, wherein the first holding frame rests on the carrier plate only in the corner regions of the cavity. This can enable better stability of the two holding frames in the cavity when the carrier plate flexes (for example along the width of the carrier plate).

Furthermore, the two holding frames, in a manner so as to match the cavity, can have a substantially rectangular-box shaped external contour having four external corner portions, wherein the two holding frames in the four external corner portions each have centering structures that mutually match in pairs.

According to various embodiments, a substrate holding device can have the following: a carrier plate having a plurality of cavities that are disposed beside one another (for example along the width of the carrier plate), wherein each of the cavities is adapted for receiving a first holding frame and a second holding frame, and extends from an upper side of the carrier plate through the carrier plate to a lower side of the carrier plate, and wherein in each of the cavity a first holding frame partially rests on the carrier plate, and a second holding frame partially (for example exclusively) rests on the first holding frame, wherein the two holding frames are adapted in such a manner that a receiving space for receiving a peripheral portion of the substrate is provided between the two holding frames, when disposed in the respective cavity or between the two holding frames that are inserted into the respective cavity; wherein the carrier plate has two holding regions at which the carrier plate can be supported for transporting the carrier plate, wherein the plurality of cavities that are disposed beside one another are disposed between the two holding regions.

According to various embodiments, the two holding frames and the respective cavity can be provided in such a manner that the two holding frames that are inserted into the respective cavity terminate flush with the carrier plate (for example at least on one side of the carrier plate).

According to various embodiments, the two holding frames can be provided in such a manner that the centering structure are disposed covered, such that the latter are not conjointly coated when the substrate is being coated, for example. The defined mutual relative position of the two holding frames can thus not be modified by virtue of the centering structure being coated, for example.

According to various embodiments, a substrate transportation device can have the following: a substrate holding device (as described herein); and a transportation system for transporting the substrate holding device, wherein the transportation system has two holding elements in such a manner that the carrier plate of the substrate holding device is held only in the two holding regions.

According to various embodiments, a processing assembly can have the following: a processing chamber for processing both sides of a plurality of substrates in a processing region of the processing chamber; and a substrate transportation device (as described herein) for transporting and/or positioning the plurality of substrates in the processing region.

According to various embodiments, a method for processing a substrate can include the following steps: inserting a first holding frame for holding the substrate into a cavity in a carrier plate, wherein the first holding frame has a planar supporting surface for placing the substrate; inserting the substrate into the cavity onto the planar supporting surface of the first holding frame; placing a second holding frame onto the first holding frame, wherein the two holding frames are adapted in such a manner that the substrate is disposed between the two holding frames, wherein a gap remains between the second holding frame and the substrate such that the substrate rests only on the first holding frame.

Furthermore, the inserting of the first holding frame and/or of the second holding frame can be performed by means of a magnetic gripper or of a suction gripper (also referred to as the vacuum gripper). To this end, engagement faces which can be provided on the holding frames can be adapted to the gripper.

Furthermore, the two holding frames upon being inserted into the cavity of the carrier plate, or upon being placed on the latter, can be held in a centered manner in the cavity, wherein the two holding frames are adapted in such a manner that a receiving space for receiving a peripheral portion of the substrate is provided between the two holding frames. This peripheral portion of the substrate can serve as a resting, for example, and form the vertical holding/positioning of the substrate. The peripheral portion of the substrate herein cannot be conjointly coated when the coating process is being carried out.

Furthermore, the cavity can be rectangular-box shaped and have four corner regions (inner corner regions). Furthermore, the cavity can be prismatic and have three or more than three corner regions (inner corner regions). For example, the corner regions of the cavity can be adapted as centering regions for the first holding frame. Furthermore, the corner regions of the first holding frame can be adapted as centering regions for the second holding frame. The cavity can furthermore be cylindrical.

For example, the first holding frame and/or the second holding frame can have a rectangular-box shaped external contour having four corner portions (external corner portions), wherein a respective centering portion for placing the second holding frame in a centered manner is provided at each of the four corner portions of the first holding frame or of the second holding frame, respectively. Furthermore, the first holding frame and/or the second holding frame can have a prismatic external contour having three or more than three corner portions (external corner portions), wherein a respective centering portion for placing the second holding frame in a centered manner is provided on each of the three or more than three corner portions of the first holding frame or of the second holding frame, respectively. The corner portions of the first holding frame or of the second holding frame, respectively, can illustratively be adapted as centering portions for placing the second holding frame in a centered manner. Furthermore, the first holding frame and/or the second holding frame can have a cylindrical external contour.

According to various embodiments, a method, a substrate holding device, and a processing system which increases the number of the substrates which can be processed per method cycle, for example while the substrate holding device is being transported through the processing system, is provided. On account thereof, the processing costs are reduced, and the processing of substrates in vacuum systems becomes economical. This renders the processing of substrates in vacuum systems more competitive in relation to other processing technologies.

According to various embodiments, a substrate stack (having at least two substrates that are disposed on top of one another, and optionally at least one interdisposed further element, for example a separation element and/or a further substrate) is illustratively disposed in a substrate receiving cavity in the substrate holding device such that a substrate lying below (that is to say the lower side thereof) and a substrate lying on the top (that is to say the upper side thereof) can be processed. In other words, at least the two substrates can be processed per substrate receiving cavity. In this way, at least two substrates can be disposed on top of one another in each cavity of a substrate holding device, such that the substrates lying on top form an upper substrate tier of which the upper side can be processed, and the substrates lying below form a lower substrate tier of which the lower side can be processed.

According to various embodiments, a substrate holding device (also referred to as the substrate holder, the substrate carrier, or the wafer carrier) is provided, by means of which two substrates per substrate receiving holding can be held on top of one another such that each of the two substrates can be processed on one side. The substrate holding device enables a conventional processing system which is conceived for processing both sides of an individual substrate tier, for example, to be retrofitted in a cost-effective manner such that the processing capability of said conventional processing system is illustratively utilized to the maximum possible extent. In a illustrative manner, instead of the lower side of the conventional substrate tier a first (illustratively lower) substrate tier is processed, and instead of an upper side of the conventional substrate tier a second (illustratively upper) substrate tier is processed. This enables the number of substrates that can be processed per method cycle to be doubled.

When being processed, the two substrates which are or will be conjointly inserted into the cavity (or the two substrate tiers, respectively), shield one another. This in general enables the two substrates (or the two substrate tiers, respectively), to be processed in a dissimilar manner, for example at different points in time or using different technologies. For example, the substrate lying on top (or the upper substrate tier, respectively) can be cleaned, and the substrate lying below (or the lower substrate tier, respectively), can be coated. The processing of the two substrates (or of the two substrate tiers, respectively) can be performed simultaneously (in parallel), at least partially (that is to say partially or entirely) simultaneously, sequentially (in series), or at least partially sequentially.

According to various embodiments, a method can include the following steps: disposing a substrate stack having a first substrate and a second substrate (which are at least partially mutually overlapping, for example) in a receiving region of a substrate holding device, wherein a first side of the first substrate faces a first side of the second substrate; and processing a second side of the first substrate that is opposite the first side of the latter, and processing a second side of the second substrate that is opposite the first side of the latter and faces away from the second side of the first substrate.

According to various embodiments, disposing of the substrate stack have, the first substrate, for example the second side thereof, on a supporting surface of the substrate holding device to be placed, for example on a planar supporting surface.

The first side of the first substrate can illustratively be referred to as the upper side of the latter, the second side of the first substrate can illustratively be referred to as the lower side of the latter, the first side of the second substrate can illustratively be referred to as the lower side of the latter, and the second side of the second substrate can illustratively be referred to as the upper side of the latter. The second substrate can illustratively be disposed above the first substrate, for example. The substrate stack and/or the substrate holding device can or will also be disposed at another orientation.

The receiving region of the substrate holding device can be defined or at least delimited by a cavity and/or a supporting surface of the substrate holding device. The receiving region can extend within the cavity, for example. Alternatively or additionally, the receiving region can at least partially (that is to say partially or entirely) extend across the supporting surface, for example. According to various embodiments, the first substrate and the second substrate can be inserted into a common receiving region of the substrate holding device.

The second side (for example the lower side) of the first substrate can be at least partially exposed for processing, and/or the second side (for example the upper side) of the second substrate can be at least partially exposed for processing.

The disposal of the substrate stack can include the following steps: inserting the first substrate into a cavity (substrate receiving cavity) which extends for example through a carrier plate (also referred to as the carrier or tray) of a substrate holding device; and inserting the second substrate into the cavity.

According to various embodiments, the first substrate can be inserted into a holding frame (lower frame) in the cavity of the substrate holding device, for example on the supporting surface thereof. The lower frame can be connected to the carrier plate, for example in a monolithic manner and/or by joining (for example in a materially integral manner, for example by welding and/or adhesive bonding). Alternatively, the lower frame and the carrier plate can be in two parts, for example separable from each other. In this case, the lower frame can be inserted into the carrier plate, for example in a form-fitting and/or force-fitting manner (for example by clamping, screwing, and/or riveting). The lower frame can be inserted into the cavity before the first substrate is placed, for example. The second side of the first substrate can be partially covered by the lower frame into which the first substrate is inserted.

The method can furthermore include the following steps: disposing (for example inserting) a holding frame (also referred to as the second holding frame) into the cavity between the first substrate and the second substrate, wherein the disposal (for example placement) of the substrate stack includes inserting the second substrate into the holding frame, for example the first side of the second substrate onto the supporting surface of said holding frame.

In general, the processing of the first substrate and/or of the second substrate can include modifying the first/second substrate, or at least a surface thereof, for example in terms of at least one chemical property, of a structural property, and/or of a physical property.

According to various embodiments, the processing of the second side of the first substrate can include at least one of the following steps: coating, radiating, subtracting, cleaning, heating, converting (chemically and/or structurally, for example), doping (chemically, for example), polishing. Alternatively or additionally, the processing of the second side of the second substrate can include at least one of the following steps: coating, radiating, subtracting, cleaning, heating, converting (chemically and/or structurally, for example), doping (chemically, for example), polishing.

The processing of the second side of the first substrate can include coating of the second side of the first substrate with a gaseous coating material. Alternatively or additionally, the processing of the second side of the second substrate can include coating of the second side of the second substrate with a gaseous coating material. The gaseous coating materials can be identical or dissimilar, for example be of identical or dissimilar composition.

According to various embodiments, the processing of the first substrate and the processing of the second substrate can be performed in an at least partially simultaneous manner. In other words, the processing of the first substrate and the processing of the second substrate can overlap at least partially in temporal terms. Alternatively, the processing of the first substrate and the processing of the second substrate can be performed sequentially, that is to say at a mutual temporal spacing.

According to various embodiments, the processing of the first substrate and/or the processing of the second substrate can be performed in a vacuum (or at least at negative pressure). Alternatively or additionally, the substrate holding device into which the first substrate and the second substrate are inserted can be transported and/or disposed in a vacuum during the processing of the lower side of the first substrate and/or during the processing of the upper side of the second substrate.

According to various embodiments, the holding frame (also referred to as the second holding frame) which is disposed between the first substrate and the second substrate can define a spacing between the first substrate and the second substrate such that a gap is formed between the first side of the first substrate and the first side of the second substrate, for example. According to various embodiments, the gap can be evacuated during the processing of the first substrate and/or the processing of the second substrate, for example by way of a vent opening (for example a duct) in the carrier plate, and/or a vent opening (for example a duct) in the holding frame.

According to various embodiments, the first substrate and the second substrate can be disposed in mutual physical contact, for example by way of the first sides of said substrates being at least partially (that is to say partially or fully) in mutual contact. Alternatively or additionally, a gap can be formed between the first substrate and the second substrate (for example when the substrates are non-planar or are disposed at a mutual spacing). Alternatively or additionally, a heat sink, for example in the form of a holding frame, can be disposed between the first substrate and the second substrate. The heat sink can be thermally coupled to the first substrate and/or to the second substrate, and the heat sink can optionally be thermally coupled to the carrier plate. In order for the required thermal coupling to be achieved, the contact faces between the heat sink and the first substrate and/or the second substrate, or optionally the carrier plate, can be adapted correspondingly larger. The heat sink can be adapted for receiving thermal energy from the first substrate and/or from the second substrate, and to direct said thermal energy away from said substrates. For example, the heat sink can have a surface which discharges again at least part of the thermal energy received, for example in the form of thermal radiation. The surface can be profiled to this end, for example in the form of cooling fins. To this end, the heat sink can provide a thermally conductive path, for example between the first substrate and/or between the second substrate and the surface. The heat sink can optionally be adapted for discharging at least part of the thermal energy received to the carrier plate. To this end, the heat sink can provide a thermally conductive path, for example between the first substrate and/or between the second substrate and the carrier plate.

The heat sink (for example a holding frame) and/or the carrier plate can include or be formed from a material, for example a metal, which has a thermal conductivity of more than 10 W/(m·K), for example more than 50 W/(m·K), for example more than 100 W/(m·K), for example more than 200 W/(m·K), for example more than 300 W/(m·K), for example more than 400 W/(m·K).

The first substrate and/or the second substrate can be configured in a plate-shaped manner; for example, the first side and/or the second side thereof can be configured planar (level), for example as to be plane-parallel to each other. If the first sides are configured planar, the first substrate and the second substrate can be in substantially full contact, for example when no gap is configured therebetween, that is to say when the first substrate and the second substrate are in mutual contact.

Alternatively or additionally, at least the first side of the first substrate and/or at least the first side of the second substrate can be configured non-planar, for example angular and/or structured, for example in the case where the first substrate and/or the second substrate are configured at least partially angular and/or structured. If at least one of the first sides is configured non-planar, the first substrate and/or the second substrate can be in partial contact. In other words, a gap can be formed between the first substrate and the second substrate, for example even when said substrates are in partial mutual contact.

According to various embodiments, the first substrate and/or the second substrate can include or be formed from at least one of the following: a ceramic, a glass, a semiconductor (for example an amorphous, polycrystalline or monocrystalline semiconductor such as silicon), a metal, a polymer (for example plastics material). For example, the first substrate and/or the second substrate can be a plastics film, a wafer, a metal foil, a sheet metal, or a glass plate.

The method can optionally include the step of disposing a further substrate stack (having a third and a fourth substrate) in a further receiving region, for example inserting said further substrate stack into in a further cavity which extends through the carrier plate of the substrate holding device, in such a manner for example that a second side (for example a lower side) of the third substrate is exposed for processing, and a second side (for example an upper side) of the fourth substrate is exposed for processing.

A substrate holding device according to various embodiments can have the following: a carrier plate having a cavity which extends from an upper side of the carrier plate through the carrier plate to a lower side of the carrier plate; a first holding frame which has a first (for example planar) supporting surface for holding a first substrate (for example in the cavity); and a second holding frame which when inserted into the cavity is disposed above the first (for example planar) supporting surface (for example at least partially in a cavity of the first holding fame and/or at least partially above the first holding frame) and which has a second (for example planar) supporting surface for holding a second substrate in the cavity and above the first substrate. The first supporting surface and the second supporting surface can be at least partially mutually overlapping.

According to various embodiments, the second holding frame can at least partially rest on the carrier plate and/or the first holding frame, for example in such a manner that a receiving space for receiving a peripheral portion of the first substrate is provided between the second holding frame and the first holding frame. In this case, the second substrate can at least partially (for example by way of the peripheral portion thereof) rest on the second holding frame. The first substrate can at least partially (for example by way of the peripheral portion thereof) rest on the first holding frame.

According to various embodiments, the first supporting surface and/or the second supporting surface can be provided by means of a recess in the respective holding frame. Alternatively or additionally, the supporting surfaces can be provided by means of protrusions, rounded features, chamfers, folds, punctiform contacts, planar contacts, linear contacts, and similar, or mixed forms thereof.

The first holding frame can also be referred to as the lower frame, the lower mask, or illustratively as the lower holding frame. The second holding frame can also be referred to as the upper frame, the upper mask, or illustratively as the upper holding frame. The first substrate can illustratively also be referred to as the lower substrate. The second substrate can illustratively also be referred to as the upper substrate.

According to various embodiments, the lower frame and the carrier plate can be adapted in such a manner, for example the inner contour of the cavity in the carrier plate can be provided so as to match the external contour of the lower frame, that the lower frame can engage in the cavity in a form-fitting manner, and/or the lower frame remains in a predefined position relative to the cavity. The lower frame herein can be in physical contact with the side wall of the cavity, and/or rest on a supporting surface of the carrier plate (that is to say be in physical contact). According to various embodiments, the upper frame and at least one of the carrier plate and/or the lower frame can be adapted in such a manner that the upper frame can engage in the cavity and/or in the lower frame in a form-fitting manner. The upper frame can remain in a predefined position relative to the cavity and/or to the lower frame, for example. For example, the inner contour of the cavity in the carrier plate (and/or of a recess of the lower frame) can be provided so as to match the external contour of the upper frame. Alternatively or additionally, the lower frame, the upper frame, and the carrier plate can have a respective centering structure that are mutually matching at least in pairs. The upper frame herein can be in physical contact with the side wall of the cavity and/or with the lower frame.

According to various embodiments, the first substrate by way of a peripheral portion can rest on the lower frame, for example on the supporting surface of the latter, and/or the second substrate by way of a peripheral portion can rest on the upper frame, for example on the supporting surface thereof.

According to various embodiments, the first holding frame and the carrier plate can be interconnected in a monolithic manner. Alternatively, the first holding frame can be inserted into the cavity. In this case, the first holding frame can at least partially rest on the carrier plate, for example on a supporting surface of the carrier plate. To this end, the carrier plate can have a supporting surface at which the first holding frame rests at least partially.

According to various embodiments, the substrate holding device can furthermore have the following: a third holding frame for covering the first substrate (in this instance also referred to as the first covering frame) or the second substrate (in this instance also referred to as the second covering frame). The first covering frame when inserted into the cavity can be disposed above the first (for example planar) supporting surface, for example above the first holding frame, for example in such a manner that a receiving space for receiving a peripheral portion of the first substrate is provided between the first covering frame and the first (for example planar) supporting surface, for example the first holding frame, and/or the first covering frame is disposed in the receiving space between the first holding frame and the second holding frame. In other words, the first covering frame can be disposed between the first and the second substrate. The first covering frame when inserted into the cavity can fasten, for example clamp, the first substrate.

Alternatively or additionally, the second covering frame when inserted into the cavity can be disposed above the second (for example planar) supporting surface, for example above the second holding frame, for example in such a manner that a receiving space for receiving a peripheral portion of the second substrate is provided between the second covering frame and the second (for example planar) supporting surface, for example the second holding frame. The second covering frame when inserted into the cavity can fasten, for example clamp, the second substrate.

According to various embodiments, the substrate holding device can have the second covering frame and/or the first covering frame.

According to various embodiments, the upper frame can cover at least part of the first substrate when the first substrate is disposed between the upper frame and the lower frame. The upper frame can illustratively at least partially cover the first side of the first substrate, for example the peripheral region thereof, for example from above. The second substrate can rest on the upper frame, for example in such a manner that the second side of the former remains completely free (exposed). Alternatively, the second covering frame can partially cover the second side of the second substrate, for example the peripheral region thereof, for example from above. In this case, a central region of the upper surface of the second substrate (that is to say on the upper side thereof) can remain free (exposed) such that the central region of the second substrate can be treated, for example coated.

According to various embodiments, the lower frame can cover part of the first substrate, for example when the first substrate is disposed between the upper frame and the lower frame. The lower frame can illustratively partially cover the second side of the first substrate, for example the peripheral region thereof. Furthermore, a central region of the second side of the first substrate (for example the lower side thereof) can remain free (exposed) such that the central region of the first substrate can be treated, for example coated.

According to various embodiments, the substrate holding device can have a vent opening for evacuating a gap between the first holding frame and the second holding frame, and/or for evacuating a gap between the first substrate and the second substrate. The vent opening can at least partially extend between the first supporting surface and the second supporting surface, and/or connect the gap to at least one side of the carrier plate (for example the upper side and/or the lower side). The vent opening can at least partially extend in the carrier plate, in the first holding frame, and/or in the second holding frame. For example, the vent opening can extend from the upper side of the carrier plate and/or from the lower side of the carrier plate to a side wall of the cavity, and/or interconnect the former and the latter. For example, the vent opening can have at least one first opening portion in the first holding frame and/or in the second holding frame, and a second opening portion in the carrier plate, wherein the first opening portion is in alignment with the second opening portion when the first holding frame and/or the second holding frame are/is inserted into the cavity of the carrier plate. The vent opening can at least partially be formed in the form of a recess and/or in the form of a duct, for example.

The side wall of the cavity can delimit the cavity (for example along the carrier plate face) and extend from the upper side of the carrier plate to the lower side of the carrier plate.

According to various embodiments, a processing assembly can have the following: a processing chamber; a first processing device and a second processing device which are disposed in the processing chamber; a substrate holding device as described herein; and a transportation device for transporting and/or positioning the substrate holding device between the first processing device and the second processing device. For example the transportation device can define a transportation face for transporting a substrate holding device along the transportation face.

The transportation face can extend between the first processing device and the second processing device. The substrate holding device by means of the transportation device (for example the substrate holding device transportation device, or also referred to as the transportation system) can be transported through between the first processing device and the second processing device, for example during the processing by means of the first processing device and/or of the second processing device. Alternatively or additionally, the substrate holding device by means of the transportation device can be positioned between the first processing device and the second processing device, for example during the processing by means of the first processing device and/or of the second processing device.

The first substrate, for example the first side thereof, by means of the first processing device can be processed for example from below (illustratively the lower side of said first substrate). The second substrate, for example the first side thereof, by means of the second processing device can be processed for example from above (illustratively the upper side of said second substrate).

The terms upper side and lower side of the substrates can relate to the upper side and the lower side of the carrier plate. However, the carrier plate can be spatially aligned in an arbitrary manner. For example, the transportation device can be adapted in such a manner that the transportation face extends vertically (that is to say transversely to gravitational force), horizontally (that is to say parallel with gravitational force) and/or at any other angle. In other words, the substrate holding device (or the upper side thereof, respectively) can be aligned or transported transversely to gravitational force, parallel with gravitational force, and/or at any other angle in relation to gravitational force.

According to various embodiments, the first processing device can have a first processing region for processing the first substrate, and the second processing device can have a second processing region for processing the second substrate. The transportation device can be adapted for transporting and/or positioning the substrate holding device to/in the first processing region and to/in the second processing region. In other words, the transportation face can extend through the first processing region and/or the second processing region.

According to various embodiments, the first side of the first substrate can be processed in the first processing region, and the first side of the second substrate can be processed in the second processing region.

The carrier plate can have a plurality of cavities, a plurality of first holding frames, and a plurality of second holding frames. A respective first holding frame of the plurality of first holding frames, and a respective second holding frame of the plurality of second holding frames can form a holding-frame pair for holding a substrate stack, said holding-frame pair being allocated to a cavity of the plurality of cavities. Each holding-frame pair can be inserted into the allocated cavity. The second holding frame of the holding-frame pair can at least partially rest on the carrier plate and/or on the first holding frame of the holding-frame pair, for example in such a manner that a receiving space for receiving a peripheral portion of a first substrate of the substrate stack is provided between the second holding frame of the holding-frame pair and the first holding frame of the holding-frame pair. The second holding frame can be adapted for holding a second substrate of the substrate stack in the cavity and above the first substrate.

According to various embodiments, a method can include the following steps: disposing a first substrate and a second substrate relative to one another in a substrate holding device, for example in such a manner that an upper side of the first substrate faces a lower side of the second substrate; processing a lower side of the first substrate that lies opposite the upper side of the first substrate; and processing an upper side of the second substrate that lies opposite the lower side of the second substrate.

According to various embodiments, the inserting of the first substrate and the inserting of the second substrate (that is to say the inserting of the substrate stack) into the substrate holding device can include the inserting of the first substrate (of the substrate stack) into a first holding frame, and/or the inserting of the second substrate (of the substrate stack) into a second holding frame.

As has been described above, a substrate carrier is provided in conjunction with coating systems which enable the coating of one side or of two sides of substrates that are held beside one another (that is to say of the front side and the rear side of said substrates). The substrate herein rests on a supporting surface and is covered by an upper mask. The supporting surface and the upper mask each provide a shadow on part of the substrate such that a non-coated peripheral region which is of great importance for some applications remains on both sides of the substrate. The non-coated peripheral region enables for example a spatial and electrical separation (illustratively an electrical isolation) of the respective coatings on both sides of the substrate.

The upper mask optionally has the function of clamping the substrate such that the substrate rests firmly on the supporting surface and no stray vapor can make its way between the supporting surface and the substrate and be deposited there (parasitic coating). Stray vapor that is deposited in the peripheral region can lead to a short circuit between the coatings on both sides of the substrate, wherein the short circuit renders the substrates useless for some applications (and illustratively causes rejects to be generated).

The size of the coated area herein can represent a significant criterion for the economy of the coating process, such that said size of the coated area should illustratively be as large as possible but only large enough for the peripheral region to maintain the electrically isolating effect thereof.

According to various embodiments, a substrate holding device which illustratively provides as large a utilization of the substrate area as possible is provided. In other words, a coated area that is as large as possible can be provided on the substrate. The peripheral region of the substrate can illustratively be coated on one side such that a non-coated peripheral region remains only on the other side of the substrate.

According to various embodiments, a substrate holding device which enables the upper mask to be omitted is provided. In order for the substrate to be coated, the upper side thereof is completely free such that the latter can be completely coated. Apart from the upper side of the substrate, part of the supporting surface is likewise free on account thereof, since said supporting surface is usually configured a bit larger than the substrate, so as to have more available free space when the substrate is being inserted. Therefore, any omission of the upper mask leads to the supporting surface being likewise coated. On account thereof, layers having a plurality of one hundred micrometers of visible thickness which lead to a gap between the substrate and the supporting surface into which stray vapor ingresses can be created on the supporting surface between the cleaning intervals. In the course of the utilization of the system the supporting surface becomes illustratively more non-planar, and the gap dimension between the substrate and the supporting surface becomes ever larger.

According to various embodiments, a substrate holding device of which the supporting surface is illustratively less coated when the upper mask is omitted is provided. On account thereof, the reject rate by way of a short circuit between the coatings on both sides of the substrate is reduced, and fewer cleaning intervals are required, saving costs and effort. Overall, a higher level of substrate utilization at a lower reject rate and lower operating costs is thus achieved.

According to various embodiments, a substrate holding device can have the following: two supporting regions that extend parallel to each other, at which the substrate holding device can be supported in order to be transported; and a plurality of substrate placement regions that are disposed between the two supporting regions, each of said substrate placement regions has a cavity and a supporting surface for holding a substrate in the cavity; and each of said substrate placement regions has a recess which is adjacent to the supporting surface and surrounds the latter at least partially.

It can thus be illustratively achieved that the supporting surface is fully shielded by a substrate resting thereon. By contrast, the recess can be partially exposed when the substrate rests on the supporting surface. The recess illustratively provides a region (layer receiving region) which can be coated without the substrate coming into contact with the coating (since the base area of the coating lies lower than the supporting surface). The substrate can illustratively protrude (at least partially), for example, beyond the supporting surface, for example partially across the recess.

The cavity, for example the inner circumferential wall thereof, of a substrate placement region which defines the position of a placed substrate, for example level with the supporting surface, is illustratively adapted in such a manner that a substrate fits into the cavity, for example with play. The play enables any contact between the substrate and the substrate holding device, for example the inner circumferential wall thereof, to be prevented when the substrate is being inserted into the substrate placement region and/or when the substrate is being removed from the substrate placement region, this reducing the risk of the substrate breaking when being repositioned (placement or removal) (reduced substrate breakage risk).

The recess can be disposed between the inner circumferential wall and the supporting surface. The recess can be adjacent to the inner circumferential wall.

According to various embodiments, the cavity of at least one (for example of each) substrate placement region of the plurality of substrate placement regions can extend through the substrate holding device. In other words, the substrate placement region can be open in two opposite directions. It can thus be achieved that a substrate that is placed therein can be processed on both sides.

According to various embodiments, the recess of at least one (for example of each) substrate placement region of the plurality of substrate placement regions can be adjacent to an inner circumferential wall of the respective cavities.

According to various embodiments, the substrate holding device can furthermore have a carrier plate; wherein and the supporting surface of at least one (for example of each) substrate placement region of the plurality of substrate placement regions is connected (for example in a monolithic manner) to the carrier plate; and/or wherein the supporting surface of at least one (for example of each) substrate placement region of the plurality of substrate placement regions is provided by means of a holding frame which when inserted into a cavity of the carrier plate rests at least partially on a supporting surface of the carrier plate.

According to various embodiments, the cavities of at least one (for example of each) substrate placement region of the substrate placement regions, for example at least one (for example each) cavity of the carrier plate, can extend through the carrier plate. In other words, the carrier plate in the substrate placement regions can be open in two opposite directions. It can thus be achieved that a substrate that is placed therein can be processed on both sides.

According to various embodiments, the supporting surface of at least one (for example of each) substrate placement region of the plurality of substrate placement regions can be configured planar. In other words, the points of a supporting surface can lie within a planar plane.

According to various embodiments, the supporting surface of at least one (for example of each) substrate placement region of the plurality of substrate placement regions can include or be formed from a metal. The metal can include or be formed from aluminum, for example. Alternatively or additionally, the metal can include or be formed from iron, for example, in the form of an iron alloy, for example, such as steel, for example.

According to various embodiments, the substrate holding device can furthermore have at least one reinforcement element which extends between the two supporting regions and extends thereinto. Alternatively or additionally, the substrate holding device can have a plurality (at least two, for example two or more than two) of reinforcement elements that extend parallel to each other, of which at least one (for example each) reinforcement element is disposed (for example respectively) in a supporting region of the two supporting regions. The at least one reinforcement element can have a plurality of reinforcement elements.

According to various embodiments, a processing assembly can have the following: a processing chamber; a processing device which defines a processing region in the processing chamber; a substrate holding device according to various embodiments; and a transportation device for transporting and/or positioning the substrate holding device in the processing region, wherein the transportation device is adapted for supporting the substrate holding device in the two supporting regions thereof.

According to various embodiments, the processing assembly can furthermore have the following: a further processing device, wherein the transportation device is adapted for transporting and/or positioning the substrate holding device between the processing device and the further processing device.

According to various embodiments, a substrate holding device can have the following: two supporting regions that extend parallel to each other and at which the substrate holding device can be supported in order to be transported; and a plurality of substrate placement regions, each of said substrate placement regions having a cavity and a supporting surface for holding a substrate in the cavity, and said substrate placement regions being disposed between the two supporting regions; and wherein at least one (for example each) supporting surface of the plurality of substrate placement regions is surrounded by an inner circumferential wall of the plurality of substrate placement regions and is spaced apart from the latter (for example such that a gap is formed therebetween). In other words, the supporting surface can be configured recessed from the inner circumferential wall. The gap can extend between the supporting surface and the inner circumferential wall, for example in the form of a recess.

According to various embodiments, a processing assembly can have the following: a processing chamber; a first processing device and a second processing device which are disposed in the processing chamber; a substrate holding device according to various embodiments; and a transportation device for transporting and/or positioning the substrate holding device between the first processing device and the second processing device. For example, the transportation device can define a transportation face for transporting a substrate holding device along the transportation face.

The transportation face can extend between the first processing device and the second processing device. The substrate holding device by means of the transportation device can be transported through between the first processing device and the second processing device, for example during the processing by means of the first processing device and/or of the second processing device. Alternatively or additionally, the substrate holding device by means of the transportation device can be positioned between the first processing device and the second processing device, for example during the processing by means of the first processing device and/or of the second processing device.

The substrate, for example the first side thereof, by means of the first processing device can be processed for example from above (illustratively the upper side of said substrate). The substrate, for example the second side thereof, by means of the second processing device can be processed for example from below (illustratively the lower side of said substrate).

According to various embodiments, a method can include the following steps: inserting a substrate into a cavity of a substrate holding device in the substrate placement region thereof, wherein the substrate has a first side and a second side which is opposite the first side; wherein the second side of the substrate is in physical contact with a supporting surface of the substrate placement region; and wherein the substrate has an extent parallel to the supporting surface which is smaller than the cavity (for example smaller than a spacing of opposite portions of an inner circumferential wall level with the supporting surface) of the substrate placement region; processing the first side of the substrate, wherein the supporting surface and the substrate are adapted relative to one another in such a manner that the supporting surface is completely shielded from the processing by the substrate. The first side of the substrate (that is to say that side that is opposite the supporting surface) can optionally be completely exposed. The method can optionally furthermore include the following step: processing the second side of the substrate.

According to various embodiments, a method can include the following steps: placing a substrate onto a supporting surface (for example in a substrate placement region) of a substrate holding device (for example of the carrier plate or of the holding frame), wherein the supporting surface is completely covered by the substrate; and processing the substrate. A side (the first side) of the substrate that is opposite the supporting surface can optionally be completely exposed.

The processing of the substrate can include the processing of the substrate on a first side and/or on a second side, wherein the first side is opposite the second side. The substrate by way of the second side can rest on the supporting surface, for example by way of physical contact.

According to various embodiments, the processing of the substrate (for example of the first side and/or of the second side) can include at least one of the following steps: coating, radiating, subtracting, cleaning, heating, converting (chemically and/or structurally, for example), doping (chemically, for example), polishing. In other words, the substrate can be processed on one side or on two sides.

The processing of the substrate can include coating of the first side of the substrate with a gaseous coating material. Alternatively or additionally, the processing of the substrate can include coating of the second side of the substrate with a gaseous coating material. The gaseous coating materials can be identical or dissimilar, for example be of identical or dissimilar composition.

According to various embodiments, the processing of the substrate can be performed in a vacuum (or at least at negative pressure). Alternatively or additionally, the substrate holding device into which the substrate is inserted can be transported and/or disposed in a vacuum during the processing of the first side of the substrate and/or during the processing second side of the substrate.

According to various embodiments, the processing of the first side of the substrate and the processing of the second side of the substrate can be performed at least partially simultaneously. In other words, the processing of the first side of the substrate and the processing of the second side of the substrate can overlap at least partially in temporal terms and/or at least partially in spatial terms. Alternatively, the processing of the first side of the substrate and the processing of the second side of the substrate can be performed sequentially, that is to say at a mutual temporal and/or spatial spacing.

According to various embodiments, the inserting of the substrate can include placing the substrate onto a supporting surface of the substrate holding device, for example onto a planar supporting surface.

According to various embodiments, the substrate can be inserted into a holding frame (lower frame), for example onto the supporting surface of the latter. The holding frame can be inserted into a cavity of the substrate holding device, for example onto a supporting surface of the substrate holding device. In other words, the holding frame and the carrier plate can be in two parts, for example separable from each other. In this case, the holding frame can be inserted into the carrier plate, for example in a form-fitting and/or force-fitting manner (plug-fitted and/or clamped with an exact fit, for example). For example, the holding frame prior to the substrate being placed can be inserted into a cavity of the carrier plate. For example, the holding frame can at least partially rest on the carrier plate, for example on a supporting surface of the carrier plate. To this end, the carrier plate can have a supporting surface at which the holding frame rests at least partially.

Alternatively, the holding frame can be connected to the carrier plate, for example in a monolithic manner and/or by joining (for example in a materially integral manner, for example by welding and/or adhesive bonding) or for example in a form-fitting and/or force-fitting manner (for example by screwing, and/or riveting).

A substrate placement region of the substrate holding device can illustratively be adapted in such a manner that a substrate can be placed onto a supporting surface of a carrier plate, or a holding frame which holds the substrate can be placed onto a supporting surface of a carrier plate.

According to various embodiments, the substrate can include or be formed from at least one of the following: a ceramic, a glass, a semiconductor (for example an amorphous, polycrystalline or monocrystalline semiconductor such as silicon), a metal, a polymer (for example plastics material). For example, the substrate can be a plastics film, a wafer (a semiconductor substrate), a metal foil, a sheet metal, or a glass plate.

The substrate can be configured in a plate-shaped manner; for example, the first side and/or the second side thereof can be configured planar (level), for example plane-parallel to each other.

The second side (for example the lower side) of the substrate can be at least partially exposed for processing (for example be partially covered by the supporting surface), and/or the first side (for example the upper side) of the substrate can be at least partially (for example completely) exposed for processing.

The second side (illustratively the lower side) of the substrate can be partially covered by that supporting surface (for example by the carrier plate or the holding frame) onto which the substrate is placed. The supporting surface can illustratively partially cover the second side of the substrate, for example the peripheral region of the latter. Furthermore, a central region of the second side of the substrate (for example the lower side thereof) can remain free (exposed) such that the central region of the substrate can be treated, for example coated.

The method can optionally include the step of disposing at least one further substrate (for example a multiplicity of substrates (in at least one further substrate placement region (for example in a multiplicity of substrate placement regions), the step of placing said further substrate for example in at least one further cavity (for example in a multiplicity of cavities) of the substrate holding device, for example in such a manner that a second side (for example a lower side) of the at least one further substrate is partially exposed for processing, and a first side (for example an upper side) of the at least one further substrate is completely exposed for processing.

According to various embodiments, the supporting surface can be compact (continuous) or be penetrated by the cavity. If the supporting surface is compact, the former can completely cover the second side of the substrate. If the supporting surface is penetrated by the cavity, the supporting surface can be provided by a fold on the periphery of the substrate placement region, wherein the fold has the recess.

If the supporting surface is penetrated by the cavity, the supporting surface can at least partially (partially or completely) surround the cavity. Alternatively or additionally, the supporting surface can be provided by means of protrusions, rounded features, chamfers, punctiform contacts, planar contacts, linear contacts, and similar, or mixed forms thereof.

If the supporting surface is penetrated by the cavity, the central region of the second side of the substrate (for example the lower side of the latter) can remain free (exposed) such that the central region of the first substrate can be processed (treated), for example coated.

The holding frame into which the substrate is inserted can also be referred to as the lower frame or the lower mask.

According to various embodiments, the holding frame and the carrier plate can be adapted in such a manner, for example the inner contour of the cavity in the carrier plate can be provided so as to match the external contour of the holding frame, that the holding frame can engage in the cavity in a form-fitting manner, and/or the holding frame remains in a predefined position (that is to say with an exact fit) relative to the cavity. The holding frame herein can be in physical contact with the side wall of the cavity (that is to say the inner circumferential wall thereof), and/or rest on a supporting surface of the carrier plate (that is to say be in physical contact). Alternatively or additionally, the holding frame and the carrier plate can have centering structure that mutually match at least in pairs, respectively.

According to various embodiments, the substrate by way of a peripheral portion can rest on the supporting surface (of the carrier plate or of the holding frame). Alternatively or additionally, the holding frame by way of a peripheral portion can rest on the supporting surface of the carrier plate (for example on the upper side thereof).

The inner circumferential wall (side wall) of the cavity in the carrier plate can delimit the cavity (for example along the carrier plate face), and extend from the upper side of the carrier plate to the lower side of the carrier plate. The upper side of the carrier plate and/or the lower side of the carrier plate can extend along the carrier plate face, for example parallel therewith.

The terms upper side and lower side of the substrate can relate to the upper side and the lower side of the substrate holding device, for example to the carrier plate thereof and/or the holding frame thereof. The upper side of the substrate holding device can refer to that side from which a substrate and/or a holding frame can be inserted into the substrate holding device. By contrast, the substrate holding device or the carrier plate thereof, respectively, can be spatially aligned in an arbitrary manner. For example, the transportation device can be adapted in such a manner that the transportation face extends vertically (that is to say transversely to gravitational force), horizontally (that is to say parallel with gravitational force) and/or at any other angle. In other words, the substrate holding device (or the upper side thereof, respectively) can be aligned and/or transported transversely to gravitational force, parallel with gravitational force, and/or at any other angle in relation to gravitational force.

According to various embodiments, the first processing device can have a first processing region for processing the substrate on the first side thereof, and the second processing device can have a second processing region for processing the substrate on the second side thereof. The transportation device can be adapted for transporting and/or positioning the substrate holding device to/in the first processing region and to/in the second processing region. In other words, the transportation face can extend through the first processing region and/or the second processing region.

According to various embodiments, the first side of the substrate can be processed in the first processing region, and the second side of the substrate can be processed in the second processing region.

The substrate holding device can have a plurality of holding frames (for example disposed beside one another in a planar manner). The carrier plate can optionally have a plurality of cavities (carrier plate cavities) into which the plurality of holding frames can be inserted. Alternatively, the plurality of holding frames can be connected to the carrier plate, for example in a monolithic manner.

Each holding frame of the plurality of holding frames can be allocated to a carrier plate cavity of the plurality of carrier plate cavities. Each holding frame of the plurality of holding frames can be inserted into the allocated carrier plate cavity of the plurality of carrier plate cavities.

According to various embodiments, a substrate holding device (substrate holder) for coating a substrate (for example a wafer), for example a thin substrate, on one side and/or both sides in a vacuum coating system is provided.

According to various embodiments, coating of a substrate on both sides can be provided, for example wherein the upper side of the substrate is coated across the full face. Alternatively or additionally, the lower side (for example the lower face) of the substrate can be covered (masked) in an encircling manner on the periphery (also referred to as a peripheral exclusion), for example by means of a holding frame.

The upper side of the substrate can also be masked by employing an additional and optional upper mask (sandwich supporting).

An electrically isolating periphery (isolating cavity) between a coating on the upper side and a coating on the lower side can be provided by means of masking the upper side and/or the lower side. On account thereof, a respective short circuit between electrically conductive layers on the upper side and the lower side of the substrate can be avoided. For example, a defined encircling region (peripheral region) of the substrate can be protected (shaded) from coating (also referred to as peripheral exclusion or non-coated annular area). Shading can be simplified when the supporting surface (substrate supporting surface) is level (planar, in other words).

The substrate can include an electrically isolating material and/or an electrically semiconducting material.

According to various embodiments, the substrate can include or be formed from a transparent material (for example for coatings of optical components). For example, the substrate can include or be formed from an optical component.

According to various embodiments, a substrate can include or be formed from a semiconducting material, for example silicon and/or silicon carbide. For example, the substrate can include a semiconductor component and/or a photovoltaic component.

According to various embodiments, a barrier and/or an encapsulation can be formed on the substrate.

Each substrate is placed in an individual, for example flexurally rigid, pocket (also referred to as the holding frame or the lower mask). The holding frame can have a planar supporting surface and/or by means of a predefined contour of the supporting surface provide defined masking (for example a peripheral exclusion of the coating on the lower side of the substrate). These pockets can be fixed and/or supported in a floating manner in a carrier frame (carrier).

By virtue of the mechanical decoupling of the individual pockets from the carrier frame, said pockets can be supported independent from the deformation of the carrier frame (carrier). The carrier frame by virtue of flexing can be deformed in the horizontal position (that is to say in the horizontal extent), for example. The planarity of the supporting surface within the pockets remains constant herein. In other words, a transmission of mechanical stress from the carrier frame to the holding frame and/or to the substrate supported therein is reduced and/or prevented.

The substrates are thus protected from flexural stress and vibrations, and from insufficient sputtering in the peripheral region. In the case of refinements, for example modifications to the dimensions of the substrate, optimization of the pocket contours, etc., the pockets can be replaced without having to exchange or modify the carrier frame. In other words, the holding frames are provided independently from the substrate carrier, that is to say variably. In the case of wear of or damage to, respectively, individual pockets, only said pockets and not the entire carrier frame (carrier) have to be replaced. The pockets which are wear parts can be produced in a cost-effective manner by the injection molding method from vacuum-capable plastics materials or composite materials, for example with a ply-adhesive surface. Optionally, the holding frame can have an encircling recess. Alternatively or additionally, an additional upper mask can be used.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which:

FIGS. 1 to 3 show a substrate holding device, in a respective schematic cross-sectional view, according to various embodiments;

FIGS. 5A to 5C show a substrate holding device, in a respective schematic cross-sectional view, according to various embodiments;

FIG. 6A shows two respective holding frames of a substrate holding device in a schematic perspective detailed view, according to various embodiments;

FIG. 6B shows a substrate transportation device in a schematic cross-sectional view, according to various embodiments;

FIG. 11A, FIG. 11B, and FIG. 11C show a respective processing assembly according to various embodiments, in a schematic cross-sectional view;

FIGS. 21A and 21B show a respective diagram according to various embodiments.

DETAILED DESCRIPTION

Figure 1:
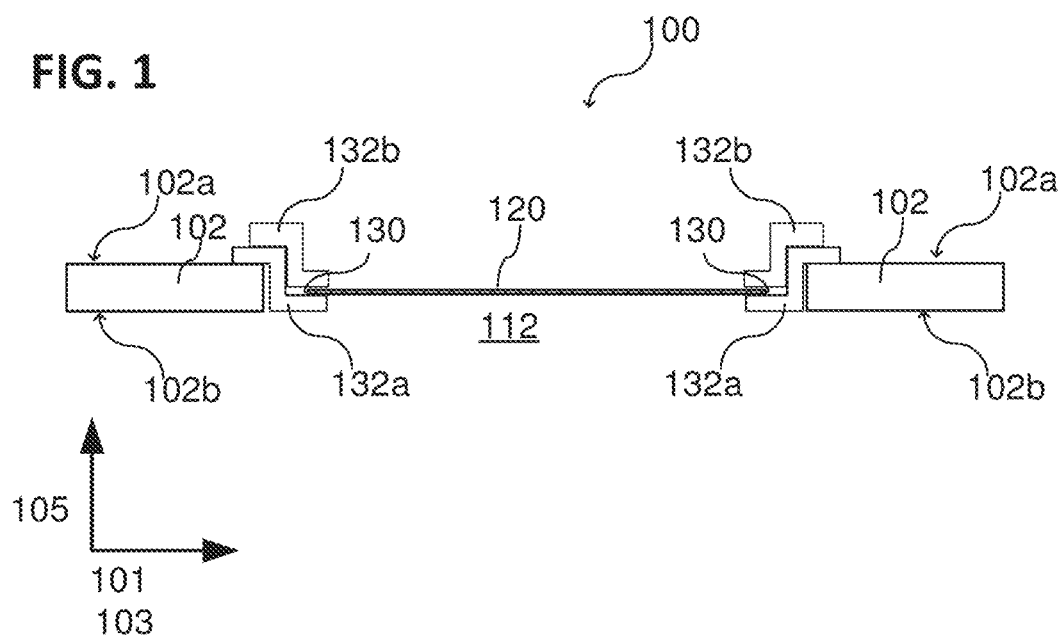

In the following detailed description, reference is made to the accompanying drawings, which form part of this description and which show, for illustration purposes, specific exemplary embodiments in which the invention can be implemented. In this regard, direction terminology such as, for instance, "at the top", "at the bottom", "at the front", "at the back", "front", "rear", etc. is used with respect to the orientation of the figure(s) described. Since components of exemplary embodiments can be positioned in a number of different orientations, the direction terminology serves for illustration purposes and is not restrictive in any way whatsoever. It goes without saying that other exemplary embodiments can be used and structural or logical changes can be made, without departing from the scope of protection of the present invention. It goes without saying that the features of the various exemplary embodiments described herein can be combined with one another, unless specifically indicated otherwise. The following detailed description should therefore not be interpreted in a restrictive sense, and the scope of protection of the present invention is defined by the appended claims.

In the context of this description, the terms "connected" and "coupled" are used to describe both a direct and an indirect connection, and a direct or indirect coupling. In the figures, identical or similar elements are provided with identical reference signs, in so far as this is expedient.

According to various embodiments, the substrate holding device described herein can be used for transporting substrates, for example wafers, in a processing chamber, for example in a horizontal coating system, for example for coating the substrates by means of physical vapor deposition (PVD) and/or chemical vapor deposition (CVD). The substrate holding device herein can be provided in such a manner, and the coating system can be adapted in such a manner, that the substrates can be coated from below and/or from above, for example simultaneously from below and from above, or for example sequentially from below and from above, without the substrates being discharged from the coating system.

The substrate transportation device described herein, having the substrate holding device, is illustratively suitable for transporting wafers or other thin substrates (for example of a thickness of less than 2 mm or less than 1 mm or less than 0.5 mm) in a vacuum coating system. Both the upper sides as well as the lower sides of the substrates can be coated herein without the substrates having to be removed from the substrate holding device. This permits masking of the upper side and of the lower side of the substrates, for example. A respective coating of the reverse side is avoided. In other words, the substrate transportation device can be adapted in such a manner that said substrate transportation device separates two processing regions from each other (for example a respective coating region above and below the substrate transportation device). The substrates can thus be coated from above and below with dissimilar materials, without the materials that have been deposited on the substrates mixing.

According to various embodiments, the substrate holding device can be used for coating substrates, for example with optical layers and semiconductor layers and/or encapsulation layers.

The substrate holding device can enable, for example, that uniform coating of both sides of the substrates can be performed in a vacuum at a layer thickness differential of less than 2%. The respective substrate can be coated across the full area from above, masked on one side or on both sides. In other words, one of the holding frames can also be adapted as a plate such that the entire face of the substrate is covered. The construction of the substrate holding device can be embodied in such a manner that automatic loading and unloading of wafers and masks (holding frames) is possible.

In the case of a process masked on both sides with the objective of a uniform coating of the upper side and of the lower side of the substrates it can be necessary or helpful for the same geometric conditions (for example target spacing, gas separation, effective area, angle of action, shading, etc.) to be implemented on both sides, for example.

It can furthermore be necessary or helpful to ensure that the substrates during the entire process are transported in a secure stable position, for example. To this end, the substrates can be each individually inserted into the flexurally rigid lower mask for example, wherein the flexurally rigid lower mask provides a planar supporting surface. Furthermore, defined masking (peripheral exclusion of the coating) can be implemented by means of a predefined pocket contour in the lower mask. The lower masks can be fixed in a floating manner in a carrier frame (referred to as the carrier plate), for example. The planarity of the supporting surface within the lower mask remains constant, independently from the deformation of the carrier frame, for example of flexing in the horizontal position. Damaging flexural stress on the substrates is thus decoupled, for example. In other words, substantially no mechanical stress is transmitted from the carrier frame to the respective substrate.

The exact mutual position of the masks, that is to say the congruency of the mask openings, for example, is guaranteed by means of suitable mutual centering of the masks, for example. Centering can be designed in such a manner that reliable automated handling is guaranteed, and that no mutual canting and/or jamming of the masks arises.

A dowel bore can be provided at each of the (for example four) corners of a holding frame, and a dowel pin can be provided on the mating piece (for example on the other of the two holding frames). Adequate circular segments (for example milled contours) which have the same functionality are also possible in constructive terms. These centering contours can be made with maximum precision positionally accurate and centric in relation to the masking window (for example with the respective machine accuracy of NC (numerically controlled) machines).

The centering contours can furthermore have chamfers and/or introduction ramps such that, even in the case of inaccurate mutual pre-centering of the masks the latter move to a congruent position in steps during pairing (step-by-step centering). The advantage is passed on directly as a lower positional accuracy that is required in automatic loading.

The centering elements (also referred to as the centering structures) can be disposed in such a manner that said centering elements are located on that side of the respective mask that is not reached by the coating source (the centering elements can illustratively be shaded). This prevents that supporting surfaces and/or centering faces are unintentionally coated, for example, and prevents an associated loss in terms of the accuracy of centering, for example.

High flexibility is guaranteed by virtue of the separation of the carrier structure so as to have carrier frames, lower masks, and upper masks. The carrier frame can be made as a simple cost-effective part (for example as a laser-cut part without post-processing). The high requirements in terms of precision are reduced to the masks (or the holding frames, respectively). Said masks, by virtue of the comparatively small dimensions, can be made more cost-effectively as volume parts. The respective masks can be changed depending on the process. Exchanging individual masks in the case of damage is possible at any time. The cleaning possibilities (so-called de-coating), for example by way of wet chemistry or by means of dry-ice blasting, also become simpler and more cost-effective.

FIG. 1 visualizes a substrate holding device 100 in a schematic cross-sectional view or lateral view, according to various embodiments. The substrate holding device 100 can have a carrier plate 102, for example. The carrier plate 102 can have at least one cavity 112 in such a manner that a lower frame 132*a* (a first holding frame 132*a*) and an upper frame 132*a* (a second holding frame 132*b*) can be received or at least partially received in the cavity 112, in order for a substrate 120 to be held in the cavity 112 by means of the two holding frames 132*a*, 132*b*.

The carrier plate 102 can have an upper side 102a (or an upper surface, respectively) and a lower side 102b (or a lower surface, respectively), for example. The two surfaces 102a, 102b can be plane-parallel to each other (for example at least partially). The carrier plate 102 along the direction 105 (perpendicular to the two surfaces 102a, 102b) can have a thickness in a range from approximately 3 mm to approximately 80 mm, for example a thickness in a range from approximately 1 cm to approximately 6 cm. According to various embodiments, the carrier plate 102 can be composed of or include titanium. Alternatively, the carrier plate 102 can be made from any other suitable material, for example from a composite material or from metal, for example stainless steel. Furthermore, the carrier plate 102 along the direction 103 (parallel with the two surfaces 102a, 102b) can have a width in a range from approximately 50 cm to approximately 5 m, for example a width in a range from approximately 1 m to approximately 3 m. Furthermore, the carrier plate 102, parallel with the two surfaces 102a, 102b and transverse to the width direction 103, can have a length in a range from approximately 40 cm to approximately 5 m, for example a width in a range from approximately 0.5 m to approximately 2 m.

According to various embodiments, the carrier plate 102 in terms of the dimensions can be adapted to both the quantity and the size of the substrates 120 to be received as well as to the size (for example the coating width and/or lock length) of the processing system that is used for treating the substrates.

Furthermore, the at least one cavity 112 in the carrier plate 102 can extend from the upper side 102a of the carrier plate 102 through the carrier plate 102 to the lower side 102b of the carrier plate 102. When viewed from the direction 105, the cavity 112 can be circular, square or be arbitrarily polygonal. The shape of the cavity 112 can be adapted to the external contour of the substrate to be received, for example the cavity 112 can be substantially circular in order for a circular wafer to be received, or square (having rounded or cut corners, for example) in order to receive square wafers (having rounded or cut corners, for example).

Furthermore, the substrate holding device 100 can have a first holding frame 132a that is inserted into the cavity 112 and partially rests on the carrier plate (102) (for example on the upper side 102a of the carrier plate 102). Furthermore, the substrate holding device 100 can have a second holding frame 132b which partially rests on the first holding frame 132a. The two holding frames 132a, 132b can be adapted in such a manner that a receiving space 130 (for example a gap 130) for receiving a peripheral portion of the substrate 120 is provided between the two holding frames 132a, 132b.

For example, the substrate 120 can rest on the first holding frame 132a, and/or the second holding frame 132b can be disposed above the substrate 120, wherein the second holding frame 132b is not in physical contact with the substrate 120, for example.

In an analogous manner, the carrier plate 102 can have a multiplicity of cavities 112 for simultaneously receiving and holding a multiplicity of substrates.

For example, FIG. 1 illustratively shows a basic carrier 102 (also referred to as the carrier plate 102) which can position one or preferably a plurality of wafers for a PVD process. The basic carrier 102, depending on the number and shape of the wafers to be received, has corresponding portions 112.

As is visualized in FIG. 1, for example, the holding frames 132a, 132b can project beyond the upper side 102a (and/or the lower side 102b) of the carrier plate 102. Alternatively, the holding frames 132a, 132b can also be provided so as to be flush with the carrier plate 102.

According to various embodiments, the two holding frames 132a, 132b can define a coating region in which a substrate 120 that is positioned between the two holding frames 132a, 132b can be coated. The two holding frames 132a, 132b can illustratively be provided in such a manner that said holding frames 132a, 132b cover or shield (mask) at least one peripheral portion of a substrate 120 that is positioned between the two holding frames 132a, 132b.

As is illustrated in FIG. 1, the substrate 120, for example a wafer, for example a semiconductor wafer, for example a silicon wafer, can be received in the substrate holding device 100. The substrate 120 can rest on the first (or the lower, respectively) holding frame 132a, for example; the substrate 120 by way of the full circumference of the peripheral region of the substrate 120 can rest on the lower holding frame 132a, for example. Alternatively, the substrate 120 in the peripheral region of the substrate 120 (for example in the case of an angular substrate by way of the corners, respectively) can also rest only partially on the lower holding frame 132a. The lower holding frame 132a can have a level (or planar, respectively) supporting surface for placing the substrate 120. In other words, the lower holding frame 132a can provide a resting plane for placing the substrate 120.

In the case of a treatment on only one side of the substrate 120 being required, the holding frame can be configured as a closed holding plate, for example, such that a side of the substrate is completely covered (or masked, respectively).

A narrow gap, for example having a gap height (along the direction 105) in a range from approximately 0.1 mm to approximately 0.5 mm, or having a gap height of less than 500 µm, 400 µm, 300 µm, 200 µm, or 100 µm can remain between the second (or the upper, respectively) holding frame 132b and the substrate 120. In this case, a minor production tolerance for the holding frames 132a, 132b of the substrate holding device 100 is thus also required for example. The substrate holding device 100 can be adapted in such a manner that plate-shaped substrates 120 of arbitrary thickness, such as of a thickness in a range from approximately 0.1 mm to approximately 1 cm can be received in the cavity 112.

According to various embodiments, the gap 130 (also referred to as the receiving space for receiving the substrate 120) between the two holding frames 132a, 132b can have a gap height which can be adapted to the thickness of the substrate 120 to be received, for example having a gap height (along the direction 105) in a range from approximately 0.1 mm to approximately 1 mm, or having a gap height of less than 1 mm, 500 µm, 300 µm, or 200 µm. Furthermore, the gap 130 that is provided between the two holding frames 132a, 132b can be adapted to the width (for example the diameter or the lateral extent) of the substrate 120 (in the direction 103). The two holding frames 132a, 132b and the cavity 112 can illustratively be adapted in such a manner that the substrate 120 is laterally exposed, that is to say in other words such that the substrate 120 does not laterally abut the first holding frame 132a and the second holding frame 132b.

In this context, the substrate holding device 100 can be provided in such a manner that dissimilar holding frames 132a, 132b can be used for substrates 120 of dissimilar substrate thicknesses. The upper holding frame 132b should illustratively not be in physical contact with the substrate 120. Furthermore, the substrate holding device 100 can be provided in such a manner that dissimilar holding frames 132a, 132b can be used for substrates 120 having dissimilar substrate diameters or substrate widths. It goes without saying that the substrate diameter or the substrate width can illustratively be limited by the width of the cavity 112.

Various modifications and configurations of the substrate holding device 100 and detail pertaining to the cavity 112 and to the holding frames 132a, 132b will be described hereunder, wherein the fundamental features and operating modes that have been described in the context of FIG. 1 can be included in an analogous manner. Furthermore, the features and operating modes that are described hereunder can be applied in an analogous manner to the substrate holding device 100 that is described in FIG. 1, or combined with the substrate holding device 100 that is described in FIG. 1.

Figure 2:
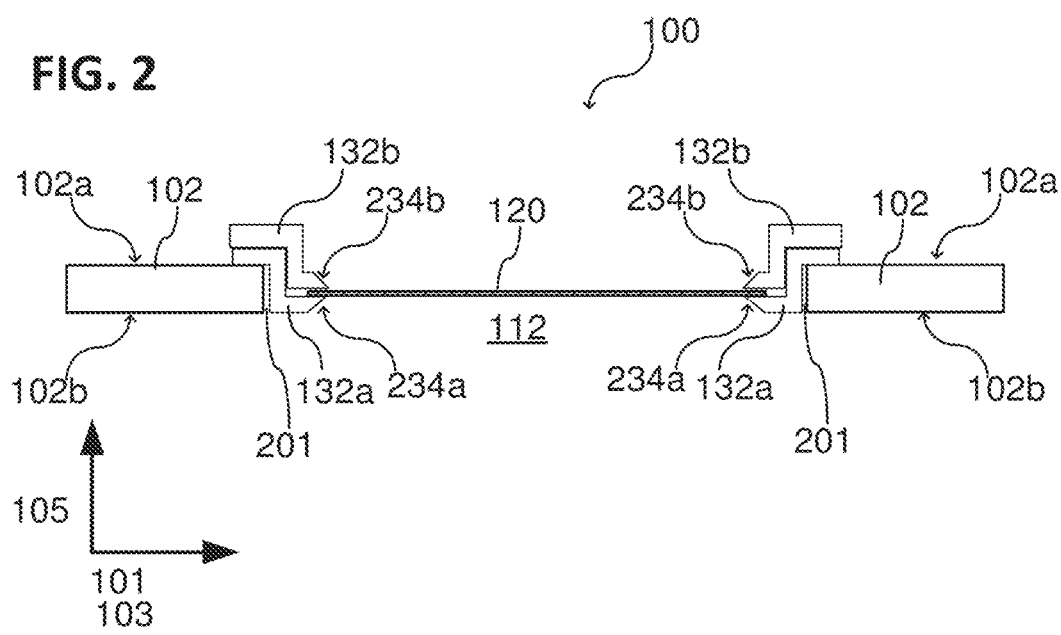

FIG. 2 visualizes the substrate holding device 100 in a schematic cross-sectional view, according to various embodiments, wherein the upper holding frame 132b and/or the lower holding frame 132a are/is chamfered, or in other words can have a chamfer 234a, 234b. According to various embodiments, the inner circumferential wall of the lower and/or of the upper holding frame 132a, 132b can have a chamfer 234a, 234b. The substrate 120 can thus be coated in a more homogeneous manner, for example, since no or a minor shading of the substrate 120 by virtue of the holding frames 132a, 132b takes place, for example.

Furthermore, the upper holding frame 132b can be adapted in such a manner that said upper holding frame 132b completely covers the lower holding frame 132a. The lower holding frame 132a can thus not be coated from above, for example.

Furthermore, a spacing 201 or gap 201 can be provided between the lower holding frame 132a and the carrier plate 102 such that the lower holding frame 132a is illustratively suspended with lateral play in the cavity. The lower holding frame 132a can thus be decoupled from the carrier plate 102 such that no flexural stress is transmitted from the carrier plate 102 to the lower holding frame 132a and thus to the substrate 120, for example.

According to various embodiments, the carrier plate 102 can have a centering structure for holding the lower holding frame 132a in a centered manner.

FIG. 3 visualizes the substrate holding device 100 in a schematic cross-sectional view, according to various embodiments, wherein the two holding frames 132a, 132b have a common centering structure 336 such that the two holding frames 132a, 132b come to rest in a mutually predefined position when the lower holding frame 132a is being inserted into the cavity 112 and the upper holding frame 132b is being placed onto the lower holding frame 132a.

The two holding frames 132a, 132b can illustratively have portions and/or cavities which mutually engage in a form-fitting manner. The two holding frames 132a, 132b can thus also not be displaced from each other laterally along the direction 103. The upper holding frame 132a herein is exclusively fixed by gravitational force, for example. In other words, mutual clamping of the two holding frames 132a, 132b cannot be required. For example, this enables simpler loading and unloading of the holding frames 132a, 132b and of the substrate 120, into and from the carrier plate 102, respectively.

As is visualized in FIG. 3, the two holding frames 132a, 132b can have a plurality of centering structures 336 that mutually match in pairs, such that the two holding frames 132a, 132b can be centered to each other, or be moved to a mutually predefined position when the upper holding frame 132b is being placed onto the lower holding frame 132a.

Figure 4A:
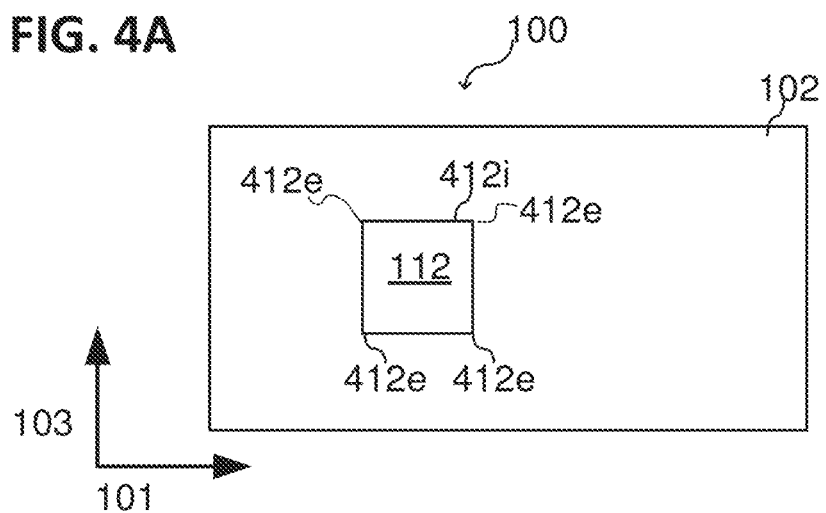
FIGS. 4A and 4B show a substrate holding device, in a respective schematic plan view, according to various embodiments.

FIG. 4A visualizes a substrate holding device 100 in a schematic plan view, according to various embodiments. The cavity 112 in the carrier plate 102 can be substantially rectangular-box shaped, for example, and thus (when viewed from above, for example) have four corner regions 412e. Alternatively, the cavity 112 in the carrier plate 102 can have any other suitable shape, for example adapted to the shape of the substrate 120 and/or to the shape of the two holding frames 132a, 132b.

For example, the cavity 112 can have a substantially rectangular-box shaped inner contour 412i having four inner corner portions 412e. The two holding frames 132a, 132b can have a substantially rectangular-box shaped external contour having four external corner portions, so as to match the cavity 112, for example.

According to various embodiments, the two holding frames 132a, 132b in the respective four external corner portions of the holding frames 132a, 132b can respectively have centering structures that mutually match in pairs (cf. FIG. 6A, for example). Furthermore, the first holding frame 132a can rest on the carrier plate 102 only in the corner regions 412e of the cavity 112.

Figure 4B:
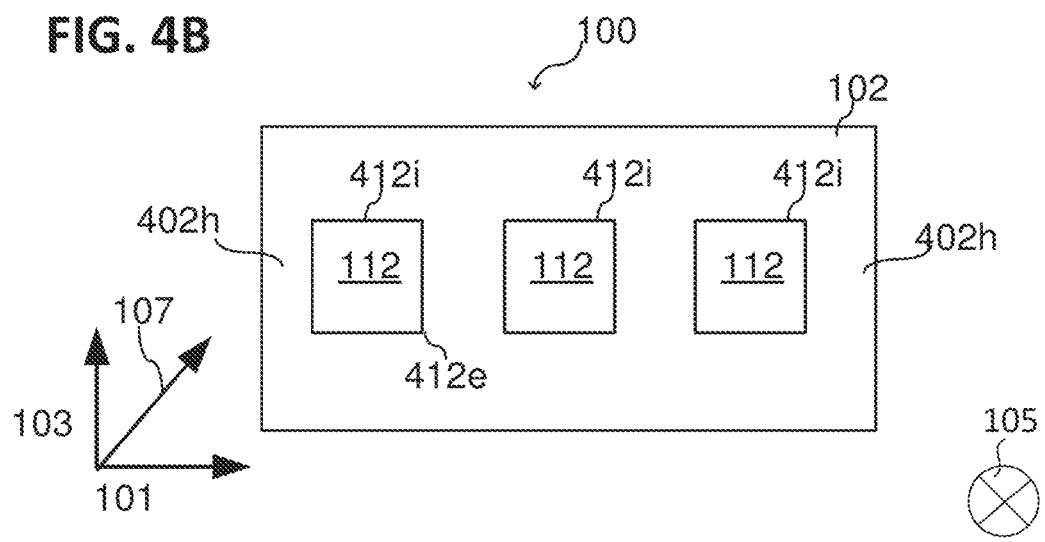

As is visualized in a schematic plan view of the carrier plate 102 of the substrate holding device 100 in FIG. 4B, a plurality of cavity 112 can be provided beside one another in the carrier plate 102, in order for a plurality of substrates 120 to be held. The direction 101 herein can be a transportation direction 101 along which the substrate holding device 100 can be transported in a processing assembly for processing the plurality of substrates, wherein the plurality of cavities can be disposed beside one another at least along the width direction 103 transverse to the transportation direction 101.

Accordingly, the carrier plate 102 can have at least two holding regions 402h (or holding portions 402h, respectively) in which the carrier plate 102 can be bear or supported, in order for the carrier plate 102 together with the substrates 120 that are held in the carrier plate 102 to be transported (cf. FIG. 6B).

In a manner analogous to the carrier plate 102 that is illustrated in FIG. 4B, a substrate holding device 100 can thus have the following: a carrier plate 102 having a plurality of cavities 112 that are disposed beside one another, wherein each of the cavities 112 is adapted for receiving a first holding frame 132a and a second holding frame 132b as described herein, wherein the carrier plate 102 has two holding regions 402h at which the carrier plate 102 can be supported for transporting the carrier plate 102, wherein the plurality of cavities 112 that are disposed beside one another are disposed between the two holding regions 402h.

FIG. 5A visualizes a substrate holding device 100 in a schematic cross-sectional view, according to various embodiments, for example in a sectional view transverse to the direction 103 (cf. FIG. 4A and FIG. 4B, for example), wherein a sectional view of the respective substrate holding device 100 in the direction 107 is visualized in FIG. 5B. The centering elements 336 in the external corner regions 532e of the two holding frames 132a, 132b are illustratively visualized in FIG. 5B, in a manner analogous to what has been described above.

For example, the lower holding frame 132a can have a centering cavity, for example a passage bore, in each external corner portion 532e. Furthermore, the upper holding frame 132b in each external corner portion 532e can have a centering protrusion that matches the centering cavity in the lower holding frame 132a, for example.

The centering protrusion herein can have a conically shaped portion, for example, such that the centering protrusion can be more readily introduced into the for example cylindrical centering cavity.

FIG. 5C visualizes a substrate holding device 100 in a schematic cross-sectional view, according to various embodiments, for example in a sectional view transverse to the direction 103 (cf. FIG. 4A, FIG. 4B, and FIG. 5A, for example).

According to various embodiments, the upper holding frame 132b can be chamfered (or illustratively be beveled toward the cavity 112). In other words, the upper holding frame 132b can have a chamfer 234b. The lower holding frame 132a can furthermore be chamfered (or illustratively be beveled toward the cavity 112). In other words, the lower holding frame 132a can have a chamfer 234a.

According to various embodiments, the respective inner circumferential wall of the lower and/or of the upper holding frame 132a, 132b can have a chamfer 234a, 234b. The substrate 120 can thus be coated in a more homogeneous manner, for example, since no or less shading of the substrate 120 by virtue of the holding frame 132a, 132b takes place, for example.

According to various embodiments, the lower holding frame 132a by way of only the external corner portions 532e thereof can rest on the carrier plate 102, cf. FIG. 5B and FIG. 6.

FIG. 6A visualizes two respective holding frames 132a, 132b of the substrate holding device 100 in a schematic perspective detailed view, according to various embodiments, wherein the two holding frames 132a, 132b in the external corner portions 532e thereof have a plurality of centering elements that mutually match in pairs, such that the two holding frames 132a, 132b are centered to each other when the second holding frame 132b is being placed onto the first holding frame 132a. The two frame openings 132 can be rendered so as to be congruent when the two holding frames 132a, 132b are being centered to each other.

The centering structures that mutually match in pairs can be provided in the form of a cylindrical centering cavity 632a in the lower holding frame 132a, and of a centering protrusion 632v in the upper holding frame 132b that matches the centering cavity 632a, for example. Alternatively, the centering structures that mutually match in pairs can have any other arbitrary suitable centering elements. For example, centering contours 632k that mutually match in pairs can be provided in the lower holding frame 132a and in the upper holding frame 132b.

The centering structures that mutually match in pairs illustratively form a form-fit in at least two directions, for example along the direction 105, in order for the upper holding frame 132b to be placed onto the lower holding frame 132a, and along the direction 103 and/or 107, in order for the lateral centering of the positions of the two holding frames 132a, 132b relative to each other.

FIG. 6B visualizes a substrate transportation device 600 for transporting the substrate holding device 100 in a schematic cross-sectional view, according to various embodiments.

According to various embodiments, the substrate transportation device 600 can have a transportation system for transporting the substrate holding device 100, wherein the transportation system has two holding elements 712 in such a manner that the carrier plate 102 of the substrate holding device 100 is held or supported, respectively, only in the two holding regions 402h. The transportation of the carrier plate 102 that is supported on the holding elements 712 can be performed by means of transportation rollers, chains, bars, for example, or another suitable transportation system.

By virtue of the supporting of the carrier plate 102 the latter can flex, for example, with maximum flexing 705 in the center of the carrier plate 102, for example. By virtue of the holding frame assemblies 702 being decoupled from the carrier plate 102 in order for the respective substrates to be held, the flexing 705 of the carrier plate 102 cannot have any negative influence on the substrates, as described above.

In order for a respective substrate 120 to be received between the two holding frames 132a, 132b, the respective holding frame assembly 702 can have the two holding frames 132a, 132b described herein.

The substrate transportation device 600 described herein can be used for transporting and/or positioning the plurality of substrates 120 in a processing chamber (for example in a vacuum chamber or an atmospheric pressure chamber or a positive pressure chamber). The processing chamber herein can have one or a plurality of processing devices (for example coating devices), in order for the plurality of substrates 120 to be processed (for example coated) on one side or on both sides in a processing region (for example a coating region) of the processing chamber.

Magnetrons can be used as coating devices, for example. Furthermore, electron beam evaporators can be used as coating devices. Transportation rollers that are supported on a side, for example, can be used on both sides of the carrier plate 102 for transporting the carrier plate 102 through the processing chamber. Furthermore, the carrier plate 102 can also be inserted into a further carrier, or be transported by means of a further carrier.

Figure 7:
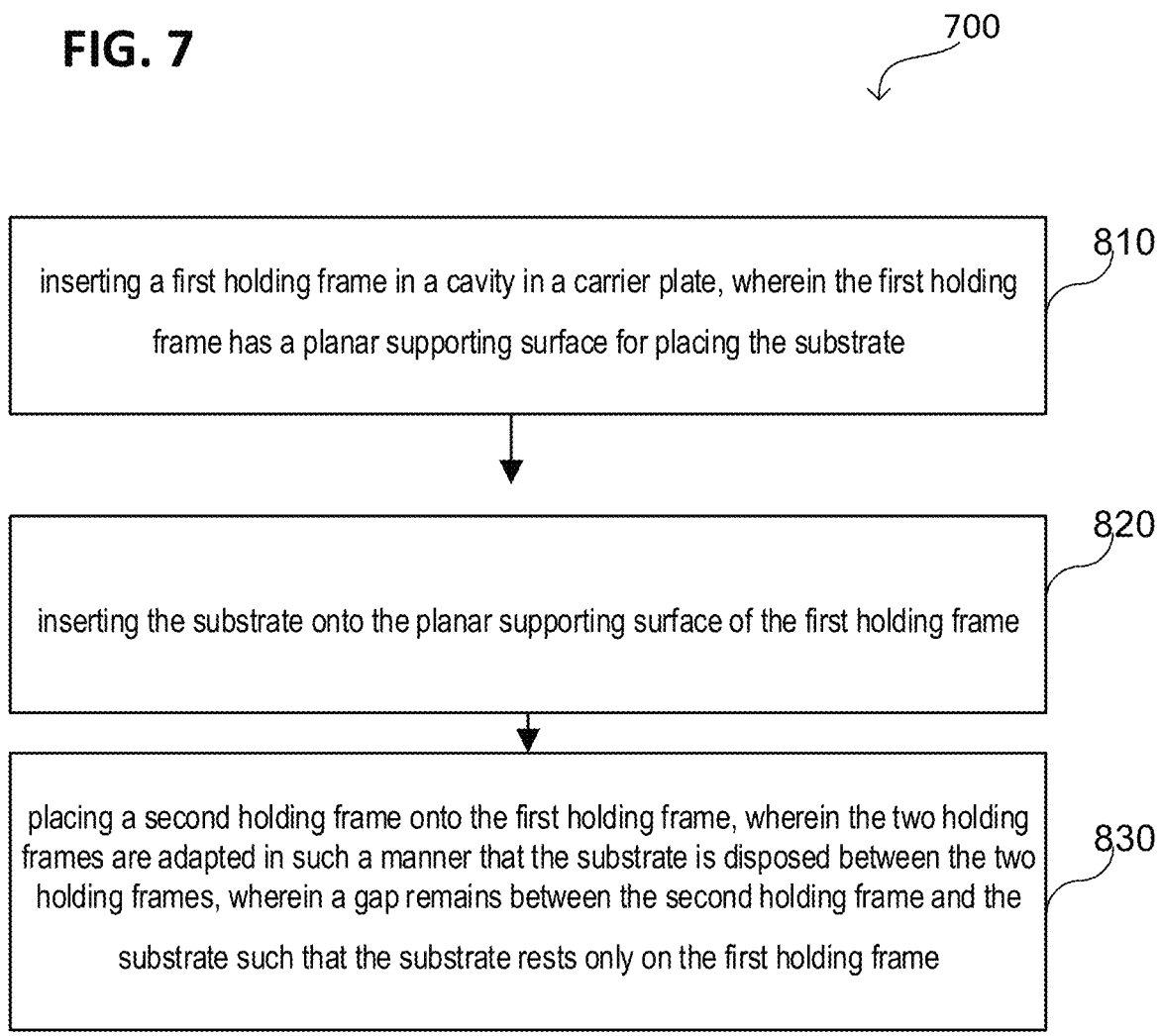
FIG. 7 shows a method for processing a substrate in a schematic flow diagram, according to various embodiments.

FIG. 7 visualizes a method 700 for processing a substrate 120 in a schematic flow diagram, according to various embodiments, wherein the method 700 can include the following steps: in step 810 inserting a first holding frame 132a in a cavity 112 in a carrier plate 102, wherein the first holding frame 132a has a planar supporting surface for placing the substrate 120; in step 820 inserting the substrate onto the planar supporting surface of the first holding frame; and in step 830 placing a second holding frame onto the first holding frame, wherein the two holding frames 132a, 132b (the first and the second holding frame) are adapted in such a manner that the substrate 120 is disposed between the two holding frames 132a, 132b, wherein a gap remains between the second holding frame 132b and the substrate 120 such that the substrate 120 rests only on the first holding frame 132a.

The inserting and placing, respectively, of the first holding frame 132a and/or of the second holding frame 132b herein can be performed by means of a magnetic gripper or of a suction gripper. To this end, the first holding frame 132a and/or the second holding frame 132b can have respective regions in which the magnetic gripper or the suction gripper can firmly hold the respective holding frame 132a, 132b.

The lower mask 132a can illustratively be inserted first into the basic carrier 102. Once the lower mask 132a has been inserted into the basic carrier 102, the wafer 120 can be brought to rest (for example having a small gap all around in relation to the basic carrier 102 or to the lateral periphery of the lower mask 132a, respectively). The upper mask 132b is subsequently brought to rest. The upper mask 132b herein never contacts the surface of the wafer 120, for example. Once this procedure for all wafers 120 that are to be carried by means of the substrate holding device 100 has been completed, a PVD process can commence, for example. By means of the gaps that remain laterally with respect to the substrate 120 and above the latter, efficient evacuating can be supported when the substrate holding device 100 passes the lock into a vacuum chamber, since no gas volumes are trapped, for example.

The unloading procedure can be performed like the loading procedure, for example, but in the reverse order, wherein the lower mask 132a can potentially remain permanently in the basic carrier 102.

According to various embodiments, all components can be suitable for fully automated loading and/or unloading of the wafers 120 and of the masks 132a and 132b thereof. According to various embodiments, the loading of the substrate holding device 100 with substrates 120 can be performed upon cleaning of all parts, for example upon cleaning by wet chemistry or upon dry-ice blasting.

According to various embodiments, the upper holding frame 132b can be supported only by the lower holding frame 132a. Furthermore, the lower holding frame 132a can rest loosely (for example in a laterally floating manner) on the carrier plate 102, wherein part of the lower holding frame 132a can extend into the cavity 112 of the carrier plate 102.

According to various embodiments, a substrate holding device 100 which enables a reduction of the risk of wafer breakage in the production system as well as a flexible mask design and simple maintenance is provided. Furthermore, the substrate holding device 100 has low production costs, since the precision is concentrated in small parts, that is to say illustratively in the holding frames 132a, 132b, for example, and not in the entire carrier plate 102. Furthermore, accurate mask centering can be enabled, enabling a higher rate of efficiency in the case of the substrates to be coated.

Furthermore, the influence of the carrier movement can be decoupled from the wafer by means of the substrate holding device 100 as described herein. Furthermore, the reliability of the process is enhanced since the centering of the mask is performed by means of a precise form-fit.

Examples according to various embodiments are described hereunder:

EXAMPLE 1a

Substrate holding device 100 having:
a carrier plate 102 having a cavity 112 for holding a substrate 120 by means of a first holding frame 132a and of a second holding frame 132b in the cavity 112, wherein the cavity 112 extends from an upper side 102a of the carrier plate 102 through the carrier plate 102 to a lower side 102b of the carrier plate 102;
wherein the first holding frame 132a that is inserted into the cavity 112 partially rests on the carrier plate 102 and wherein the second holding frame 132b partially rests on the first holding frame 132a, and
wherein the two holding frames 132a, 132b are adapted in such a manner that a receiving space 130 for receiving a peripheral portion of the substrate 120 is provided between the two holding frames 132a, 132b, when disposed in the cavity 112.

EXAMPLE 2a

Substrate holding device according to example 1a, wherein the two holding frames 132a, 132b are adapted in such a manner that said two holding frames 132a, 132b mutually engage in a form-fitting manner when the second holding frame 132b is being placed onto the first holding frame 132a.

EXAMPLE 3a

Substrate holding device according to example 2a, wherein the two holding frames 132a, 132b have a plurality of centering structures 336 that mutually match in pairs, such that the two holding frames 132a, 132b are centered to each other when the second holding frame 132b is being placed onto the first holding frame 132a.

EXAMPLE 4a

Substrate holding device according to one of examples 1a to 3a, wherein a respective inner circumferential wall of the two holding frames 132a, 132b has a chamfer.

EXAMPLE 5a

Substrate holding device according to one of examples 1a to 4a, wherein the cavity 112 is substantially rectangular-box shaped and has four corner regions, and wherein the first holding frame 132a rests on the carrier plate 102 only in the corner regions of the cavity 112.

EXAMPLE 6a

Substrate holding device according to example 5a, wherein the two holding frames 132a, 132b, in a manner so as to match the cavity 112, have a substantially rectangular-box shaped external contour having four external corner portions, and wherein the two holding frames 132a, 132b in the four external corner portions, respectively, have centering structures that mutually match in pairs.

EXAMPLE 7a

Substrate holding device 100 having:
a carrier plate 102 having a plurality of cavities 112 that are disposed beside one another, wherein each of the cavities 112 for holding a substrate is adapted by means of a first holding frame 132a and a second holding frame 132b and extends from an upper side 102a of the carrier plate 102 through the carrier plate 102 to a lower side 102b of the carrier plate 102, and wherein in each of the cavity 112 a first holding frame 132a partially rests on the carrier plate 102, and a second holding frame 132b partially rests on the first holding frame 132a, wherein the two holding frames 132a, 132b are adapted in such a manner that a receiving space 130 for receiving a peripheral portion of the substrate 120 is provided between the two holding frames 132a, 132b, when disposed in the respective cavity 112; wherein the carrier plate 102 has two holding regions 402h at which the carrier plate 102 can be supported for transporting the carrier plate 102, wherein the plurality of cavities 112 that are disposed beside one another are disposed between the two holding regions 402h.

EXAMPLE 8a

Substrate transportation device having:
a substrate holding device 100 according to example 7a; and a transportation system for transporting the substrate holding device 100, wherein the transportation system has two holding elements 712 in such a manner that the carrier plate 102 of the substrate holding device 100 is held only in the two holding regions 402h.

EXAMPLE 9a

Processing assembly having:
a processing chamber for processing both sides of a plurality of substrates 120 in a processing region of the processing chamber; and a substrate transportation device according to example 8a, for transporting and/or positioning the plurality of substrates 120 in the processing region.

EXAMPLE 10a

Method for processing a substrate, said method including the following steps:
inserting a first holding frame 132a for holding the substrate into a cavity 112 in a carrier plate 102, wherein the first holding frame 132a has a planar supporting surface for placing the substrate 120;
inserting the substrate 120 onto the planar supporting surface of the first holding frame 132a; and
placing a second holding frame 132b onto the first holding frame 132a, wherein the two holding frames 132a, 132b are adapted in such a manner that the substrate 120 is disposed between the two holding frames 132a, 132b, wherein a gap remains between the second holding frame 132b and the substrate 120 in such a manner that the substrate 120 rests only on the first holding frame 132a.

In a vacuum system in which a coating process such as cathodic evaporation, for example (so-called sputtering or magnetron sputtering) is performed, wafers and small-area substrates can be processed, for example coated, on both sides. That is to say that one and the same substrate can be processed on both sides in a method cycle. Such concepts are employed in photovoltaics, for example, for example in the cellular concept of HJT (heterojunction technology) solar cells. The heterojunction technology represents a niche market and according to a prediction will account for approximately 5% of the entire c-Si (monocrystalline silicon) market by 2020, and for approximately 10% by 2030.

However, other cellular concepts can achieve greater economic prominence, such as, for example, an IBC (interdigitated back contact) solar cell, a WT (wrap through) solar cell, an (aluminum) BSF (back surface field) solar cell, a PERC (passivated emitter and rear cell) solar cell, a PERL (passivated emitter rear locally diffused) solar cell, or a PERT (passivated emitter rear totally diffused) solar cell. However, these cellular concepts require only one-sided processing of substrates, for example of the wafers.

According to various embodiments, a processing assembly for processing c-Si substrates is provided. For example, the processing assembly can have a material vapor source, for example a material vapor source for PVD (physical vapor deposition). processing of the reverse side of the substrate (or of the reverse side of the cell, respectively) can be performed by means of the processing assembly for said cellular concepts, for example, for example in order to form metallizing, for example PVD metallizing, on the reverse side of the substrate.

According to various embodiments, a processing assembly is provided (for example a vacuum system) which is adapted for treating (processing) a substrate stack (for example a pair of substrates) in a double-sided manner, having wafers or small-area substrates for example, without any additional mechanical handling, such as turning over the substrates, for example, and/or without requiring a break in the vacuum. The substrate holding device employed herein (also referred to as the carrier or the tray) can have a plurality of cavities, a plurality of upper masks, and a plurality of lower masks, of which a respective upper mask and in each case a lower mask form a holding-frame pair which is disposed in a cavity of the plurality of cavities of the carrier and holds a substrate stack (for example a pair of substrates).

As opposed to conventional coatings, for example metallizing using pastes, according to various embodiments, a coating (and a method for producing the coating) is provided, for example PVD metallizing (that is to say metallizing that is formed using PVD), for example for producing reverse-side metal plated solar cells, which has at least one of the following properties:

1.) lower (for example chemical) corrosiveness in relation to surfaces, layers, and/or layer systems lying therebelow;
2.) lower contact resistance in relation to surfaces, layers, and/or layer systems lying therebelow (also referred to as R serial or serial resistance);
3.) lower resistance along the layer plane (also referred to as lateral resistance, or R shunt), for example since the coating is configured purer and with lower porosity;
4.) less thermal stress, for example in relation to a maximum temperature that arises and the dwell time at the latter;
5.) lower energy costs;
6.) less impairment in terms of the cell efficiency.

For example, according to various embodiments, higher cell efficiency can be achieved, for example when using PVD.

Further advantages in terms of costs arise when PVD is combined with a galvanic technology (plating). Herein a seed layer (also referred to as the seed layer) is deposited by way of PVD, said seed layer then by way of galvanic technology being reinforced to a predefined, for example optimum, layer thickness. The seed layer in conjunction with galvanic technology can also be used in other semiconductor technologies.

According to various embodiments, vacuum-based processing technologies in the field of c-Si substrates can be economically employed. For example, a cost-effective PVD method can be provided in order for c-Si substrates (for example c-Si wafers) to be coated. According to various embodiments, a seed layer can be deposited for less than approximately 4 cents in processing costs per substrate (for example per wafer), for example when using a substrate holding device as described herein.

In terms of a potential power output of the solar cells produced (for example approximately 5.3 Watts per substrate), this corresponds to approximately 0.76 cents in processing costs per Watt peak (electrical output of the solar cells produced). Processing costs of less than 2.7 cents per Watt peak for forming reverse-side metallizing (for example from aluminum) can be considered as economical.

According to various embodiments, the overall operating costs are reduced. A number of substrates that is as high as possible can illustratively be processed at a system length that is as short as possible and has a minimized periphery. On account thereof, a system utilization that is as high as possible can be achieved.

According to various embodiments, a substrate holding device and a method for maximum system utilization are provided which is adapted in such a manner that the maximum number of substrates (for example wafers) per method cycle can be respectively processed on a side. For example, using a PVD material source (sputtering system), a plurality of processing steps can be implemented, for example having a horizontally aligned substrate holding device (up and down configuration) or else a vertically aligned substrate holding device (right/left configuration).

For example, a substrate holding device according to various embodiments can enable a substrate load factor of approximately 108 substrates. For example, a processing assembly according to various embodiments can enable a throughput of approximately 9000 substrates per hour, this corresponding to approximately $72 \cdot 10^6$ substrates per year, or at 5.3 W peak per substrate, respectively, corresponding to approximately 381.6 MW peak per year.

The substrate holding device that is transported horizontally (or vertically) aligned can receive two substrates per substrate receiving cavity (can also be referred to as the substrate supporting). The first substrate can be processed on a side, for example from below, by way of a PVD material source, while the second substrate can be processed on a side, for example from above, by way of another PVD material source. This can be performed simultaneously or sequentially.

In order to be suctioned by vacuum technology, or for the purpose of gas desorption, the substrate holding device can have mechanical ducts which are PVD capable, for example, and which illustratively do not clog when being coated, or can be cleaned ex-situ, respectively. Part of the substrate holding device can but does not have to be integrated in the carrier plate in a monolithic manner. A carrier plate and a (for example multi-part) substrate holding device can be modular. A holding frame (or an intermediate formation), for example the upper frame, can be adapted between the two substrates in such a manner that processing (or influencing) that goes peripherally beyond the substrate edges (in the peripheral region) can be prevented or minimized, respectively. This holding frame can optionally be adapted in such a manner that said holding frame is used as additional heat sink. In this case, this holding frame can be thermally coupled to the first substrate and/or to the second substrate, and this holding frame can optionally be thermally coupled to the carrier plate. In order for the required thermal coupling to be achieved, the contact faces between this holding frame and the first substrate and/or the second substrate, or optionally the carrier plate, respectively, can be adapted correspondingly larger.

The substrate holding device can optionally have a cassette which enables at least one cassette (for example two cassettes) having at least one substrate placed therein (for example two substrates placed therein) to be inserted into the carrier plate per cavity.

According to various embodiments, the two substrates can be held exclusively by purely mechanical resting or clamping. In the case of a for example horizontal passage of the carrier plate, for example in the case of coating a substrate having a processing face that points downward (on the second side thereof), peripheral portions, which intentionally or unintentionally remain non-processed, arise for example in the PVD coating on account of the supporting surface.

A covering frame can be placed on or integrated in substrates, respectively, in order for non-processed peripheral portions to be implemented, or as an anti-release safeguard.

Figure 8A:
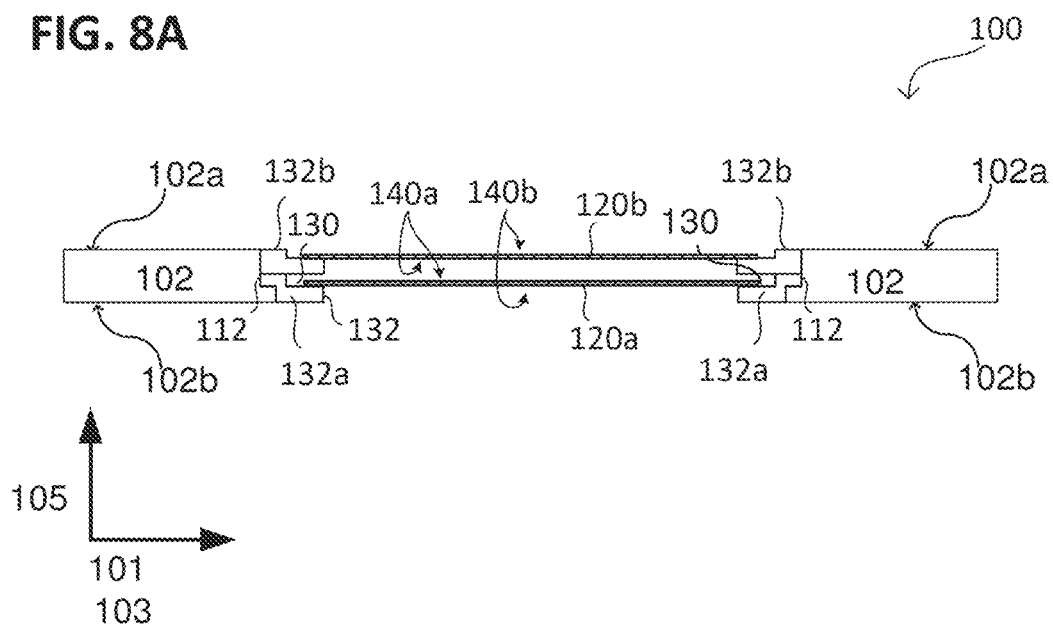
FIG. 8A and FIG. 8B show a respective substrate holding device according to various embodiments, in a schematic cross-sectional view.

FIG. 8A visualizes a substrate holding device 100 in a schematic cross-sectional view according to various embodiments, sectioned transversely to a transportation direction and/or sectioned transversely to a carrier plate face, for example). The substrate holding device 100 can have a carrier plate 102. The carrier plate 102 can have at least one cavity 112, for example in such a manner that a lower frame 132*a* (a first holding frame 132*a*) and an upper frame 132*b* (a second holding frame 132*b*) can be received or at least partially received in the cavity 112, in order for a first substrate 120*a* to be held between the two holding frames 132*a*, 132*b* in the cavity 112, and in order for a second substrate 120*b* to be held on the upper frame 132*b* (or above the first substrate 120*a*, respectively) in the cavity 112.

According to various embodiments, the carrier plate 102 in terms of the dimensions can be adapted to both the quantity and size of the substrates 120*a*, 120*b* to be received, as well as to the size (for example the coating width and/or length of the lock) of the processing assembly that is used for treating the substrates 120*a*, 120*b* (cf. FIG. 11A to FIG. 11C). For example, the carrier plate 102 (also referred to as the basic carrier 102) can position and/or hold a plurality of substrate stacks 120*a*, 120*b*, for example wafer stacks, for PVD coating.

Furthermore, the substrate holding device 100 can have a first holding frame 132*a* that is inserted into the cavity 112, and a second holding frame 132*b* that is inserted into the cavity 112. The first holding frame 132*a* can at least partially rest on the carrier plate 102 (for example on the supporting surface thereof). The second holding frame 132*b* can at least partially rest on the first holding frame 132*a* (for example on the upper side thereof). The two holding frames 132*a*, 132*b* (holding-frame pair 132*a*, 132*b*) can be adapted in such a manner that a receiving space 130 (for example a gap 130) for receiving a peripheral portion of the first substrate 120*a* is provided between the two holding frames 132*a*, 132*b*.

The two holding frames 132*a*, 132*b* can illustratively be provided in such a manner that the two substrates 120*a*, 120*b* that are inserted thereinto, that is to say that the mutually facing sides 140*a* thereof (that is to say the first side 140*a* of the first substrate 120*a* and the first side 140*a* of the second substrate 120*b*), at least partially cover or shield (mask) one another.

According to various embodiments, the two holding frames 132*a*, 132*b* can be adapted in such a manner that the second side 140*b* of the first substrate 120*a* (illustratively the lower side 140*b* thereof) is at least partially exposed, and the second side 140*b* of the second substrate 120*b* (illustratively the upper side 140*b* thereof) is at least partially exposed. In other words, those sides 140*b* of the substrates 120*a*, 120*b* (that is to say of the substrate stack) that face away from one another can at least be partially exposed.

The two holding frames 132*a*, 132*b* can illustratively be provided in such a manner that said two holding frames 132*a*, 132*b* cover or shield (mask) at least one peripheral portion of a first substrate 120*a* that is positioned between the two holding frames 132*a*, 132*b*.

The first substrate 120*a* can be a wafer, for example, a semiconductor wafer, for example, a silicon wafer, for example, in the substrate holding device 100. For example, the first substrate 120*a* can rest on the first holding frame 132*a*, for example the first substrate 120*a* by way of the peripheral region of the first substrate 120*a* can rest on the first holding frame 132*a* along the entire circumference. Alternatively, the first substrate 120*a* can also rest on the first holding frame 132*a* only partially in the peripheral region of the first substrate 120*a* (for example in the case of an angular substrate by way of the corners, respectively). The first holding frame 132*a* can have a level (or planar, respectively) supporting surface for placing the first substrate 120*a*. In other words, the first holding frame 132*a* can provide a supporting surface for placing the first substrate 120*a*.

The second substrate 120b can be a wafer, for example, a semiconductor wafer, for example, a silicon wafer, for example. For example, the second substrate 120b can rest on the second holding frame 132b, for example the second substrate 120b by way of the peripheral region of the second substrate 120b can rest on the second holding frame 132b along the entire circumference. Alternatively, the second substrate 120b can also rest on the second holding frame 132b only partially in the peripheral region of the second substrate 120b (for example in the case of an angular substrate by way of the corners, respectively). The second holding frame 132b can have a level (or planar, respectively) supporting surface for placing the second substrate 120b. In other words, the second holding frame 132b can provide a supporting surface for placing the second substrate 120b. The peripheral portion of the first substrate 120a can be in contact with the supporting surface of the first holding frame 132a, for example. The peripheral portion of the first substrate 120a cannot be conjointly coated in this case during coating. In an analogous manner, a peripheral portion of the second substrate 120b can be in contact with the supporting surface of the second holding frame 132b.

Various modifications and configurations of the substrate holding device 100 and detail pertaining to the cavity 112 and to the holding frames 132a, 132b will be described hereunder, wherein the fundamental features and operating modes that have been described in the context of FIG. 8A can be included in an analogous manner. Furthermore, the features and operating modes that are described hereunder can be applied in an analogous manner to the substrate holding device 100 that is described in FIG. 8A, or combined with the substrate holding device 100 that is described in FIG. 8A.

According to various embodiments, the gap 130 (also referred to as the receiving space for receiving the first substrate 120a) between the two holding frames 132a, 132b can have a gap height which can be adapted to the thickness of the first substrate 120a to be received, for example having a gap height (along the direction 105) in a range from approximately 0.1 mm to approximately 1.5 cm, or having a gap height of less than 1 cm, 0.5 cm, 1 mm, 500 µm, 300 µm, or 200 µm. The gap 130 toward the bottom (along the direction 105) can be delimited by the supporting surface of the first holding frame 132a.

A narrow gap, for example having a gap height (along the direction 105) for example in a range from approximately 0.1 mm to approximately 5 mm, or having a gap height of less than 1 mm, 500 µm, 400 µm, 300 µm, 200 µm, or 100 µm, for example having a gap height according to the recess, can thus remain between the second holding frame 132b and the first substrate 120a. In this case, a minor production tolerance for the holding frames 132a, 132b of the substrate holding device 100 is thus also required for example. The substrate holding device 100 can be adapted in such a manner that substrates 120a, 120b of arbitrary thickness, such as of a thickness in a range from approximately 0.1 mm to approximately 1 cm can be received in the cavity 112. The substrates 120a, 120b can be plate-shaped, for example.

For example, the supporting surface of the first holding frame 132a (and/or the gap 130) can be provided by means of the recess in the first holding frame 132a (on the upper side thereof, for example). In other words, the supporting surface can be sunk, for example in relation to the upper side thereof. The recess can have a lateral extent that is larger than that of the first substrate 120a (substrate diameter or substrate width), and/or a depth (that is to say an extent into the first holding frame 132a) that is larger than a substrate thickness of the first substrate 120a. The recess can have a depth in a range from approximately 0.1 mm to approximately 5 mm, or of less than 1 mm, 500 µm, 400 µm, 300 µm, 200 µm, or 100 µm. In other words, the gap 130 that is provided between the two holding frames 132a, 132b can be adapted to the width (for example the diameter or the lateral extent) of the first substrate 120a (in the direction 103). The two holding frames 132a, 132b and the cavity 112 can illustratively be adapted in such a manner that the first substrate 120a is laterally exposed, that it to say in other words that the first substrate 120a does not laterally abut the first holding frame 132a and the second holding frame 132b. The recess toward the bottom (along the direction 105) can be delimited by the supporting surface of the first holding frame 132a.

The supporting surface of the second holding frame 132b can optionally be provided by means of a recess in the second holding frame 132b (for example on the upper side 102a thereof). In other words, the supporting surface can be sunk, for example in relation to the upper side thereof. The recess can have a lateral extent that is larger than that of the second substrate 120b (substrate diameter or substrate width), and/or a depth (that is to say an extent into the second holding frame 132b) that is larger than a substrate thickness of the second substrate 120b. The recess can have a depth in a range from approximately 0.1 mm to approximately 5 mm, or of less than 1 mm, 500 µm, 400 µm, 300 µm, 200 µm, or 100 µm. In other words, the recess can be adapted to the width (for example the diameter or the lateral extent) of the second substrate 120b (in the direction 103). The second holding frame 132b and the cavity 112 can illustratively be adapted in such a manner that the second substrate 120b is laterally exposed, that it so say in other words that the second substrate 120b does not laterally abut the second holding frame 132a. The recess toward the bottom (along the direction 105) can be delimited by the supporting surface of the first holding frame 132a.

In this context, the substrate holding device 100 can be provided in such a manner that dissimilar holding frames 132a, 132b can be used for substrates 120a, 120b of dissimilar substrate thicknesses. Furthermore, the substrate holding device 100 can be provided in such a manner that dissimilar holding frames 132a, 132b can be used for substrates 120a, 120b having dissimilar substrate diameters or substrate widths.

The carrier plate 102 can have an upper side 102a (an upper surface, respectively) and a lower side 102b (a lower surface, respectively). The two surfaces 102a, 102b can be plane-parallel to each other (at least partially for example). The carrier plate 102 along the direction 105 (perpendicular to the two surfaces 102a, 102b) have a thickness in a range from approximately 1 mm to approximately 20 mm, for example a thickness in a range from approximately 2 mm to approximately 10 mm.

According to various embodiments, the carrier plate 102 can include or be formed from at least one of the following: a metal, for example titanium, steel (for example stainless steel), a semimetal, for example carbon. Alternatively or additionally, the carrier plate 102 can include or be formed from a composite material. The upper side of the carrier plate and/or the lower side of the carrier plate can be configured planar (level), for example plane-parallel to each other. The upper side of the carrier plate and/or the lower side of the carrier plate can optionally be coated.

According to various embodiments, the carrier plate 102 along the direction 103 (along the carrier plate face, for example parallel with the two surfaces 102a, 102b) can have a width in a range from approximately 10 cm to approximately 5 m, for example a width in a range from approximately 1 m to approximately 3 m. Furthermore, the carrier plate 102 (along the carrier plate face, for example parallel with the two surfaces 102*a*, 102*b*), transverse to the width direction 103, can have a length in a range from approximately 10 cm to approximately 5 m, for example a length in a range from approximately 0.1 m to approximately 2 m. The carrier plate 102 can be transported along the length thereof, for example.

As is visualized in FIG. 8A, for example, the second holding frame 132*b*, or the upper side thereof, respectively, can be provided so as to be flush with the upper side 102*a* of the carrier plate 102, for example, that is to say so as to illustratively terminate conjointly with said upper side 102*a*. The first holding frame 132*a*, or the lower side thereof, respectively, can be provided so as to be flush with the lower side 102*b* of the carrier plate 102, that is to say so as to illustratively terminate conjointly with said lower side 102*b*.

A lower substrate can illustratively rest on a lower holding frame (also referred to as the lower frame), and an upper substrate can rest on an upper holding frame (also referred to as the upper frame), wherein the lower frame and the upper frame are disposed on top of one another. For example, the lower substrate cannot be in direct physical contact with the upper frame (that is to say rest on the lower frame at a spacing from the upper frame). The substrate holding device herein can be adapted in such a manner that the upper frame and/or the lower frame are centered in the carrier plate when being inserted into the respective cavity of the carrier plate, and assume a predefined position and/or alignment (in mutual terms or relative to the carrier plate). The upper frame and/or the lower frame herein can be connected to the carrier plate in a monolithic manner. In other words, at least one of the two frames can be configured as part of the carrier plate. Alternatively, the upper frame and/or the lower frame can be inserted into the respective cavity of the carrier plate.

FIG. 8A visualizes the substrate holding device 100 in a method according to various embodiments.

According to various embodiments, the method can include the following steps: inserting a first holding frame 132*a* for holding a first substrate 120*a* into a cavity 112 in a carrier plate 102, wherein the first holding frame 132*a* has a (for example planar) supporting surface for placing the first substrate 120*a*; inserting the first substrate 120*a* into the cavity 112 onto the planar supporting surface of the first holding frame 132*a*; inserting a second holding frame 132*b* for holding a second substrate 120*b* into the cavity 112 in the carrier plate 102, wherein the second holding frame 132*b* has a (for example planar) supporting surface for placing the second substrate 120*b*; inserting the second substrate 120*b* into the cavity 112 onto the (for example planar) supporting surface of the second holding frame 132*b*. The first holding frame 132*a* and/or the second holding frame 132*b* can optionally be adapted in such a manner that the first substrate 120*a* is at least partially disposed between the two holding frames 132*a*, 132*b*. The first holding frame 132*a* and/or the second holding frame 132*b* can optionally be adapted in such a manner that a gap remains between the second holding frame 132*b* and the first substrate 120*a*. The first holding frame 132*a* and/or the second holding frame 132*b* can optionally be adapted in such a manner that the first substrate 120*a* rests only on the first holding frame 132*a*.

The inserting of the first holding frame 132*a* and/or of the second holding frame 132*b* can optionally be performed by means of a magnetic gripper or of a suction gripper (also referred to as the vacuum gripper). To this end, engagement faces to which the gripper can couple can be provided on the first holding frame 132*a* and/or the second holding frame 132*b*.

The first holding frame 132*a* can have a cavity 132 which penetrates the former and for example at least partially exposes the lower side of the first substrate 120*a*. The second holding frame 132*b* can optionally have a cavity which penetrates the former and for example at least partially exposes the lower side of the second substrate 120*b*. The first holding frame 132*a* and/or the second holding frame 132*b* can be configured as part of a cassette. The cassette can illustratively be configured to dispose the first substrate 120*a* and/or the second substrate 120*b* preconfigured, for example each already placed in a respective holding frame 132*a*, 132*b*, in the cavity 112, for example both substrates 120*a*, 120*b* conjointly (that is to say in pairs) and/or both holding frames 132*a*, 132*b* conjointly (that is to say in pairs).

Figure 8B:
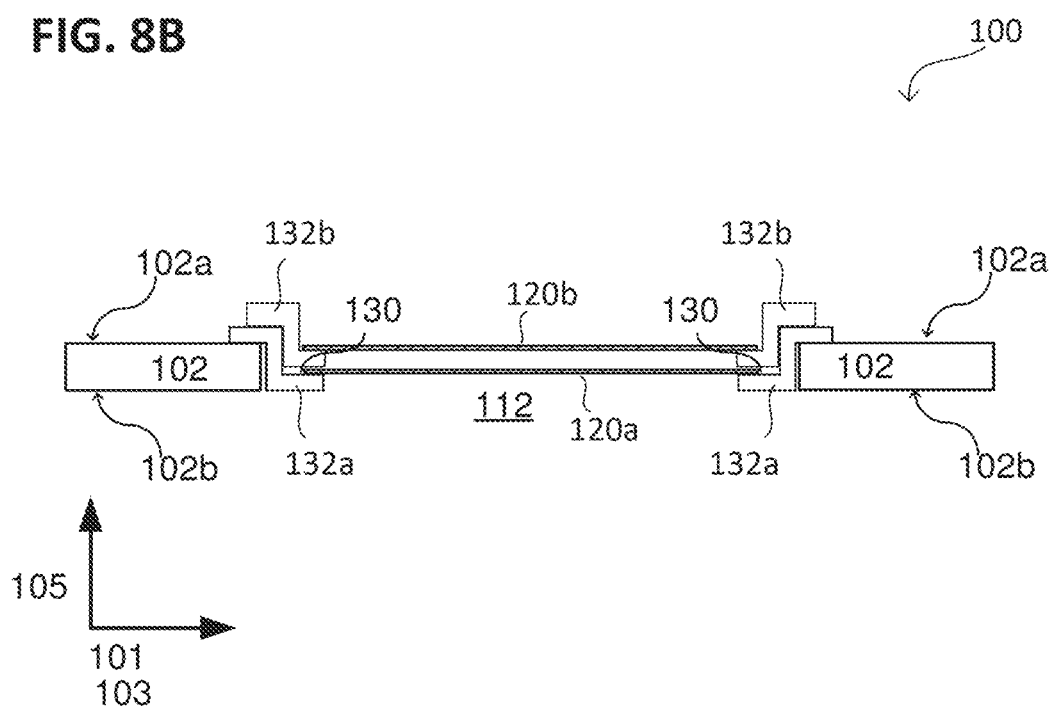

FIG. 8B visualizes a substrate holding device 100 according to various embodiments, in a schematic cross-sectional view (analogous to FIG. 8A).

As is visualized for example in FIG. 8B, the holding frames 132*a*, 132*b* can project beyond the upper side 102*a* (and/or the lower side 102*b*) of the carrier plate 102. Alternatively, for example a holding frame 132*a*, 132*b* can also be provided flush with the carrier plate 102, for example with the upper side 102*a* thereof and/or the lower side 102*b* thereof.

Furthermore, the substrate holding device 100 can have a first holding frame 132*a* that is inserted into the cavity 112 and at least partially rests on the carrier plate 102 (for example on the upper side 102*a* thereof). Furthermore, the substrate holding device 100 can have a second holding frame 132*b* that is inserted into the cavity 112 and at least partially rests on the first holding frame 132*a* (for example on the upper side thereof).

According to various embodiments, the second holding frame 132*b* can at least partially be placed in a recess in the first holding frame 132*a*, for example so as to match in a form-fitting manner, that is to say plug-fitted. A position of the two holding frames 132*a*, 132*b* relative to each other can be defined on account thereof.

According to various embodiments, the two holding frames (that is to say the upper frame 132*b* and the lower frame 132*a*) upon having been inserted into the cavity 112 of the carrier plate 102, or upon having been placed thereon, can be held in a centered manner in the cavity 112, for example by means of a centering structure that matches in pairs.

Figure 9A:
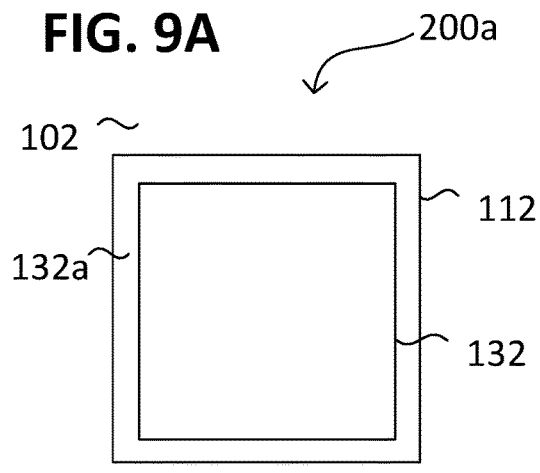
FIG. 9A shows a substrate holding device according to various embodiments, in a schematic cross-sectional view or a schematic plan view.

FIG. 9A visualizes a substrate holding device 200*a* according to various embodiments, in a schematic cross-sectional view (for example sectioned along a transportation direction and/or sectioned along in relation to a carrier plate face) or a schematic plan view (viewed in the direction transverse to a transportation direction and/or transverse to a carrier plate face).

As is visualized in FIG. 9A, the first holding frame 132*a* can be disposed in the cavity 112. The first holding frame 132*a* can have a cavity 132 which penetrates the former. As is visualized in FIG. 9A, the cavity 112 and/or the cavity 132 can be substantially rectangular-box shaped.

The first holding frame 132*a* and/or the second holding frame 132*b*, in a manner so as to match the cavity 112 of the carrier plate 102, can optionally have a substantially rectangular-box shaped external contour having four corner regions. The first holding frame 132*a* and the second holding frame 132b in the four corner regions can optionally each have centering structures that mutually match in pairs.

Figure 9B:
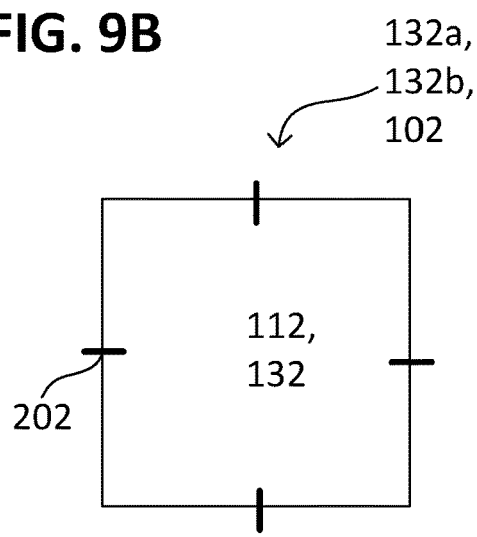
FIG. 9B to FIG. 9F show a respective first holding frame, a second holding frame, and/or the carrier plate according to various embodiments, in a schematic cross-sectional view or a schematic plan view.
Figure 9C:
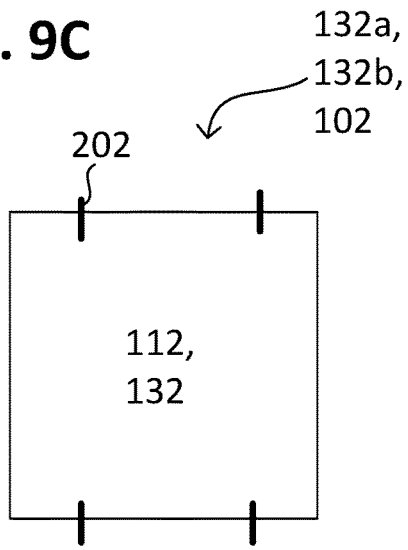
Figure 9D:
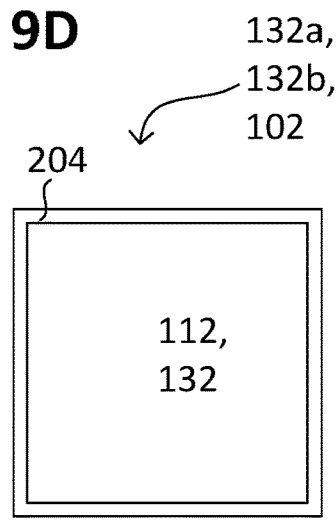
Figure 9E:
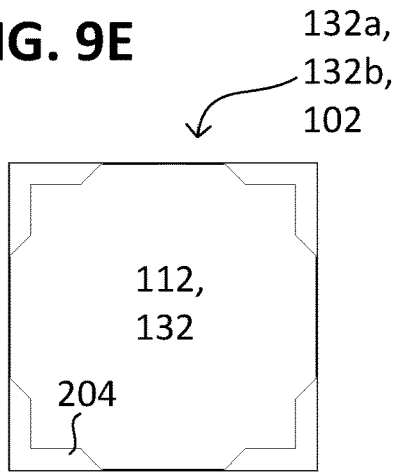
Figure 9F:
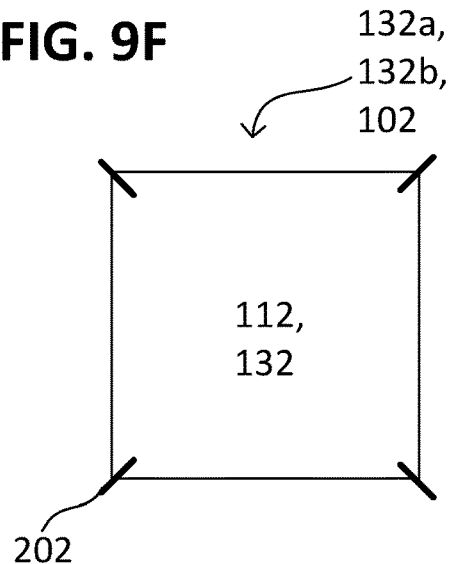

According to various embodiments, the first holding frame 132a can rest only on the supporting surface of the carrier plate 102, for example only in corner regions of the cavity 112 (cf. FIG. 9E and FIG. 9F), only in the edge regions of the cavity 112 (cf. FIG. 9B and FIG. 9C), or alternatively in the corner regions and the edge regions of the cavity 112 (cf. FIG. 9D).

This can enable better stability of the two holding frames 132a, 132b in the cavity 112, for example when the carrier plate 102 flexes (for example along the width of the carrier plate 102).

In an analogous manner, the first substrate 120a can rest only on the supporting surface of the first holding frame 132a, for example only in the corner regions of the cavity 132 (cf. FIG. 9E and FIG. 9F), only in the edge regions of the cavity 132 (cf. FIG. 9B and FIG. 9C), or alternatively in the corner regions and the edge regions of the cavity 132 (cf. FIG. 9D).

If the second holding frame 132b has a cavity the latter can be formed in a manner analogous to that of the cavity 132. In this case, the second substrate 120b can rest only on the supporting surface of the second holding frame 132b, for example only in the corner regions of the cavity of the second holding frame 132b (cf. FIG. 9E and FIG. 9F), only in the edge regions of the cavity of the second holding frame 132b (cf. FIG. 9B and FIG. 9C), or alternatively in the corner regions of the cavity of the second holding frame 132b and in the corner regions of the cavity of the second holding frame 132b (cf. FIG. 9D).

When viewed from the direction 105, the cavity 112 in the carrier plate 102 and/or the clearing 132 in a holding frame 132a, 132b can be circular, square (cf. FIG. 9A to FIG. 9E) or arbitrarily polygonal. The shape of the cavity 112 in the carrier plate 102 and/or the cavity 132 in a holding frame can be adapted to the external contour of the substrates 120a, 120b to be received; for example, the cavity 112 in the carrier plate 102 and/or the cavity 132 in a holding frame can be substantially circular for receiving circular wafers, or square (having rounded or cut-off corners, for example) for receiving square wafers (having rounded or cut-off corners, for example).

FIG. 9B to FIG. 9F visualize the first holding frame 132a and/or the second holding frame 132b, respectively, according to various embodiments, and/or a carrier plate 102 according to various embodiments, in a schematic cross-sectional view or a schematic plan view in a manner analogous to that of FIG. 9A. The cavity 112 in the carrier plate 102 and/or the cavity 132 in a holding frame are/is illustratively visualized in FIG. 9B to FIG. 9F, said cavity(s) extending through the holding frame, for example in the first holding frame 132a, the second holding frame 132b, or the third holding frame 132c.

As is visualized in FIG. 9B to FIG. 9F, the cavity 112, 132 can be substantially rectangular-box shaped. As is visualized in FIG. 9B, the cavity 112, 132 can have four edge regions in which a supporting surface is formed. The supporting surface can be formed by means of protrusions 202, for example. As is visualized in FIG. 9C, the cavity 112, 132 can have two mutually opposite edge regions in which a supporting surface is formed. The supporting surface can be formed by means of protrusions 202, for example. As is visualized in FIG. 9D, the cavity 112, 132 can have four corner regions in which a supporting surface is formed. The supporting surface can be formed by means of a fold 204 which at least partially encircles the cavity 112, 132, for example. As is visualized in FIG. 9E, the cavity 112, 132 can have four corner regions in which a supporting surface is formed. The supporting surface can be formed by means of a fold 204 which is interrupted in each of the corner regions, for example. As is visualized in FIG. 9F, the cavity 112, 132 can have four corner regions in which a supporting surface is formed. The supporting surface can be formed by means of protrusions 202, for example.

Figure 10A:
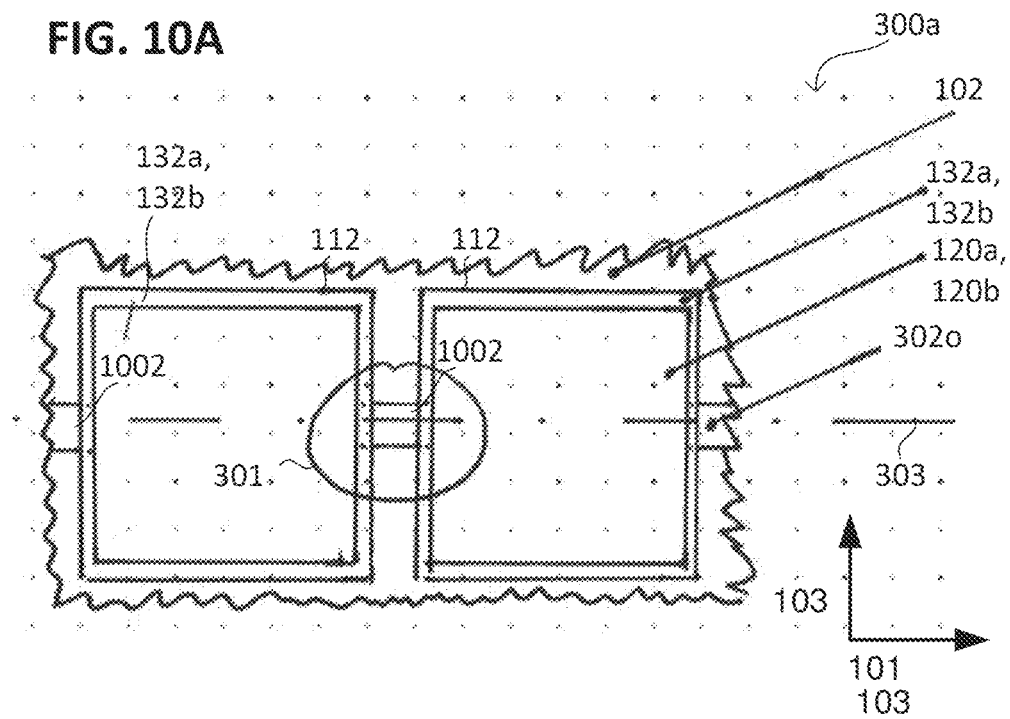
FIG. 10A shows a substrate holding device according to various embodiments, in a schematic cross-sectional view or a schematic plan view.

FIG. 10A visualizes a substrate holding device 300a according to various embodiments, in a schematic cross-sectional view (for example sectioned along the carrier plate face) or a schematic plan view.

According to various embodiments, the substrate holding device 300a can have the following: a carrier plate 102 (also referred to as the carrier or the tray) having a plurality of cavities 112 that are disposed beside one another (for example along the width and/or a length of the carrier plate 102), wherein each of the cavities 112 is adapted for receiving a first holding frame 132a and a second holding frame 132b, and extends from an upper side 102a of the carrier plate 102 through the carrier plate 102 to a lower side 102b of the carrier plate 102.

The substrate holding device 300a can have a plurality of first holding frames 132a, and a plurality of second holding frames 132b, wherein a first holding frame of the plurality of first holding frames 132a, and a second holding frame of the plurality of second holding frames 132b, respectively, form a holding-frame pair which for holding a substrate stack 120a, 120b is disposed in a cavity 112 of the plurality of cavities 112 of the carrier plate 102.

According to various embodiments, the carrier plate 102 can have a vent opening in the form of a duct 302o (also referred to as the suction duct or the intermediate suction feature). The duct 302o can be disposed between two cavities of the plurality of cavities 112, for example. The duct 302o can connect a cavity (for example a first cavity) of the plurality of cavities 112 to an upper side of the carrier plate 102 and/or to a lower side of the the carrier plate 102. The duct 302o can optionally connect the first cavity of the plurality of cavities 112 to a second cavity of the plurality of cavities 112. The duct 302o can illustratively be adapted for ventilating the cavity between the first duct and the second duct.

Figure 10B:
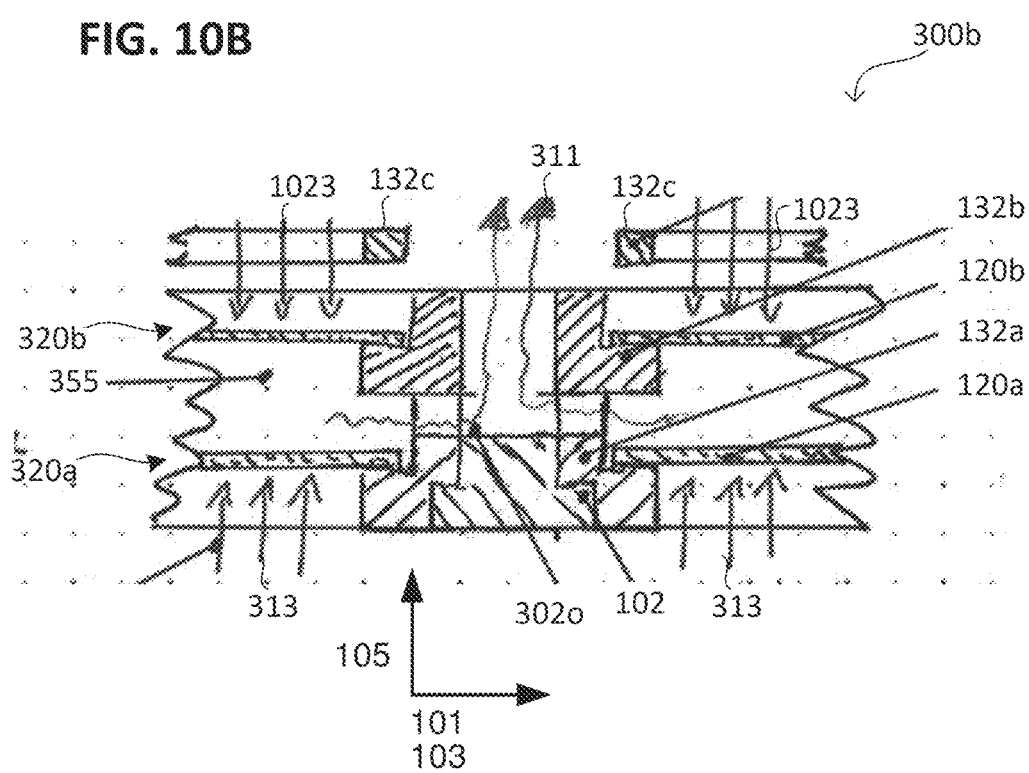
FIG. 10B shows a substrate holding device according to various embodiments, in a schematic cross-sectional view.

FIG. 10B visualizes a substrate holding device 300b according to various embodiments, in a schematic cross-sectional view, for example the substrate holding device 300a along a cross-sectional axis 303 (cf. FIG. 10A) in a detailed view 301.

According to various embodiments, the substrate holding device 300b can furthermore have a third holding frame 132c (second covering frame) for covering the second substrate 120b. For example, the third holding frame 132c can fit, for example be plug-fitable, into a cavity in the second holding frame 132b and/or into the cavity of the carrier plate 102.

A gap 355 (cavity 355) which is formed between the first substrate 120a and the second substrate 120b can be evacuated 311 through the duct 320o. The duct 302o can illustratively prevent the formation of a gas reservoir between the two substrates 120a, 120b.

FIG. 10B visualizes the substrate holding device 300b in a method according to various embodiments. The method can include the step of processing 313 (first processing 313), for example coating, the lower side of the first substrate 120a. The method can furthermore include the step of processing 323 (second processing 323), for example coating, the upper side of the second substrate 120b. The method can optionally include the step of evacuating 311 the gap which is formed between the first substrate 120a and the second substrate 120b. Evacuating 311 can be performed simultaneously with the first processing 313 and/or the second processing 323, for example.

A respective substrate stack 120a, 120b can be disposed in a plurality of cavities 112. The first (illustratively lower) substrates 120a of the substrate stacks 120a, 120b can form a first (illustratively lower) substrate tier 320a, respectively. The second (illustratively upper) substrates 120b of the substrate stacks 120a, 120b can form a second (illustratively upper) substrate tier 320b, respectively.

Referring to FIG. 4A, the cavity 112 in the carrier plate 102 can be substantially rectangular-box shaped, for example, and (when viewed from above, for example) can thus have four corner regions 412e and four edge regions 412i.

Alternatively, the cavity 112 in the carrier plate 102 can have any other suitable shape, for example adapted to the shape of the substrate 120 and/or to the shape of the two holding frames 132a, 132b.

Referring to FIG. 4B, a plurality of cavity 112, for example more than 10 cavity 112, for example more than 20 cavity 112, for example more than 50 cavity 112, for example more than 100 cavity 112, for holding a plurality of substrate stacks 120a, 120b can be provided beside one another in the carrier plate 102. The direction 105 herein can be transverse to a transportation direction along which the substrate holding device 400b can be transported in a processing assembly for processing the plurality of substrate stacks 120a, 120b.

According to various embodiments, a plurality of cavities 112 can be disposed beside one another (for example in a row) at least along the transportation direction (for example along the longitudinal direction 101 of the carrier plate 102). Alternatively or additionally, a plurality of cavities 112 can be disposed beside one another (for example in a row) at least transversely to the transportation direction (for example along the width direction 103 of the carrier plate 102). For example, the plurality of cavities 112 can be disposed in a (for example two-dimensional) grid.

FIG. 11A visualizes a processing assembly 500a according to various embodiments, in a schematic cross-sectional view (for example sectioned along a carrier plate face).

According to various embodiments, the processing assembly 500a can have a first processing device 510a and a second processing device 510b.

The first processing device 510a can be adapted for processing, for example for coating, for radiating, for etching, etc., at least the first substrate 120a, or the first substrate tier 320a, respectively. The second processing device 510b can be adapted for processing, for example for coating, for radiating, for etching, etc., at least the second substrate 120b, or the second substrate tier 320b, respectively, for example in a manner identical or dissimilar to that of the first processing device 510a.

The first processing device 510a and/or the second processing device 510b for coating can include or be formed from at least one of the following: a physical material vapor source (for coating by means of physical vapor deposition), such as, for example, a magnetron (also referred to as the sputtering source, optionally in conjunction with a reactive gas source for reactive sputtering), a laser beam evaporator, an arc evaporator, an electron beam evaporator, and/or a thermal evaporator; or have a chemical material vapor source (for coating by means of chemical vapor deposition), such as, for example, a reaction gas source, optionally in conjunction with a plasma source (for coating by means of plasma-supported chemical vapor deposition).

Alternatively or additionally, the first processing device 510a and/or the second processing device 510b for subtracting material can include or be formed from at least one of the following: a plasma source, an ion beam source, or an etching-gas source. Alternatively or additionally, the first processing device 510a and/or the second processing device 510b for radiating can include or be formed from at least one of the following: an ion beam source, an electron beam source, or a light source (for example flash bulbs and/or lasers).

As is visualized in FIG. 11A, the first processing device 510a and the second processing device 510b can be disposed in such a manner that said processing devices 510a, 510b process the same substrate stack 120a, 120b. In this instance, the processing regions of said processing devices 510a, 510b can at least partially mutually overlap. For example, the first processing device 510a and the second processing device 510b can be disposed on top of one another.

FIG. 11B visualizes a processing assembly 500b according to various embodiments, in a schematic view analogous to that of the processing assembly 500a.

As is visualized in FIG. 11B, the first processing device 510a and the second processing device 510b can be disposed in such a manner that said processing devices 510a, 510b process different substrate stacks 120a, 120b. In this instance, the processing regions of said processing devices 510a, 510b can be spaced apart from each other. For example, the first processing device 510a and the second processing device 510b can be disposed offset from each other, for example along the transportation direction and/or transversely to the transportation direction.

FIG. 11A and FIG. 11B each visualize the processing assembly 500a, 500b in a method according to various embodiments. The method can include the step of processing the lower side of the first substrate 120a (or the lower side of the first substrate tier 320a, respectively). The processing of the lower side of the first substrate 120a can include or be formed by at least one of the following steps: coating, radiating, subtracting, cleaning, heating, converting (for example chemically and/or structurally), doping (for example chemically), polishing.

Alternatively or additionally, the method can include the step of processing the upper side of the second substrate 120a (or the upper side of the second substrate tier 320b, respectively). The processing of the upper side of the second substrate 120b can include or be formed by at least one of the following steps: coating, radiating, subtracting, cleaning, heating, converting (for example chemically and/or structurally), doping (for example chemically), polishing.

The processing of the lower side of the first substrate 120a can be identical to the processing of the upper side of the second substrate 120b. Alternatively, the processing of the lower side of the first substrate 120a can be dissimilar to the processing of the upper side of the second substrate 120b.

For example, a first (for example upper) substrate tier can be cleaned in a first method cycle, while a second (for example lower) substrate tier is coated in the first method cycle. The second substrate tier, upon coating thereof, can be exchanged for a third substrate tier, such that the first substrate tier which has been cleaned can be coated in a second method cycle, and the third substrate tier can be cleaned in the second method cycle. A dual-stage process can thus be continued in a seamless manner, without a processing system having to be retooled. This enables the space requirement of a processing system to be reduced, and thus fixed costs and operating costs to be minimized.

Of course, single-stage processes can also be performed, for example without a substrate tier passing twice through the processing system. For example, the substrate on the top (the upper substrate tier, respectively) can be coated with a first coating material, and the substrate on the bottom (the lower substrate tier, respectively) can be coated with a second coating material (for example with the first coating material or another coating material).

FIG. 11C visualizes a processing assembly 500c according to various embodiments, in a manner analogous to that of the processing assembly 500a.

According to various embodiments, a processing assembly can have the following: a processing chamber 512 for processing 313, 323 (processing) a plurality of substrate stacks 120a, 120b on both sides; and a transportation device 522 for transporting and/or positioning the plurality of substrate stacks 120a, 120b in a processing region 520 of a processing device 510a, 510b (only one processing region being illustrated in an exemplary manner here).

The transportation device 522 can have a plurality of transportation rollers, for example, the external circumference of said transportation rollers defining a transportation face along which a substrate holding device according to various embodiments can be transported. The transportation face can extend in a planar manner at least partially (in this instance also referred to as the transportation plane), and/or extend in a curved manner at least partially. In order for the carrier plate 102 to be transported through the processing chamber 512, unilaterally supported transportation rollers which are disposed on opposite sides of the carrier plate 102 and hold the latter (such that a processing device can be disposed therebetween, for example) can be used for example. Furthermore, the carrier plate 102 can also be inserted into a further carrier, or be transported by means of a further carrier.

The processing chamber 512 can be adapted and/or operated as a vacuum chamber or as an atmospheric pressure chamber or as a positive pressure chamber. The processing chamber 512 can be adapted in such a manner that a processing environment (including a process pressure, a process gas composition, a process temperature, etc.) can be set and/or regulated therein. For example, the processing chamber 512 can be adapted stable in terms of pressure (for example up to a pressure differential of at least 1 bar), gastight, and/or dust-tight. The processing of the first substrate 120a and/or of the second substrate 120b can be performed at a positive pressure (of more than 1 bar), at atmospheric pressure of approximately 1 bar, at negative pressure (of less than 1 bar), or at a vacuum (of less than 0.3 bar), for example a fine vacuum (of less than 1 mbar), for example at a high vacuum (of less than $10^{-3}$ bar), for example an ultra-high vacuum (of less than $10^{-7}$ bar). In order for the process gas composition to be set and/or regulated, a gas including at least one reactive gas and/or an operating gas can be fed to the interior of the processing chamber 512, for example by means of a gas infeed. In order for the process pressure to be set and/or regulated, the processing chamber 512 can be coupled to a pump assembly having at least one booster pump and/or a vacuum pump which evacuate(s) the interior of the processing chamber 512. In order for the process temperature to be set and/or regulated, the processing assembly 500c can have heating devices and/or cooling devices which can supply thermal energy to the interior of the processing chamber 512 or at least to the substrate stack 120a, 120b transported therein (for heating), or extract thermal energy therefrom (for cooling).

For example, the first substrate 120a and/or the second substrate 120b can be coated with at least one of the following: a functional layer, an anti-corrosion layer, an optically active layer, a protective layer, an electrically conductive layer, an electrically isolating layer, a sealing, a seed layer, a surface finish. For example, a functional layer can be applied to a foil or hard metal (for example in battery technology). For example, a metal coating and/or a coating from dielectric material can be applied to glass (for example for spectacles, windows, mobile phones, and/or architectural glass). For example, an electrically conductive protective layer, a functional layer, or an anti-corrosion layer can be applied to a metal foil (for example in fuel cell technology). For example, a seed layer can be applied to a wafer (for example in semiconductor technology). The seed layer can include or be formed from nickel (Ni) and/or copper (Cu) for example. The seed layer can subsequently be further galvanically coated, for example in order for metal layers to be formed.

Figure 12A:
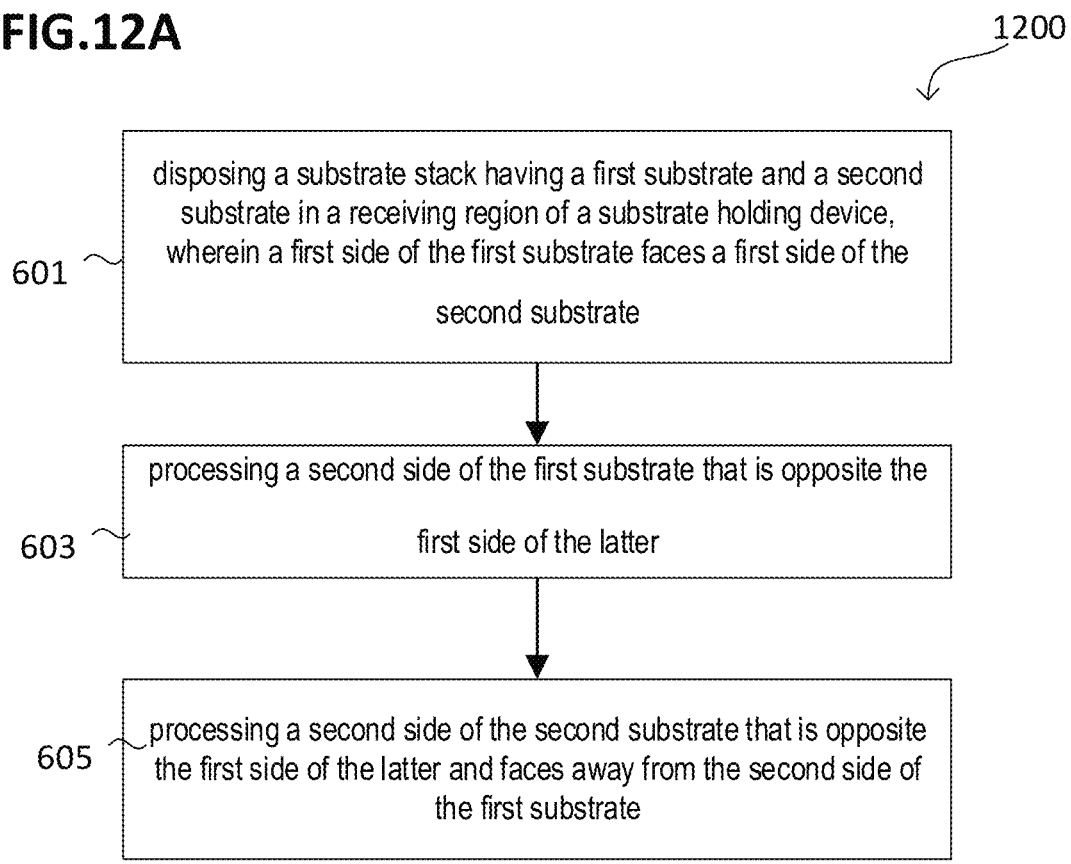
FIG. 12A shows a method according to various embodiments, in a schematic flow diagram.

FIG. 12A visualizes a method 1200 according to various embodiments, in a schematic flow diagram.

The method 1200 in step 601 can include: disposing a substrate stack having a first substrate 120a and a second substrate 120b in a receiving region of a substrate holding device, wherein a first side of the first substrate faces a first side of the second substrate. An upper side of the second substrate 120b and a lower side of the first substrate 120a can illustratively be exposed for processing. The method 1200 in step 603 can furthermore include: processing a second side 140b of the first substrate 120a that is opposite the first side of the latter (cf. FIG. 12B). The method 1200 in step 605 can furthermore include: processing a second side 140b of the second substrate 120b that is opposite the first side of the latter and faces away from the second side 140b of the first substrate 120a (cf. FIG. 12B). In other words, the sides 140b of the substrate stack that face away from one another can be processed.

The inserting of the first substrate 120a and/or of the second substrate 120b can also be referred to as the loading procedure of the substrate holding device. The unloading procedure can be performed like the loading procedure, for example, but in the reverse order, wherein the first holding frame 132a can optionally, for example permanently, remain in the carrier plate 102, for example when the former is connected to the carrier plate 102, or else when the former is retrievable from the latter.

According to various embodiments, all components can be suitable for fully automatic loading and/or unloading of the substrates 120a, 120b and of the holding frames 132a, 132b. According to various embodiments, the loading of the substrate holding device with substrates 120a, 120b can be performed upon cleaning of all parts, for example upon cleaning by wet chemistry or upon dry-ice blasting.

According to various embodiments, the second holding frame 132b can be supported only by the first holding frame 132a. Optionally, the first holding frame 132a and/or the second holding frame 132b can rest loosely (for example in a laterally floating manner).

Figure 12B:
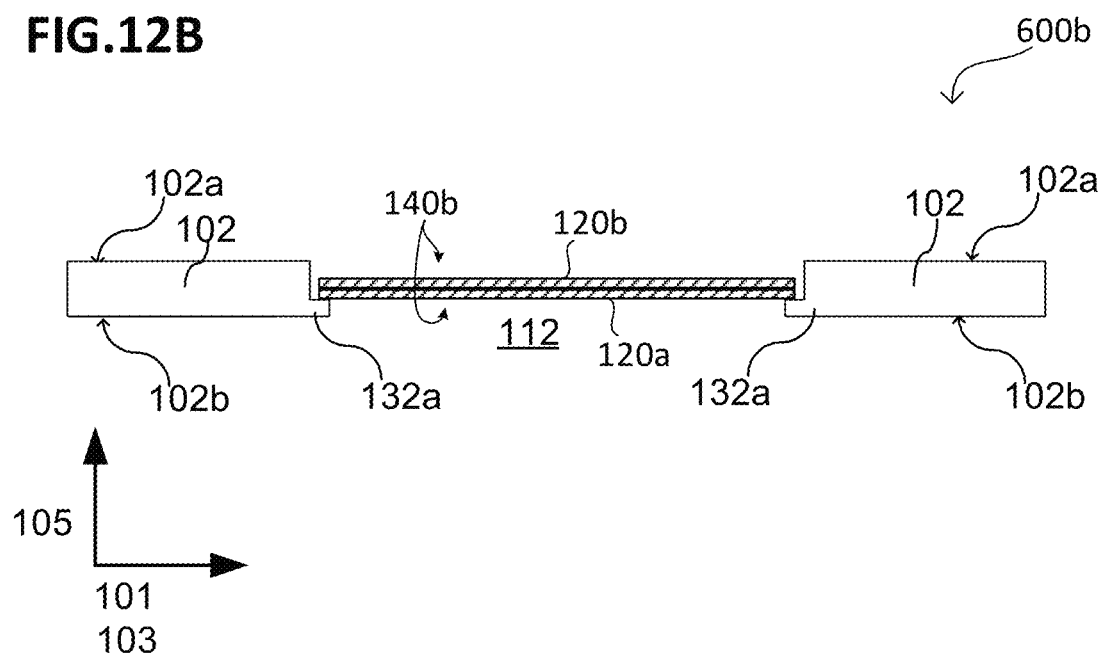
FIG. 12B shows a substrate holding device in a method according to various embodiments, in a schematic cross-sectional view or a schematic plan view.

FIG. 12B visualizes a substrate holding device 600b in a method (for example the method 1200) according to various embodiments, in a schematic cross-sectional view (analogous to that of FIG. 8A).

The second substrate 120b can be disposed on or above the first substrate 120a, for example conjointly with the latter in an exact fit in a substrate receiving cavity 112 of a carrier plate 102. The first substrate 120*a* can be inserted into a (first) holding frame 132*a*, or be placed at least onto the supporting surface of said (first) holding frame 132*a*. The holding frame 132*a* can be connected to the carrier plate 102 in a monolithic manner. As is illustrated in FIG. 12B, the first substrate 120*a* and the second substrate 120*b* can be in mutual (physical) contact.

A further holding frame 132*b* (second holding frame 132*b*) can optionally be inserted between the first substrate 120*a* and the second substrate 120*b* (cf. FIG. 8A, FIG. 8B, or FIG. 13B), for example at least partially into the substrate receiving cavity 112. A spacing between the first substrate 120*a* and the second substrate 120*b* can thus be implemented such that the surfaces of said substrates 120*a*, 120*b* (on the lower side of the second substrate 120*b* and on the upper side of the first substrate 120*a*) do not adhere, for example adhesively bond, to one another (caused by the processing, for example).

As is illustrated in FIG. 12B, the first substrate 120*a* and the second substrate 120*b* can be configured in a plate-shaped manner. Alternatively, the first substrate 120*a* and/or the second substrate 120*b* can be configured in an embossed manner (also referred to as profiled).

According to various embodiments, inserting the first substrate 120*a* and the second substrate 120*b* can be performed simultaneously (that is to say conjointly, that is to say in the form of a substrate stack 120*a*, 120*b*. For example, the first substrate 120*a* and the second substrate 120*b* can be inserted into the cavity 112 in a preconfigured manner, for example optionally using a cassette having at least one of the following: a first holding frame 132*a*, into which at least the first substrate 120*a* is inserted, for example (for example when the holding frame 132*a* is not connected to the carrier plate 102), into which the second substrate 120*b* is optionally inserted, for example; a second holding frame 132*b* into which the second substrate 120*b* is inserted (for example when the second substrate 120*b* is not disposed in the first holding frame 132*a*), which is disposed between the first substrate 120*a* and the second substrate 120*b*, for example; a third holding frame 132*c* which is placed onto the second substrate 120*b*, for example, in order for the second substrate 120*b* to be clamped, for example; a further third holding frame 132*c* which is placed onto the first substrate 120*a*, for example, and is disposed between the first substrate 120*a* and the second substrate 120*b*, for example, in order for the first substrate 120*a* to be clamped, for example.

Figure 13A:
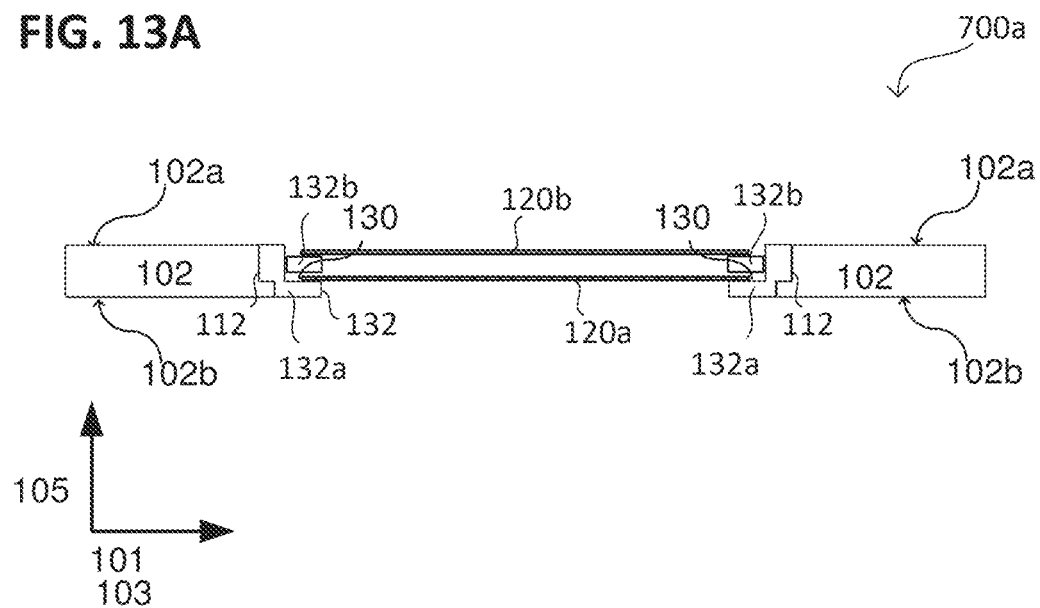
FIG. 13A and FIG. 13B show a respective substrate holding device according to various embodiments, in a schematic cross-sectional view.
Figure 13B:
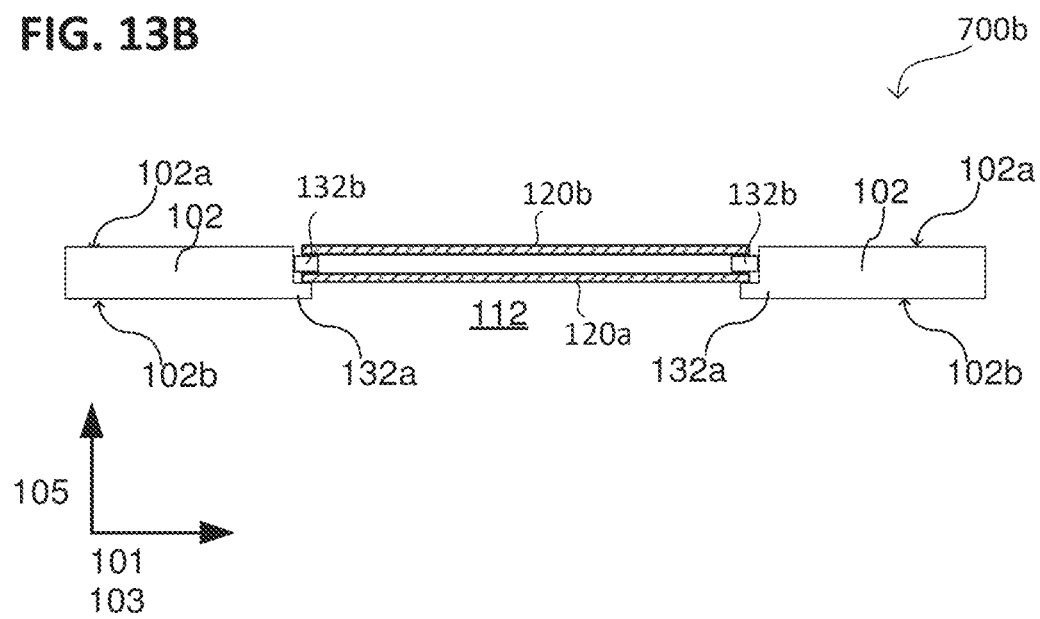

FIG. 13A and FIG. 13B each visualize a substrate holding device 700*a* and 700*b* in a schematic cross-sectional view analogous to that of FIG. 8A.

According to various embodiments, the second holding frame 132*b* can at least partially extend in a recess in the first holding frame 132*a*, or be inserted thereinto. The first holding frame 132*a* can be inserted into the carrier plate 102, as is visualized in FIG. 13A, or be connected to the carrier plate 102, for example in a monolithic manner, as is visualized in FIG. 13B.

Examples of various embodiments are described hereunder:

EXAMPLE 1b

Method 1200 including the following steps: disposing a substrate stack having a first substrate 120*a* and a second substrate 120*b* in a receiving region of a substrate holding device, wherein a first side 140*a* of the first substrate 120*a* faces a first side 140*a* of the second substrate 120*b*; and processing a second side 140*b* of the first substrate 120*a* that is opposite the first side 140*a* of the latter, and processing a second side 140*b* of the second substrate 120*b* that is opposite the first side 140*a* of the latter and faces away from the second side 140*b* of the first substrate 120*a*.

EXAMPLE 2b

Method 1200 according to example 1b, wherein disposing the substrate stack includes placing the second side 140*b* of the first substrate 120*a* onto a supporting surface of the substrate holding device.

EXAMPLE 3b

Method 1200 according to example 1b or 2b, furthermore including: disposing a holding frame between the first substrate 120*a* and the second substrate 120*b*, wherein disposing the substrate stack includes inserting the second substrate 120*b* into the holding frame.

EXAMPLE 4b

Method 1200 according to one of examples 1b to 3b, wherein the first substrate 120*a* and the second substrate 120*b* are disposed in mutual physical contact; and/or wherein a gap is formed between the first substrate 120*a* and the second substrate 120*b*; and/or wherein a heat sink is disposed between the first substrate 120*a* and the second substrate 120*b*.

EXAMPLE 5b

Method 1200 according to one of examples 1b to 4b, wherein the processing of the second side 140*b* of the first substrate 120*a* includes at least one of the following steps: coating, radiating, subtracting, cleaning, heating, converting, doping, polishing; and/or wherein the processing of the second side 140*b* of the second substrate 120*b* includes at least one of the following steps: coating, radiating, subtracting, cleaning, heating, converting, doping, polishing.

EXAMPLE 6b

Substrate holding device 100, 300*a*, 300*b*, having: a carrier plate 102 having at least one cavity 112 which extends from an upper side 102*a* of the carrier plate 102 through the carrier plate 102 to a lower side 102*b* of the carrier plate 102; a first holding frame 132*a* which has a first supporting surface for holding a first substrate 120*a*; and a second holding frame 132*b* which when inserted into the cavity 112 is disposed above the first supporting surface and which has a second supporting surface for holding a second substrate 120*b* above the first substrate.

EXAMPLE 7b

Substrate holding device 100, 300*a*, 300*b* according to example 6b, wherein the first holding frame 132*a* and the carrier plate 102 are interconnected in a monolithic manner; or wherein the first holding frame 132*a* when inserted into the cavity 112 rests at least partially on a supporting surface of the carrier plate 102.

EXAMPLE 8b

Substrate holding device 100, 300*a*, 300*b* according to one of examples 6b or 7b, furthermore including: a third holding frame 132c for covering the second substrate 120b; wherein the third holding frame 132c when inserted into the cavity 112 is disposed above the second supporting surface in such a manner that a receiving space 130 for receiving a peripheral portion of the second substrate 120b is provided between the third holding frame 132c and the second supporting surface.

EXAMPLE 9b

Substrate holding device 100 according to one of examples 6b to 8b, furthermore including: a vent opening 302o for evacuating a gap between the first holding frame 132a and the second holding frame 132b.

EXAMPLE 10b

Processing assembly 500a, 500b, 500c having: a processing chamber 512; a first processing device 510a and a second processing device 510b which are disposed in the processing chamber 512; a substrate holding device according to one of examples 6b to 9b; and a transportation device 522 for transporting and/or positioning the substrate holding device between the first processing device 510a and the second processing device 510b.

According to various embodiments, a substrate holding device (substrate holder) for the coating of substrates (for example wafers), for example thin substrates (having a thickness of less than 500 μm) on both sides in a vacuum coating system is provided. According to various embodiments, coating of substrates on both sides is enabled, wherein the upper side is coated across the full area. Optionally, the lower side (for example the lower face of the substrate) can be covered (masked) in an encircling manner on the periphery (peripheral region). According to various embodiments, coatings for use in the field of optics, semiconductors, photovoltaics, barriers, and encapsulations can be provided.

According to various embodiments, the peripheral region can have an extent (measured from the edge of the substrate in the direction toward the center of the substrate) in a range from approximately 0.1 mm to approximately 10 mm, for example in a range from approximately 0.2 mm to approximately 5 mm, for example in a range from approximately 0.5 mm to approximately 2 mm.

According to various embodiments, a coating (illustratively coverage by sputtering) of the supporting surface (also referred to as the pocket base) can be reduced or prevented. To this end, the substrate holding device can have a recess (can also be referred to as the recess) that encircles the supporting surface (also referred to as the wafer resting). According to various embodiments, a secure and reproducible configuration of the resting of the substrate on the supporting surface is provided.

According to various embodiments, cleaning of the substrate holding device can be performed, for example by acid cleaning or radiating. However, a subtraction of material from the substrate holding device can arise during cleaning (illustratively an "abrasive method"), that is to say a subtraction of material on the supporting surface which can reduce the cross-sectional area of the latter and pose a risk to the effect of the latter (for example the shading of the peripheral region of the substrate). In other words, a subtraction of material on the holding frames (masks) by cleaning can lead to a reduction in the supporting surface (substrate supporting surface, for example the wafer supporting surface) and thus increase the reject rate.

Therefore, the substrate holding device can be configured having a comparatively large material thickness, for example in the supporting surfaces, in order for the former to be used repeatedly.

According to various embodiments, a coating process (that is to say coating of the substrate) such as, for example, cathodic evaporation (so-called sputtering or magnetron sputtering) can be performed in a processing assembly (for example a vacuum system and/or a continuous-flow system). Wafers and substrates with a comparatively small area can be processed, for example coated, on one side and/or on both sides, for example. Such a processing assembly can be employed for example in photovoltaics, for example in order for at least one of the following cellular concepts to be produced: an HJT (heterojunction technology) solar cell, an IBC (interdigitated back contact) solar cell, a WT (wrap through) solar cell, an (aluminum) BSF (back surface field) solar cell, a PERC (passivated emitter and rear cell) solar cell, a PERL (passivated emitter rear locally diffused) solar cell, or a PERT (passivated emitter rear totally diffused) solar cell. Apart from the HJT (heterojunction technology) solar cells, the cellular concepts mentioned can require the processing of substrates, for example of the wafers, on one side only.

According to various embodiments, a processing assembly for processing monocrystalline silicon substrates (c-Si substrates) is provided. The processing assembly can include a processing device for providing a gaseous coating material, for example a material vapor source, for example a material vapor source for PVD (physical vapor deposition). Processing of the reverse side of the substrate (or of the reverse side of the cell, respectively) can be performed by means of the processing assembly for said cellular concepts, for example, for example in order to form metallizing, for example PVD metallizing, on the reverse side of the substrate.

According to various embodiments, a substrate holding device and a method for the increased utilization of the substrate are provided, said device and said method being adapted in such a manner that substrates (for example wafers) can each be processed on one side and/or both sides. For example, a plurality of processing stages can be implemented using a PVD material source (for example a sputtering system).

According to various embodiments, uniform coating of substrates on both sides in a vacuum can be provided. In order to avoid a short circuit in the conductive coating (layers), for example, on the upper and lower side of the substrate, an isolating cavity can be provided between the two coated substrate faces, for example by means of a non-coated peripheral region. For example, a defined peripheral region can be protected (shaded) in an encircling manner against coating such that a so-called peripheral exclusion (that is to say a non-coated annular area) can be provided on the substrate.

The substrate holding device (substrate carrier) is adapted in such a manner that a secure substrate receiving, for example on the planar supporting surfaces of the former, and a lateral delimitation for positionally fixing the substrates, for example by means of the inner circumferential wall of the substrate placement regions, are implemented.

Figure 14A:
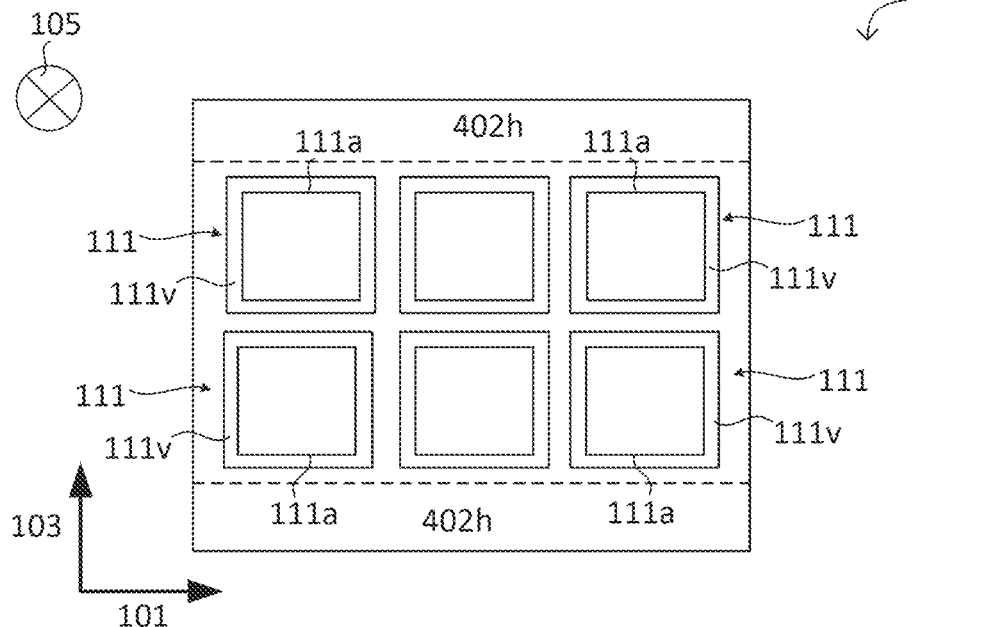
FIG. 14A shows a substrate holding device according to various embodiments, in a schematic cross-sectional view or a plan view.

FIG. 14A visualizes a substrate holding device 100 according to various embodiments, in a schematic cross-sectional view (for example sectioned along a supporting surface 111a) or a plan view (for example perpendicular to a supporting surface 111a).

The substrate holding device 100 can have two supporting regions 402h (also referred to as the holding regions 402h) which extend parallel to each other (for example along the direction 101). The supporting regions 402h enable the substrate holding device 100 to be transported along the direction (transportation direction) along which the supporting regions 402h extend parallel to each other. In other words, the supporting regions 402h can define the transportation direction and/or extend along the latter. The substrate holding device 100 can be bear or supported in the supporting regions 402h in order for the substrate holding device 100 together with the substrates 120 and/or holding frames 132a, 132b that are held in the substrate holding device 100 to be transported (cf. FIG. 17A).

The substrate holding device 100 can have a plurality of substrate placement regions 111 in which the substrate holding device 100 can, respectively, have a cavity for inserting the substrates into the plurality of substrate placement regions 111.

The substrate holding device 100 can furthermore have a supporting surface 111a onto which a substrate can be placed in each of the substrate placement regions 111.

Furthermore, the substrate holding device 100 can have a recess 111v which at least partially (for example completely) surrounds the supporting surface 111a in each of the substrate placement regions 111. For example, the recess 111v can extend at least partially (for example completely) along a closed path, wherein the closed path surrounds the supporting surface 111a.

According to various embodiments, a plurality of substrate placement regions 111, for example more than 10 substrate placement regions 111, for example more than 20 substrate placement regions 111, for example more than 50 substrate placement regions 111, for example more than 100 substrate placement regions 111, can be provided beside one another in the substrate holding device 100 for holding a plurality of substrates. The direction 105 along which the substrate holding device 100 can be transported in a processing assembly for processing the plurality of substrates 120 herein can be transverse to a transportation direction.

According to various embodiments, the plurality of substrate placement regions 111 can be disposed beside one another (for example in a row) at least along the transportation direction (for example along the longitudinal direction 101 of the substrate holding device 100). Alternatively or additionally, the plurality of substrate placement regions 111 can be disposed beside one another (for example in a row) at least transversely to the transportation direction (for example along the width direction 103 of the substrate holding device 100). For example, the plurality of substrate placement regions 111 can be disposed in a (for example two-dimensional) grid.

The supporting surfaces 111a can be provided by means of holding frames 132a, 132b (cf. FIG. 14B), or by means of a carrier plate 102 (cf. FIG. 14C), as is described hereunder.

Figure 14B:
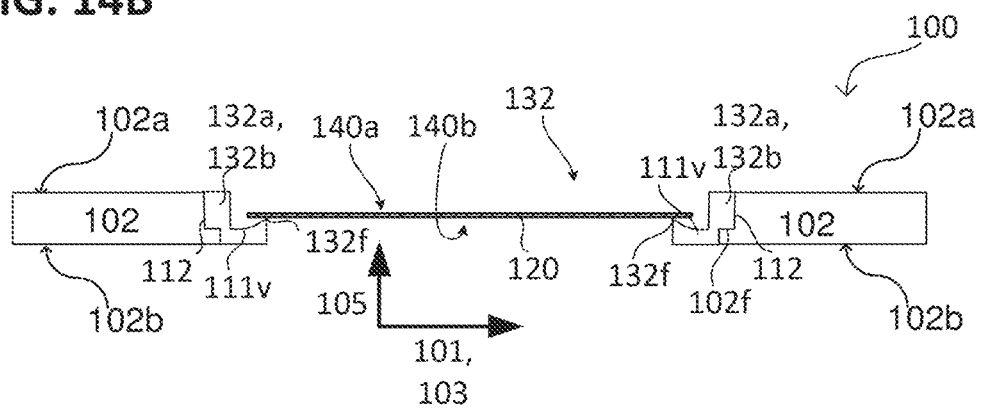
FIG. 14B and FIG. 14C show a respective substrate holding device according to various embodiments, in a schematic cross-sectional view.

FIG. 14B visualizes a substrate holding device 100 according to various embodiments, in a schematic cross-sectional view (for example sectioned transversely to a supporting surface 111a), for example the substrate holding device 100 that is visualized in FIG. 14A.

The substrate holding device 100 can have a carrier plate 102. The carrier plate 102 can have at least one cavity 112, for example in such a manner that a holding frame 132a, 132b can be received (or can be at least partially received) in the cavity 112, in order for a substrate 120 to be held in the cavity 112 by means of the holding frame 132a, 132b.

According to various embodiments, the carrier plate 102 in terms of the dimensions can be adapted to both the quantity and the size of the substrates 120 to be received as well as to the size (for example the coating width and/or lock length) of the processing assembly 500a, 500b, 500c that is used for treating the substrates 120 (cf. FIG. 11A to FIG. 11C). For example, the carrier plate 102 (also referred to as the basic carrier 102) can position and/or hold a plurality of substrates 120, for example wafers, for PVD coating.

The substrate holding device 100 can furthermore have a holding frame 132a, 132b that is inserted into the cavity 112. The holding frame 132a, 132b at least partially can rest on the carrier plate 102 (for example on the supporting surface 102f thereof). The holding frame 132a, 132b can illustratively be provided in such a manner that a substrate 120 that is inserted thereinto and the supporting surface 132f of the holding frame 132a, 132b that is to say the mutually facing sides thereof (that is to say the second side 140b of the substrate 120), at least partially cover or shield (mask) one another. By contrast, the first side 140a of the substrate 120 can be completely exposed (uncovered), for example for coating the first side 140a.

According to various embodiments, the holding frame 132a, 132b can be adapted in such a manner that the second side 140b of the substrate 120 (illustratively the lower side 140b thereof) is at least partially exposed, and the first side 140a of the substrate 120 (illustratively the upper side 140a thereof) is completely exposed. The holding frame 132a, 132b can illustratively be provided in such a manner that said holding frame 132a, 132b can cover or shield (mask) at least one peripheral portion of a substrate 120 that is held by said holding frame 132a, 132b, for example on the second side 140b. On account thereof, a short circuit between a coating on the first side 140a of the substrate 120 and a coating on the second side 140b of the substrate 120 can be prevented. In other words, the peripheral portion of the substrate 120 can remain non-coated during coating, that is to say not be conjointly coated, in order for an isolating cavity to the provided.

For example, the substrate 120 can be a wafer, for example a semiconductor wafer, for example a silicon wafer. The substrate 120 by way of the peripheral region thereof can rest on the holding frame 132a, 132b by way of the full circumference. Alternatively, the substrate 120 in the peripheral region of the substrate 120 (in the case of an angular substrate 120, respectively, by way of the corners for example) can also rest only partially on the holding frame 132a, 132b, that is to say on the resting surface 132f thereof. The holding frame 132a, 132b can have a level (or planar, respectively) supporting surface 132f for placing the substrate 120. The peripheral portion of the substrate 120 can be at least in partial contact with the supporting surface 132f of the holding frame 132a, 132b.

FIG. 14B visualizes the substrate holding device 100 in a method according to various embodiments.

According to various embodiments, the method can include the following steps: inserting a holding frame 132a, 132b for holding a substrate 120 into a cavity 112 in a carrier plate 102, wherein the holding frame 132a, 132b has a (for example planar) supporting surface 132f for placing the substrate 120, and wherein the holding frame 132a, 132b has a recess 111v which is adjacent to the supporting surface 132f and surrounds the latter at least partially; inserting the substrate 120 into the cavity 132 onto the supporting surface 132f of the holding frame 132. The holding frame 132a, 132b and the substrate 120 can optionally be adapted to each other in such a manner that a gap 304 remains between the substrate 120 and the periphery of the cavity 132 in the holding frame 132a, 132b. Optionally, the holding frame 132a, 132b, for example the supporting surface 132f thereof, and the substrate 120 can be adapted to each other in such a manner that the supporting surface 132f is completely covered by the substrate 120.

The placing of the holding frame 132a, 132b and/or of the substrate 120 can optionally be performed by means of a magnetic gripper or of a suction gripper (also referred to as the vacuum gripper).

The holding frame 132a, 132b can have a cavity 132 which penetrates the former and for example at least partially exposes the lower side 140b of the substrate 120.

Figure 14C:
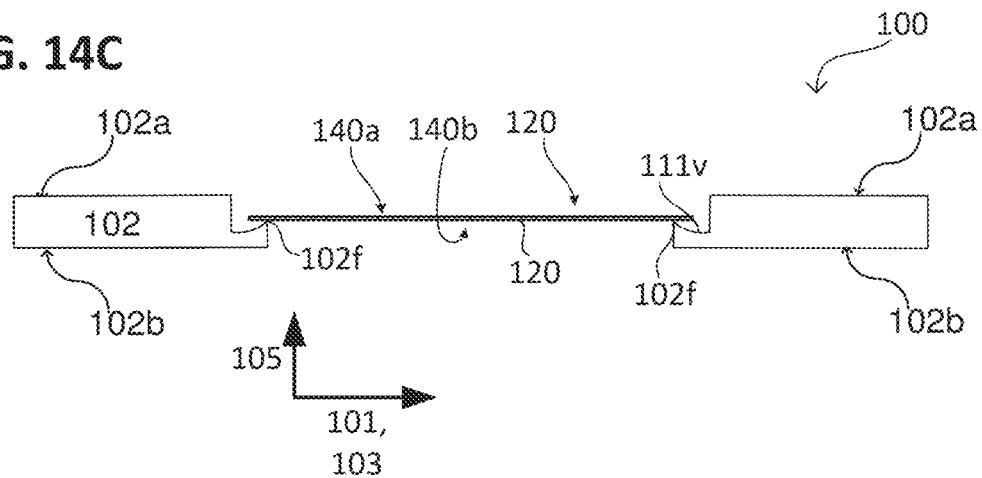

FIG. 14C visualizes a substrate holding device 100 according to various embodiments, in a schematic cross-sectional view analogous to that of FIG. 14B, for example the substrate holding device 100 that is visualized in FIG. 14A.

According to various embodiments, the supporting surface 102f can be provided by means of the carrier plate 102, wherein the carrier plate 102 has a recess 111v which is adjacent to the supporting surface 102f and at least partially surrounds the latter. In other words, the supporting surface 102f can be connected to the carrier plate 102, for example in an integral (monolithic) manner.

FIG. 14C visualizes the substrate holding device 100 in a method according to various embodiments.

According to various embodiments, the method can include the following steps: inserting a substrate 120 into a cavity 112 of a carrier plate 102 onto a supporting surface 102f of the carrier plate 102, wherein the carrier plate 102 has the (for example planar) supporting surface 102f for placing the substrate 120, and wherein the carrier plate 102 has a recess 111v which is adjacent to the supporting surface 102f and at least surrounds the latter partially. The carrier plate 102 and the substrate 120 can optionally be adapted to each other in such a manner that a gap 304 remains between the substrate 120 and the periphery of the cavity 112 in the carrier plate 102. The carrier plate 102, for example the supporting surface 102f thereof, and the substrate 120 can optionally be adapted to each other in such a manner that the supporting surface 102f is completely covered by the substrate 120.

Various modifications and configurations of the substrate holding devices 100, 100, and 100, and details will be described hereunder, wherein the fundamental features and operating modes that have been described in the context of FIG. 14A, FIG. 14B, and/or FIG. 14C can be included in an analogous manner. Furthermore, the features and operating modes that are described hereunder can be applied in an analogous manner to the substrate holding devices that are described hereunder, and/or the substrate holding devices described hereunder are combined with the substrate holding device 100, 100, and/or 100 that is described in FIG. 14A, FIG. 14B, and/or FIG. 14C.

The carrier plate 102 can have an upper side 102a (or an upper surface, respectively), and a lower side 102b (or a lower surface, respectively). The two surfaces 102a, 102b can (for example at least partially) be plane-parallel to each other. The carrier plate 102 along the direction 105 (perpendicular to the two surfaces 102a, 102b) can have a thickness in a range from approximately 1 mm to approximately 20 mm, for example a thickness in a range from approximately 2 mm to approximately 10 mm.

According to various embodiments, the carrier plate 102 (or the supporting surface 102f thereof, respectively) and/or the holding frame 132a, 132b (or the supporting surface 132f thereof, respectively) can include or be formed from at least one of the following: a metal, for example titanium, steel (for example stainless steel), a semimetal, for example carbon. Alternatively or additionally, the carrier plate 102 can include or be formed from a composite material. The upper side 102a of the carrier plate 102 and/or the lower side 102b of the carrier plate 102 can be configured planar (level), for example plane-parallel to each other. The upper side 102a of the carrier plate 102 and/or the lower side 102b of the carrier plate 102 can optionally be coated.

According to various embodiments, the substrate holding device 100, 100, and/or 100, for example the carrier plate 102 thereof, along the direction 103 (along the carrier plate face, for example parallel with the two surfaces 102a, 102b) can have a width in a range from approximately 10 cm to approximately 5 m, for example a width in a range from approximately 1 m to approximately 3 m. Furthermore, the substrate holding device 100, 100, and/or 100, for example the carrier plate 102 thereof, (along the carrier plate face, for example parallel with the two surfaces 102a, 102b), transverse to the width direction 103, can have a length in a range from approximately 10 cm to approximately 5 m, for example a length in a range from approximately 0.1 m to approximately 2 m, for example greater than 0.5 m. The carrier plate 102 can be transported along the length thereof, for example.

Figure 15A:
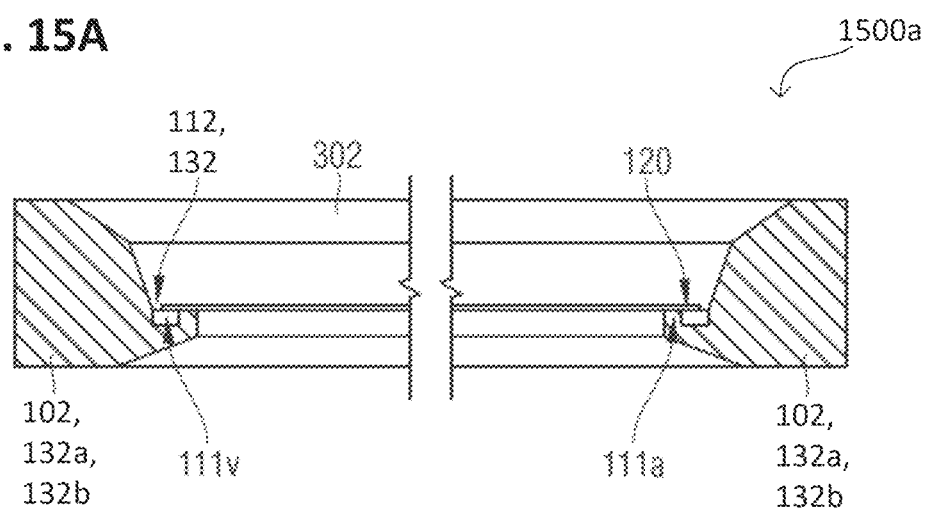
FIG. 15A shows a substrate holding device according to various embodiments, in a schematic cross-sectional view.

FIG. 15A visualizes a substrate holding device 1500a according to various embodiments, in a schematic cross-sectional view (for example sectioned transversely to the supporting surface 111a), wherein the cavity 112 of the carrier plate 102 and/or of the holding frame 132a, 132b can have an inner circumferential wall 302 which extends obliquely in relation to the supporting surface 111a, for example kinked at least once.

Figure 15B:
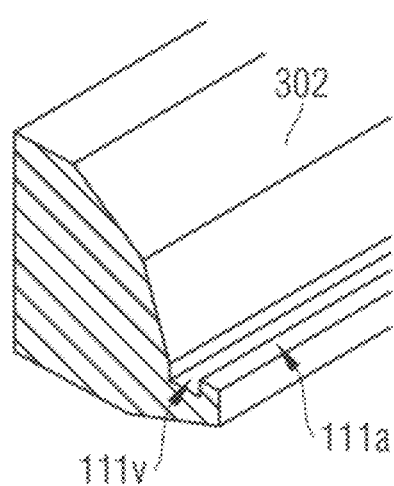
FIG. 15B and FIG. 15C show a respective substrate holding device according to various embodiments, in a schematic perspective view.
Figure 15C:
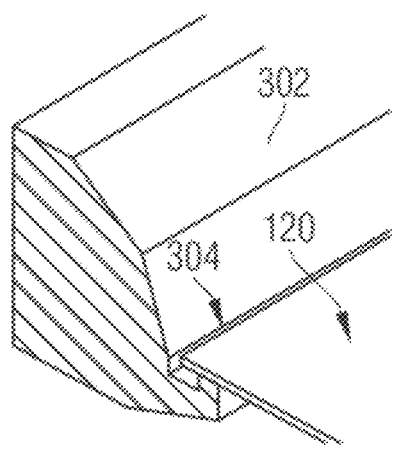

FIG. 15B and FIG. 15C each visualize a substrate holding device 1500b according to various embodiments, in a schematic perspective view, wherein FIG. 15B shows the substrate holding device 1500b without the substrate 120, and FIG. 15C shows the substrate holding device 1500b having a substrate 120 placed therein.

According to various embodiments, the cavity 112 of the carrier plate 102 and/or of the holding frame 132a, 132b can be provided in such a manner that a gap 304 remains between the substrate 120 placed therein and the inner circumferential wall 302. In other words, the recess 111v in the case of a substrate 120 placed thereon can be at least partially exposed, that is to say by way of the gap 304. For example, the gap 304 can be provided with a width (gap width) in a range from approximately 0.1 mm to approximately 1 mm, for example larger than approximately 0.2 mm.

In order for the substrate 120 to be inserted into the substrate holding device 1500a, for example into a holding frame 132a, 132b (holder) and/or into a carrier plate 102, while considering the substrate tolerances it can be necessary to have available the encircling gap 304 which is adapted in such a manner that reliable placing of the substrate 120 at the maximum dimension thereof is guaranteed, while only a minimum central offset of the substrate 120 is enabled, however.

A layer is deposited, that is to say a coating is formed on the upper side 140a and/or lower side 140b of the substrate 120 during the coating process (sputtering, evaporating, etc.). The deposition of a layer (that is to say the layered construction) is likewise performed on the substrate holding device 1500a.

While the layered construction on the lower side of the substrate holding device 1500a (for example of the carrier plate 102 and/or of the holding frame 132a, 132b) can be barely problematic, coating which can be problematic is performed on the upper side of the substrate holding device 1500a (for example of the carrier plate 102 and/or of the holding frame 132a, 132b). A layered construction can arise on the lateral delimitation faces (inner circumferential wall 302), on the gap 304 (placing gap 304), and on the supporting surface 111a, for example when the recess 111v is adapted in an insufficiently wide manner.

Therefore, the dimensions and tolerances of the substrate 120 relative to the cavity 112 can each be taken into account when the recess 111v is dimensioned. In other words, the placing gap 304 can be narrower than the recess 111v. It can thus be illustratively achieved that the supporting surface 111a is completely shielded by a substrate 120 lying thereon.

By contrast, if the supporting surface 111a is coated, a layered construction in the receiving contour can arise until the subsequent cleaning interval, on account of which reliable receiving of the substrate can no longer be guaranteed. A non-planar supporting surface 111a can illustratively be generated, increasing the risk of substrate breakage and of insufficient coating (for example insufficient sputtering), that is to say of a parasitic coating in the peripheral region of the substrate lower side, and thus generating an interruption in the peripheral exclusion (reject parts).

According to various embodiments, an encircling recess 111v (recess contour), which can receive a proportion of the layer (layer proportion) until subsequent cleaning, can be provided. The substrate supporting surface 111a is thus protected against coating. In other words, the depth of the recess 111v can be adapted to the spacings of the cleaning intervals and to the thickness of the layers deposited between said intervals.

Referring to FIG. 4A, the cavity 112 of the carrier plate 102 and/or of the holding frame 132a, 132b can be substantially rectangular-box shaped, for example, and thus (when viewed from above, for example) have four corner regions 412e and four edge regions 412i. Alternatively, the cavity 112 of the carrier plate 102 and/or of the holding frame 132a, 132b can have any other suitable shape, for example in a manner adapted to the shape of the substrate 120. For example, the cavity 112 of the carrier plate 102 can have and/or any other suitable shape, for example adapted to the shape of the holding frame 132a, 132b.

Referring to FIG. 4B, a plurality of cavity 112 can be provided beside one another in the substrate holding device 400b, for example the carrier plate 102 thereof, for holding a plurality of substrates 120 (for example by means of respective holding frames 132a, 132b), for example more than 10 cavity 112, for example more than 20 cavity 112, for example more than 50 cavity 112, for example more than 100 cavity 112. The direction 105 herein can be transverse to a transportation direction along which the substrate holding device 400b can be transported in a processing assembly for processing the plurality of substrates 120.

According to various embodiments, a plurality of cavities 112 can be disposed beside one another (for example in a row) at least along the transportation direction (for example along the longitudinal direction 101 of the carrier plate 102).

Alternatively or additionally, a plurality of cavities 112 can be disposed beside one another (for example in a row) at least transversely to the transportation direction (for example along the width direction 103 of the carrier plate 102). For example, the plurality of cavities 112 can be disposed in a (for example two-dimensional) grid.

Referring to FIG. 11A, the processing assembly 500a can have a first processing device 510a and a second processing device 510b.

The first processing device 510a can be adapted for processing, for example for coating, for radiating, for etching, etc., at least one substrate 120, for example the first side 140a thereof. The second processing device 510b can be adapted for processing, for example for coating, for radiating, for etching, etc., the substrate 120, for example the second side 140b thereof, for example in a manner identical or dissimilar to that of the first processing device 510a.

The first processing device 510a and/or the second processing device 510b for coating (that is to say for providing a gaseous coating material) can include or be formed from at least one of the following: a physical material vapor source (for coating by means of physical vapor deposition), such as, for example, a magnetron (also referred to as the sputtering source, optionally in conjunction with a reactive gas source for reactive sputtering), a laser beam evaporator, an arc evaporator, an electron beam evaporator, and/or a thermal evaporator; or a chemical material vapor source (for coating by means of chemical vapor deposition), such as, for example, a reaction gas source, optionally in conjunction with a plasma source (for coating by means of plasma-supported chemical vapor deposition).

Alternatively or additionally, the first processing device 510a and/or the second processing device 510b for subtracting material can include or be formed from at least one of the following: a plasma source, an ion beam source, or an etching-gas source. Alternatively or additionally, the first processing device 510a and/or the second processing device 510b for radiating can include or be formed from at least one of the following: an ion beam source, an electron beam source, or a light source (for example flash bulbs and/or lasers).

As is visualized in FIG. 11A, the first processing device 510a and the second processing device 510b can be disposed in such a manner that said processing devices 510a, 510b process the same substrate 120. In this instance, the processing regions of said processing devices 510a, 510b can at least partially mutually overlap. For example, the first processing device 510a and the second processing device 510b can be disposed on top of one another.

Referring to FIG. 11B, the first processing device 510a and the second processing device 510b can be disposed in such a manner that said processing devices 510a, 510b process different substrates 120. In this instance, the processing regions of said processing devices 510a, 510b can be spaced apart from each other. For example, the first processing device 510a and the second processing device 510b can be disposed offset from each other, for example along the transportation direction and/or transversely to the transportation direction.

FIG. 11A and FIG. 11B each visualize the processing assembly 500a, 500b in a method according to various embodiments. The method can include the step of processing the lower side 140b of the substrate 120. The processing of the lower side 140b of the substrate 120 can include or be formed of at least one of the following steps: coating, radiating, subtracting, cleaning, heating, converting (chemically and/or structurally, for example), doping (chemically, for example), polishing.

Alternatively or additionally, the method can include the step of processing the upper side 140a of the substrate 120. The processing of the upper side 140a of the substrate 120 can include or be formed of at least one of the following steps: coating, radiating, subtracting, cleaning, heating, converting (chemically and/or structurally, for example), doping (chemically, for example), polishing.

The processing of the lower side 140b of the substrate 120 can be identical to the processing of the upper side 140a of the substrate 120. Alternatively, the processing of the lower side 140b of the substrate 120 can be dissimilar to the processing of the upper side 140a of the substrate 120.

Referring to FIG. 11C a processing assembly 500c can have the following: a processing chamber 512 for processing 313, 323 (processing) a plurality of substrates 120 on one side and/or on both sides; and a transportation device 522 for transporting and/or positioning the plurality of substrates 120 in a processing region 520 of a processing device 510a, 510b (only one processing region being illustrated in an exemplary manner here).

The transportation device 522 can have a plurality of transportation rollers, for example, the external circumference of said transportation rollers defining a transportation face along which a substrate holding device according to various embodiments can be transported. The transportation face can extend in a planar manner at least partially (in this instance also referred to as the transportation plane), and/or extend in a curved manner at least partially. In order for a substrate holding device to be transported through the processing chamber 512, unilaterally supported transportation rollers, which are disposed on opposite sides of the substrate holding device and hold the latter (such that a processing device can be disposed there between, for example) in the supporting regions 402 thereof, can be used, for example. Furthermore, the substrate holding device can also be inserted into a carrier, or be transported by means of a carrier.

The processing chamber 512 can be adapted and/or operated as a vacuum chamber or as an atmospheric pressure chamber or as a positive pressure chamber. The processing chamber 512 can be adapted in such a manner that a processing environment (including a process pressure, a process gas composition, a process temperature, etc.) can be set and/or regulated therein. For example, the processing chamber 512 can be adapted stable in terms of pressure (for example up to a pressure differential of at least 1 bar), gastight, and/or dust-tight. The processing of the substrate 120 and/or of the substrates 120 can be performed at a positive pressure (of more than 1 bar), at atmospheric pressure (of approximately 1 bar, at negative pressure (of less than 1 bar), or at a vacuum (of less than 0.3 bar), for example a fine vacuum (of less than 1 mbar), for example at a high vacuum (of less than $10^{-3}$ bar), for example an ultra-high vacuum (of less than $10^{-7}$ bar). In order for the process gas composition to be set and/or regulated, a gas including at least one reactive gas and/or an operating gas can be fed to the interior of the processing chamber 512, for example by means of a gas infeed. In order for the process pressure to be set and/or regulated, the processing chamber 512 can be coupled to a pump assembly having at least one booster pump and/or a vacuum pump which evacuate(s) the interior of the processing chamber 512. In order for the process temperature to be set and/or regulated, the processing assembly 500c can have heating devices and/or cooling devices which can supply thermal energy to the interior of the processing chamber 512 or at least to the substrates 120 transported therein (for heating), or extract thermal energy therefrom (for cooling).

For example, the substrate 120 or the substrates 120, for example a substrate tier, can be coated with at least one of the following: a functional layer, an anti-corrosion layer, an optically active layer, a protective layer, an electrically conductive layer, an electrically isolating layer, a sealing, a seed layer, a surface finish. For example, a functional layer can be applied to a foil or hard metal (for example in battery technology). For example, a metal coating and/or a coating from dielectric material can be applied to glass (for example for spectacles, windows, mobile phones, and/or architectural glass). For example, an electrically conductive protective layer, a functional layer, or an anti-corrosion layer can be applied to a metal foil (for example in fuel cell technology). For example, a seed layer can be applied to a wafer (for example in semiconductor technology). The seed layer can include or be formed from nickel (Ni) and/or copper (Cu), for example. The seed layer can subsequently be further galvanically coated, for example in order for metal layers to be formed.

Figure 16A:
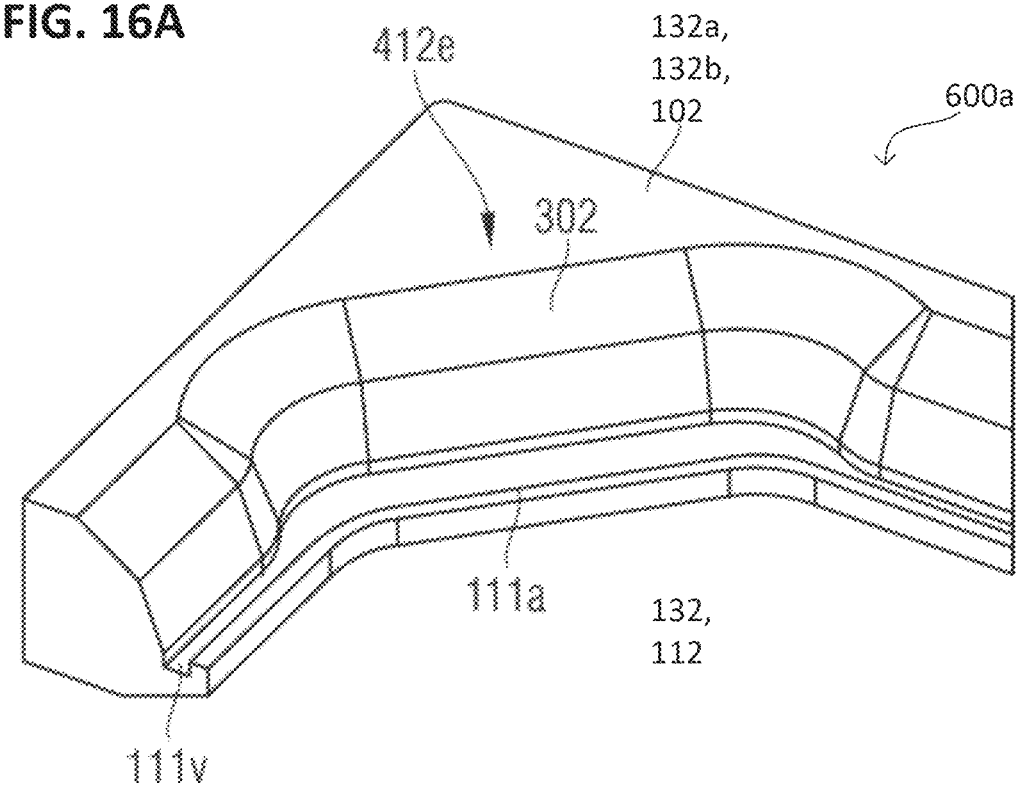
FIG. 16A and FIG. 16B show a respective substrate holding device according to various embodiments, in a schematic perspective view.
Figure 16B:
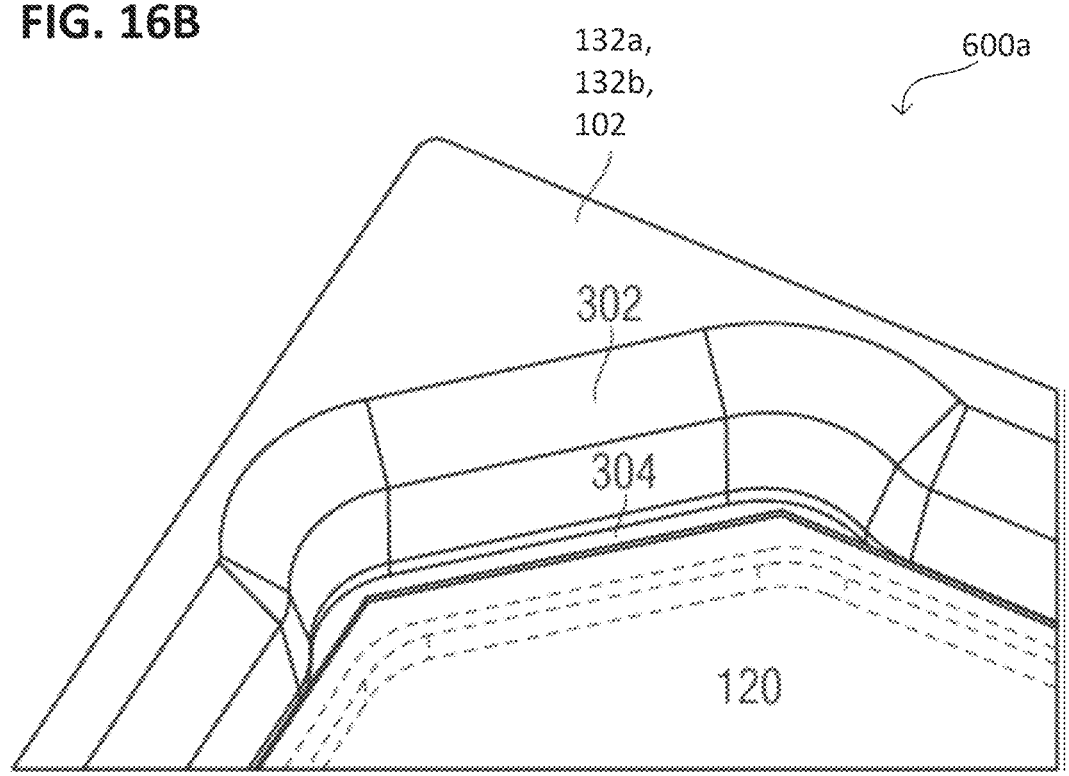

FIG. 16A and FIG. 16B each visualize a substrate holding device 600a according to various embodiments in a schematic perspective view, wherein FIG. 16A shows the substrate holding device 600a without the substrate 120, and FIG. 16B shows the substrate holding device 600a with a substrate 120 inserted thereinto.

According to various embodiments, the substrate holding device 600a can have at least one corner region 412e turned outward (for example a corner region 412e turned outward or a plurality of corner regions 412e turned outward). The recess 111v can follow so as to conform to the at least one corner region 412e turned outward. The supporting surface 111a in the at least one corner region 412e turn outward can be beveled, for example when the substrate 120 has a beveled corner.

The recess 111v can be configured in the form a groove.

The at least one corner region 412e turned outward can enlarge a spacing of the inner circumferential wall 302 from the substrate 120, reducing the risk of contact between the substrate 120 and the inner circumferential wall 302 in the at least one corner region 412e turned outward. In other words, the gap 304 between the substrate 120 and the inner circumferential wall 302 in the at least one corner region 412e turned outward can be provided enlarged. A reduction in the risk of substrate breakage can thus be achieved.

Figure 17A:
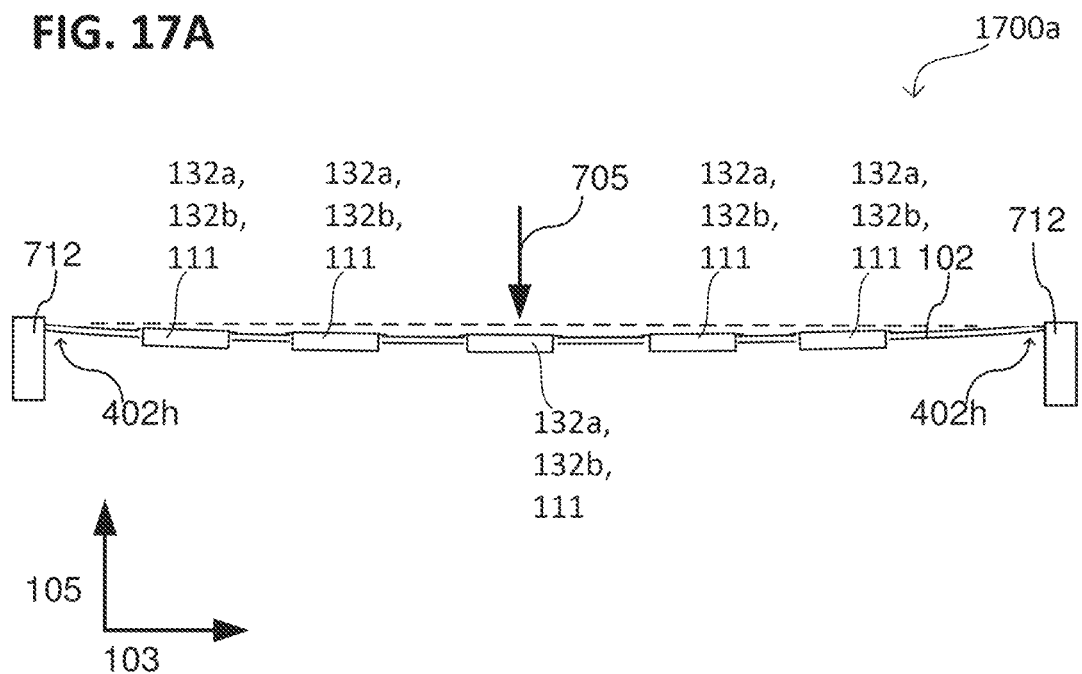
FIG. 17A shows a respective substrate transportation device according to various embodiments in a schematic cross-sectional view.

FIG. 17A visualizes a substrate transportation device 1700a according to various embodiments, in a schematic cross-sectional view (for example sectioned transversely to the supporting surface 111a and/or transversely to the transportation direction). The supporting surface 111a can be aligned along the transportation direction, for example.

According to various embodiments, the substrate transportation device 1700a can have a transportation system for transporting the substrate holding device, wherein the transportation system has two reinforcement elements 812 in such a manner that the substrate transportation device 700, for example the carrier plate 102 thereof, is held or supported, respectively, in the two supporting regions 402, only in the two supporting regions 402h, for example. The transportation of the substrate transportation device 1700a that is supported on the reinforcement elements 812 can be performed by means of transportation rollers, chains, bars, for example, or another suitable transportation means.

By virtue of the supporting of the substrate transportation device 1700a, the latter can for example flex, for example with maximum flexing 705 in the center of the substrate transportation device 1700a, for example of the carrier plate 102 thereof. When holding frames 132a, 132b are used for holding the respective substrates 102, the holding frames 132a, 132b can be decoupled from the substrate transportation device 1700a, or from the carrier plate 102 thereof, for example, such that the flexing 705 of the carrier plate 102 have a minor or no negative influence on the substrates 120 and/or is not transmitted to the latter. For example, a planar supporting surface 132*f* for the substrates 120 can be provided by means of the holding frames 132*a*, 132*b*, in a manner independent of the flexing 705.

Figure 17B:
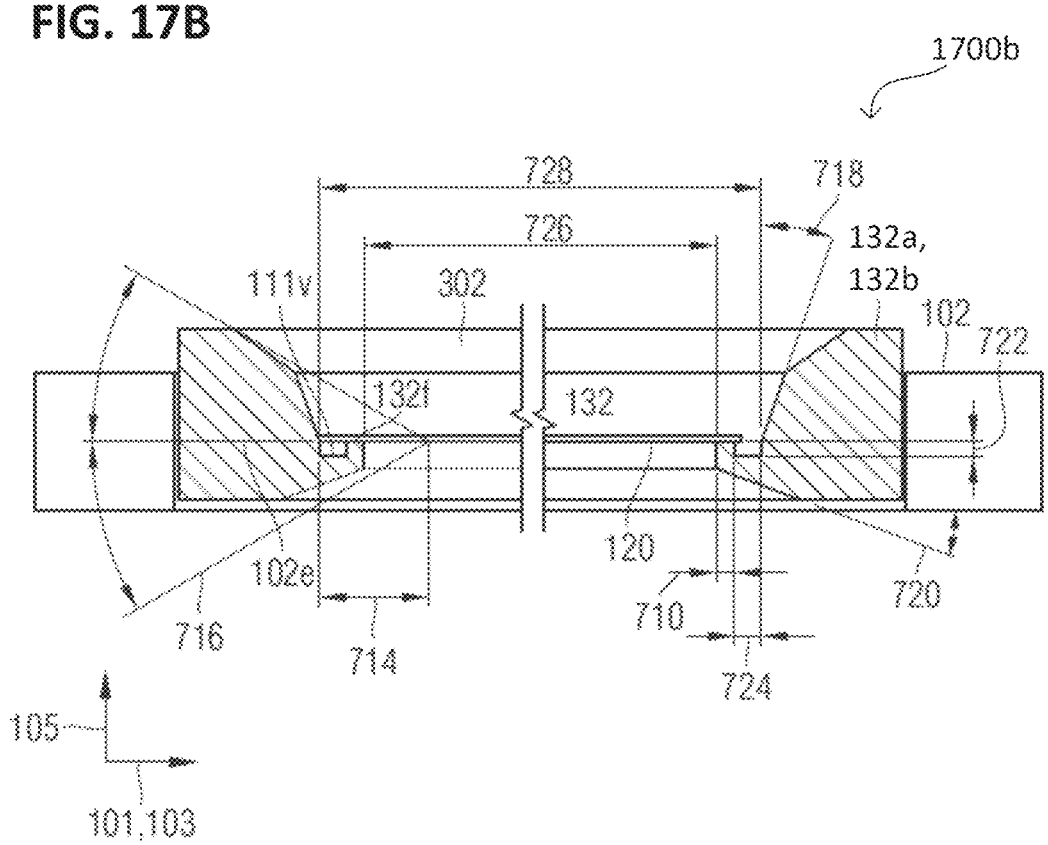
FIG. 17B shows a substrate holding device according to various embodiments, in a schematic cross-sectional view.

FIG. 17B visualizes a substrate holding device 1700*b* according to various embodiments, sectioned in a schematic cross-sectional view (for example transversely to the supporting surface 111*a*). The supporting surface 111*a* can be aligned along the transportation direction, for example.

According to various embodiments, the supporting surface 132*f* can have an extent 710 in a range from approximately 0.1 mm to approximately 10 mm, for example in a range from approximately 0.2 mm to approximately 5 mm, for example in a range from approximately 0.5 mm to approximately 2 mm.

According to various embodiments, the cavity 132 of the substrate placement region 111, for example of the holding frame 132*a*, 132*b*, can have an extent 728 (for example along the supporting surface 132*f*, for example level with the supporting surface 132*f*, and/or along the carrier plate face 102*e*) in a range from approximately 50 mm to approximately 500 mm, for example in a range from approximately 100 mm to approximately 250 mm, for example in a range from approximately 150 mm to approximately 160 mm, for example approximately 154 mm. The extent 728 can correspond to the spacing of the inner circumferential wall 302 on opposite portions.

According to various embodiments, a shaded region on the substrate 120 can be provided an extent 714 (measured from the edge of the substrate in the direction toward the center of the substrate) in a range from approximately 2 mm to approximately 20 mm, for example in a range from approximately 3 mm to approximately 10 mm, for example in a range from approximately 3 mm to approximately 4 mm. The shaded region can be understood to be that region in which quantity of the deposited material is influenced, that is to say reduced, by the proximity to the substrate holding device 1700*b* (for example the inner circumferential wall 302).

According to various embodiments, the height of the inner circumferential wall 302 and the inclination thereof can be determined by the shaded region. For example, said height can lie in an envelope having an angle 716 in a range from approximately 40° to approximately 80°, for example approximately 60°.

The inclination, the angle 718, of the inner circumferential wall 302 (for example level with the supporting surface 132*f*, that is to say in an upper portion of the inner circumferential wall 302) in relation to a normal direction 105 which extends perpendicularly to the supporting surface 132*f* and/or perpendicularly to the carrier plate face 102*e*, can have a value in a range from approximately 0° to approximately 40°, for example in a range from approximately 10° to approximately 30°, for example approximately 20°.

In an analogous manner, the inclination, the angle 720, of the inner circumferential wall 302 (for example in a lower portion of the inner circumferential wall 302) in relation to a normal direction 105 can have a value in a range from approximately 0° to approximately 20°, for example approximately 10°. In other words, the inner circumferential wall 302 in an upper portion and/or a lower portion can have a chamfer.

According to various embodiments, a spacing 726 of the supporting surface 132*f* on the opposite portions thereof can be smaller than the extent 728 of the cavity 132, for example smaller in a range from approximately 0.5 mm to approximately 10 mm, for example smaller in a range from approximately 1 mm to approximately 5 mm, for example smaller in a range from approximately 2 mm to approximately 4 mm.

According to various embodiments, the recess 111*v* (for example a gap) between the supporting surface 132*f* and the periphery 302 of the cavity (in other words the inner circumferential wall 302) of the holding frame 132*a*, 132*b* can have a width 724 (gap width), measured parallel with the supporting surface 132*f*, for example, in the plane of the supporting surface 132*f*, for example, (that is to say measured level with the supporting surface 132*f*) which can be adapted to the width of the substrate 120 to be received, for example a width 724 in a range from approximately 0.1 mm to approximately 1.5 cm, for example a width 724 of less than 1 cm, 0.5 cm, 1 mm, 500 µm, 300 µm, or 200 µm, for example in a range from approximately 0.1 mm to approximately 10 mm, for example in a range from approximately 0.2 mm to approximately 5 mm, for example in a range from approximately 0.5 mm to approximately 2 mm, for example approximately 0.8 mm. The recess 111*v* can have a depth 722 (transverse to the supporting surface 132*f*) in a range from approximately 0.1 mm to approximately 1.5 mm, for example a depth of less than 1 mm, 0.5 mm, and/or more than 200 µm or 300 µm.

In a manner analogous thereto, the cavity 112, the supporting surface 132*f*, and the recess 111*v* can be molded in the carrier plate 102, for example when no holding frame 132*a*, 132*b* is used.

Figure 18A:
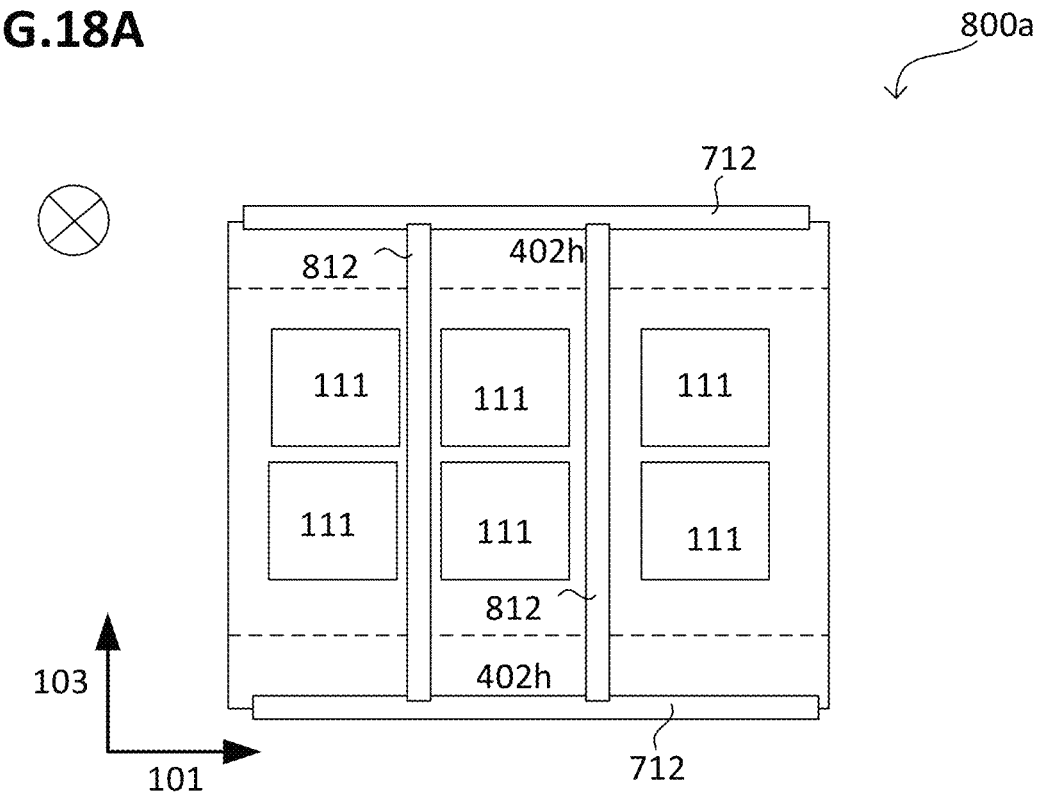
FIG. 18A shows a substrate holding device according to various embodiments, in a schematic cross-sectional view or a plan view.

FIG. 18A visualizes a substrate holding device 800*a* according to various embodiments, in a schematic cross-sectional view or plan view (analogous to that of FIG. 14A).

According to various embodiments, the substrate holding device 800*a* can have at least one reinforcement element 812 (for example two or more than two reinforcement elements 812) which extends between the two supporting regions 402*h* and extends thereinto. The at least one reinforcement element 812 can illustratively extend transversely to the transportation direction and reduce the flexing 705. In the at least one reinforcement element 812, the substrate holding device 800*a* can have a larger extent (illustratively a thickness, for example in the direction 105) than in the supporting regions 402*h* (holding regions 402*h*), and/or in the substrate placement regions 111. The at least one reinforcement element 812 can be connected to the mutually opposite reinforcement elements 812 in the supporting regions 402*h*, for example. A planar reinforcement of the substrate holding device 800*a*, for example of the carrier plate 102 thereof, can thus be achieved.

Figure 18B:
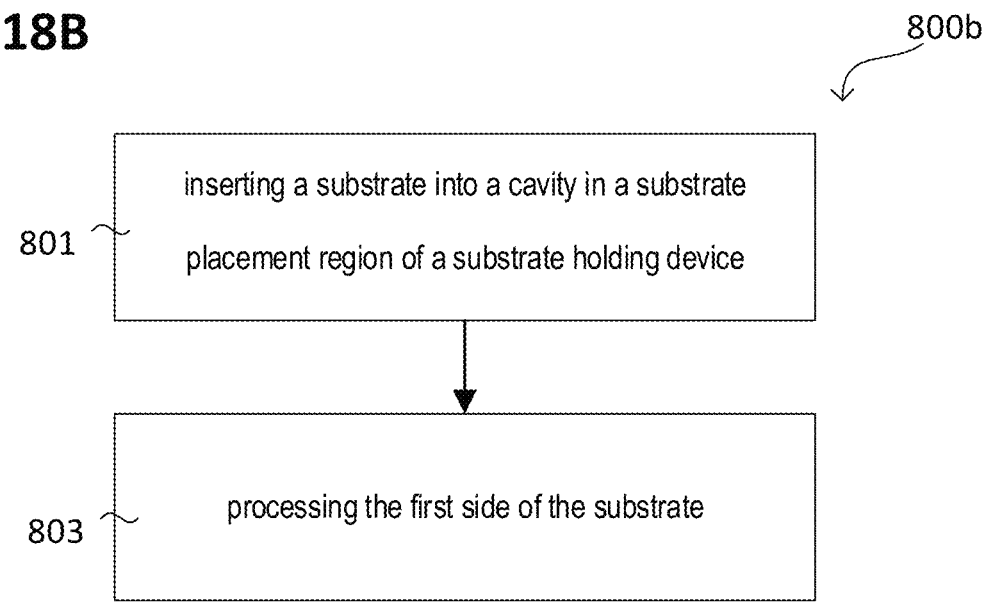
FIG. 18B shows a method according to various embodiments, in a schematic flow diagram.

FIG. 18B visualizes a method 800*b* according to various embodiments, in a schematic flow diagram.

The method 800*b* in step 801 includes the step of inserting a substrate into a substrate placement region of a substrate holding device. According to various embodiments, the substrate can have a first side and a second side which is opposite the first side; wherein the second side of the substrate is in physical contact with a supporting surface of the substrate placement region; and wherein the substrate has an extent parallel to the supporting surface which is smaller than the cavity of the substrate placement region, for example smaller than a diameter of the inner circumferential wall of the substrate placement region (measured level with the supporting surface, for example).

The method 800*b* in step 801 includes the step of processing the first side of the substrate. According to various embodiments, the supporting surface and the substrate can be adapted to each other in such a manner that the supporting surface is completely shielded from the processing by the substrate. In other words, the substrate can completely cover the supporting surface.

Examples according to various embodiments are described hereunder:

EXAMPLE 1c

Substrate holding device 100 having: two supporting regions 402h that extend parallel to each other and at which the substrate holding device 100 can be supported in order for the latter to be transported; and a plurality of substrate placement regions 111 that are disposed between the two supporting regions 402h, each of the substrate placement regions 111 having a cavity 112 and a supporting surface 111a for holding a substrate 120 in the cavity 112; and each of the substrate placement regions 111 having a recess 111v which is adjacent to the supporting surface 111a and surrounds the latter at least partially.

EXAMPLE 2c

Substrate holding device 100 according to example 1c, wherein the cavity 112 of at least one substrate placement region 111 of the plurality of substrate placement regions 111 extends through the substrate holding device 100.

EXAMPLE 3c

Substrate holding device 100 according to example 1c or 2c, wherein the recess 111v of at least one substrate placement region 111 of the plurality of substrate placement regions 111 is adjacent to an inner circumferential wall of the respective cavity 112.

EXAMPLE 4c

Substrate holding device 100 according to one of examples 1c to 3c, furthermore having a carrier plate 102; wherein the supporting surface 111a of at least one substrate placement region 111 of the plurality of substrate placement regions 111 is connected to the carrier plate 102; and/or wherein the supporting surface 111a of at least one substrate placement region 111 of the plurality of substrate placement regions 111 is provided by means of a holding frame 132a, 132b which when inserted into a cavity 112 of the carrier plate 102 rests at least partially on a supporting surface 111a of the carrier plate 102.

EXAMPLE 5c

Substrate holding device 100 according to example 4c, furthermore having: wherein the cavities 112 of the carrier plate 102 extends though the carrier plate 102.

EXAMPLE 6c

Substrate holding device 100 according to one of examples 1c to 5c, wherein the supporting surface 111a of at least one substrate placement region 111 of the plurality of substrate placement regions 111 is planar.

EXAMPLE 7c

Substrate holding device 100 according to one of examples 1c to 6c, wherein the supporting surface 111a of at least one substrate placement region 111 of the plurality of substrate placement regions 111 includes or is formed from a metal.

EXAMPLE 8c

Substrate holding device 100 according to one of examples 1c to 7c, furthermore having:

at least one reinforcement element 812 which extends between the two supporting regions 402h, and extends thereinto, and/or a plurality of reinforcement elements 812 that extend parallel to each other, of which at least one reinforcement element 812 is disposed in a supporting region 402h of the two supporting regions 402h.

EXAMPLE 9c

Processing assembly 500a, 500b, 500c, having: a processing chamber 512;

a processing device 510a, 510b which defines a processing region in the processing chamber 512;

a substrate holding device 100 according to one of examples 1c to 8c; and a transportation device 522 for transporting and/or positioning the substrate holding device 100 in the processing region, wherein the transportation device 522 is adapted for supporting the substrate holding device 100 in the two supporting regions 402h thereof.

EXAMPLE 10c

Processing assembly 500a, 500b, 500c according to example 9c, furthermore having: a further processing device 510b, wherein the transportation device 522 is adapted for transporting and/or positioning the substrate holding device 100 between the processing device 510a and the further processing device 510b.

EXAMPLE 11c

Method 800b including the following steps: Inserting 801 a substrate 120 into a cavity 112 of a substrate holding device 100 into the substrate placement region 111 thereof, wherein the substrate 120 has a first side and a second side which is opposite the first side; wherein the second side of the substrate 120 is in physical contact with a supporting surface 111a of the substrate placement region 111; wherein the substrate has an extent parallel with the supporting surface 111a that is smaller than the cavity 112 of the substrate placement region 111; processing 803 the first side of the substrate 120, wherein the supporting surface 111a and the substrate are adapted to each other in such a manner that the supporting surface 111a is completely shielded from the processing by the substrate.

Figure 19A:
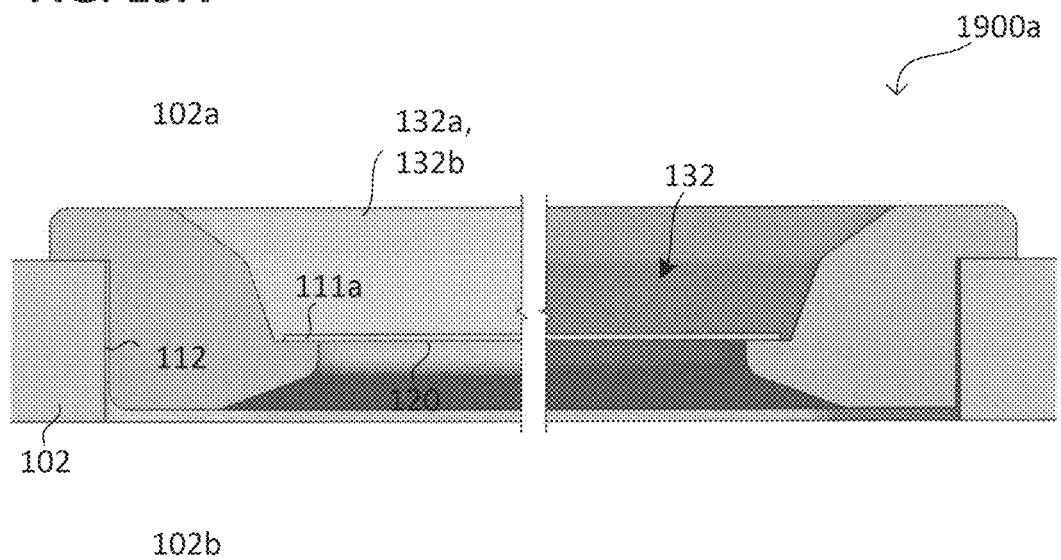
FIGS. 19A and 19B show a substrate holding device, in a respective schematic plan view, according to various embodiments.
Figure 19B:
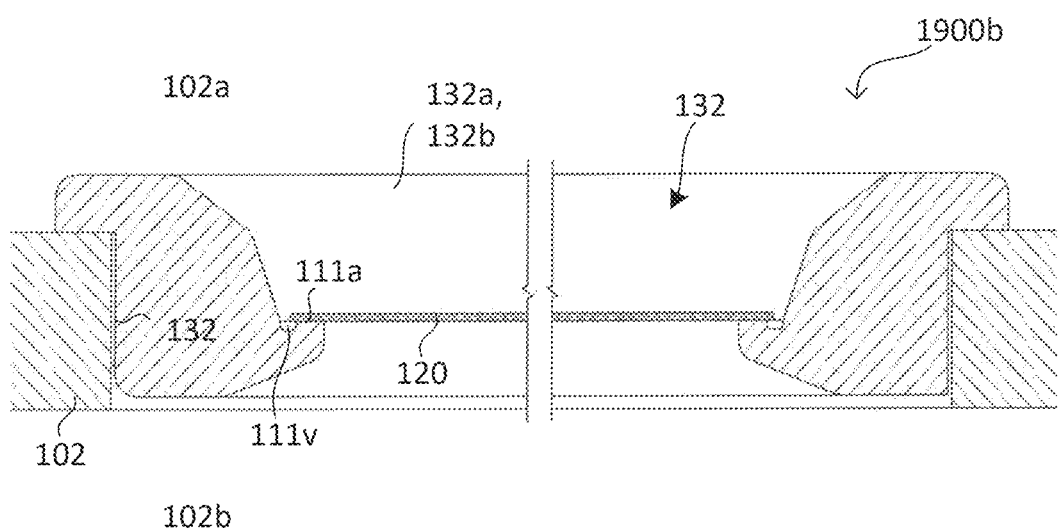

FIGS. 19A and 19B each visualize a substrate holding device, each in a schematic plan view, according to various embodiments.

The substrate holding device 1900a, 1900b can have a carrier plate 102 having a cavity 112. The cavity 112 can extend from an upper side 102a of the carrier plate 102, through the carrier plate 102, to a lower side 102b of the carrier plate 102.

The substrate holding device 1900a, 1900b can have a holding frame 132a. The holding frame 132a can have a frame opening 132 (also referred to as the cavity 132). The frame opening 132 can extend from an upper side 102a of the holding frame 132a, through the holding frame 132a, to a lower side 102b of the holding frame 132a.

The holding frame 132a for holding a substrate 120 in the cavity 112 can have a supporting surface 111a that surrounds the frame opening 132. The holding frame 132a that is inserted into the cavity 112 can rest on the carrier plate 102 at least partially.

The holding frame 132a of the substrate holding device 1900b can have a recess 111v (a recess 111v) which surrounds the supporting surface 111a.

Figure 20A:
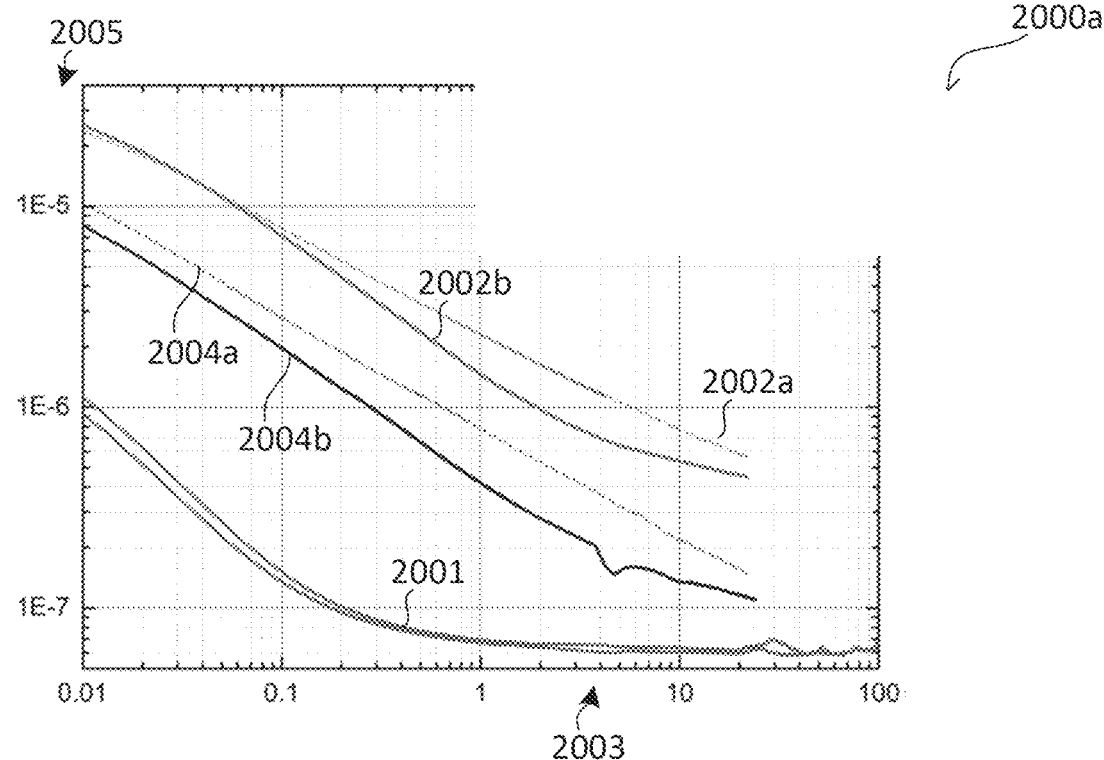
FIGS. 20A and 20B show a respective diagram according to various embodiments.
Figure 20B:
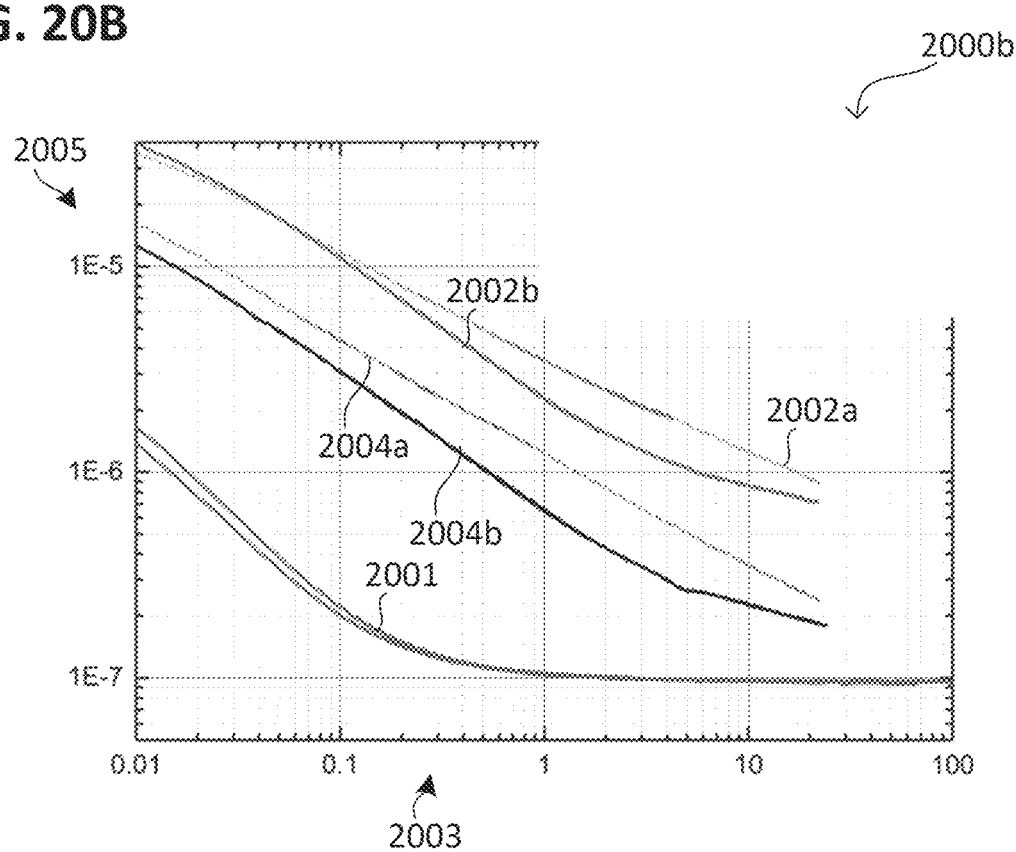

FIGS. 20A and 20B each visualize a diagram according to various embodiments, wherein the pressure 2005 (in millibar) in the recipient is visualized over time 2003 (in hours).

According to various embodiments, the holding frame can include or be formed from a plastics material (polymer), for example polyetheretherketone (PEEK). A method for manufacturing the holding frame can include the following steps: providing a basic body which includes or is formed from PEEK; forming the holding frame from the basic body by subtractive processing of the basic body, for example according to a predefined figure (or a three-dimensional model).

The subtractive processing can be cost intensive. Therefore, holding frames from PEEK can be provided in small numbers at a predefined budget. Such a holding frame can be recycled (multiple use), for example.

Alternatively or additionally, the holding frame can include or be formed from polyphenylene sulfide (PPS, can also be referred to as Fortron). A method for manufacturing the holding frame can include the following steps: providing a casting mold; forming the holding frame by means of injecting PPS into the casting mold, and curing the PPS. Alternatively, the holding frame can include or be formed from another thermoplastic plastics material (that is to say be capable of injection molding).

Polyphenylene sulfide can be molded by the injection molding method, which can be more cost-effective than subtractive processing. Therefore, holding frames from polyphenylene sulfide can be provided in large numbers at a predefined budget. Such a holding frame can be used as a disposable part (single-use part), for example. In this case, costs on account of recycling can be saved. Cleaning of the holding frame can be dispensed with (in the case of single use), for example, which results in less outgassing of the holding frame, for example. Cleaning can lead to a so-called sponge effect, for example, in the case of which the plastics material absorbs component parts of the substances used for cleaning, and releases the latter only once they are in the vacuum.

Alternatively or additionally, the plastics material can include or be formed from a polyimide (for example high-temperature polyimide, for example so-called TECASINT) and/or polytetrafluoroethylene (PTFE).

The plastics material can optionally be part of a composite material. The composite material can include the plastics material and a solid material, the latter (solid material) being harder than the plastics material, for example, and/or having a higher resistance to heat (decomposition temperature, melting temperature, and/or glass transition temperature) than the plastics material. The solid material can include or be formed from particles (solids particles), flakes and/or fibers (solid-material fibers). The solid material can include a polymer (for example PTFE), a mineral, a ceramic, carbon in a carbon modification (for example coal, graphite, or carbon black), oxide, carbide, nitride, sulfide (for example molybdenum disulfide), and/or glass (for example glass particles and/or glass fibers). Alternatively or additionally, the composite material can include the plastics material and a solid material (for example PTFE, conductive carbon black, or graphite) which has a lower dynamic friction that the plastics material and/or a higher electrical conductivity than the plastics material. The composite material can include or be formed from a mineral-reinforced and/or glass-reinforced plastics material, for example. Alternatively or additionally, the composite material can include graphite and/or PTFE (polytetrafluoroethylene).

The holding frame, or the plastics material and/or the composite material, respectively, can have a long-term heat resistance (that is to say a melting temperature, glass transition temperature and/or decomposition temperature) of more than approximately 150° C., for example of more than approximately 200° C., for example of more than approximately 300° C., for example of more than approximately 400° C., for example in a range from approximately 200° C. to approximately 500° C. or of more than approximately 500° C.

The holding frame, or the plastics material and/or the composite material, respectively, can have a heat resistance (HDT/A, that is to say in accordance with method A), for example for a temperature of more than approximately 150° C., for example of more than approximately 200° C., for example of more than approximately 300° C., for example of more than approximately 400° C., for example in a range from approximately 200° C. to approximately 500° C. (for example approximately 470° C.) or of more than approximately 500° C.

The holding frame, or the plastics material and/or the composite material, respectively, can be electrically isolating, for example have an electrical conductivity of less than approximately $10^{-6}$ S/m, for example of less than approximately $10^{-7}$ S/m, for example of less than approximately $10^{-8}$ S/m, for example of less than approximately $10^{-9}$ S/m, for example of less than approximately $10^{-10}$ S/m, for example of less than approximately $10^{-11}$ S/m, for example of less than approximately $10^{-12}$ S/m.

The plastics material of the holding frame can be vacuum-capable. According to various embodiments, vacuum-compatible (also referred to as vacuum-capable) can be understood to mean that a material (also referred to as a substance) has a low vapor pressure (that is to say gasses out as little as possible), for example a vapor pressure (measured at room temperature) of less than approximately $10^{-13}$ mbar, for example less than approximately $10^{-17}$ mbar, for example in a range from approximately $10^{-5}$ mbar to approximately $10^{-15}$ mbar. Furthermore, the vapor pressure can also be low at an elevated temperature, for example be less than approximately $10^{-3}$ mbar at 200° C.

Such a measurement pertaining to the outgassing of plastics material is shown in an exemplary manner in diagrams 2000a and 2000b. Prior to the respective measurement, the plastics material and/or the recipient can be conditioned in a high vacuum for 24 hours, reducing the susceptibility to errors of the measured result. The ventilation time of the recipient can be approximately one hour in ambient air.

The plastics material can have a water absorption of less than approximately 1%, for example of less than approximately 0.5%, for example of less than approximately 0.1%, for example approximately 0.02%. The plastics material can be odorless.

An absorption capacity/throughput capacity method can be used for measuring outgassing. The gas flow per surface area is derived from the effective absorption capacity active on the specimen and from the measured pressure. After subtraction of a reference measurement using an empty recipient, the quantity of outgassed material (outgassing) is obtained.

The diagram 2000a visualizes the evacuation curves 2002a, 2002b for PEEK (PEEK conditioning 2002a and PEEK measurement 2002b) and the evacuation curves 2004a, 2004b for PSS (PSS conditioning 2004a and PSS measurement 2004b). The evacuation curves can be additionally falsified by temperature variations and/or pressure variations. The respective corrected evacuation curves (PEEK conditioning 2002a and PEEK measurement 2002b, PSS conditioning 2004a and PSS measurement 2004b) are illustrated in the diagram 2000b.

FIGS. 21A and 21B each visualize a diagram 2100a, 2100b according to various embodiments, wherein the desorption rate 2105 (in millibar and liters per second—mbar·l/s) or the desorption rate standardized for weight (in millibar and liters per second and per gram—mbar·l/(s·g)), respectively, over time 2003 (in hours) are visualized.

The outgassing (desorption rate) of PEEK is lower than the outgassing (desorption rate) of PSS by a factor of 4. The temporal behavior is comparable for both materials; however, PEEK "saturates" at comparatively long times (of more than 10 hours, corresponding to 10 h).

The desorption rate 2105 of the plastics material of the holding frame can be less than approximately $10^5$ mbar·l/s, for example less than approximately $8.3 \cdot 10^{-6}$ mbar·l/s (for example after 1 h) for PSS, for example less than approximately $3.1 \cdot 10^{-6}$ mbar·l/s (for example after 4 h) for PSS, for example less than approximately $2 \cdot 10^{-6}$ mbar·l/s (for example after 10 h) for PSS and/or for example less than approximately $3.3 \cdot 10^{-3}$ mbar·l/s (for example after 1 h) for PEEK, for example less than approximately $1.6 \cdot 10^{-3}$ mbar·l/s (for example after 4 h) for PEEK, for example less than approximately $1.1 \cdot 10^{-3}$ mbar·l/s (for example after 10 h) for PEEK.

The time constant of the desorption rate (corresponding to the linear profile in the double-logarithmic illustration 2100a, 2100b) can be less than approximately 1, for example less than approximately 0.9, for example approximately 0.87 for PSS, and 0.85 for PEEK.

The data shown in the diagram 2100a are visualized standardized for weight in the diagram 2100b.

The weight-related desorption of PSS (mass of the specimen approximately 26.6 g, for example) is less than that of PEEK (mass of the specimen approximately 53.2 g, for example) (by a factor of 2 to 3).

The desorption rate 2105g, standardized for weight, of the plastics material of the holding frame can be less than approximately $10^{-6}$ mbar·l/(s·g), for example less than approximately $3.1 \cdot 10^{-7}$ mbar·l/(s·g) (for example after 1 h) for PSS, for example less than approximately $1.2 \cdot 10^{-7}$ mbar·l/(s·g) (for example after 4 h) for PSS, for example less than approximately $7.4 \cdot 10^{-8}$ mbar·l/(s·g) (for example after 10 h) for PSS and/or for example less than approximately $6.1 \cdot 10^{-7}$ mbar·l/(s·g) (for example after 1 h) for PEEK, for example less than approximately $2.9 \cdot 10^{-7}$ mbar·l/(s·g) (for example after 4 h) for PEEK, for example less than approximately $2.1 \cdot 10^{-7}$ mbar·l/(s·g) (for example after 10 h) for PEEK.

Figure 22A:
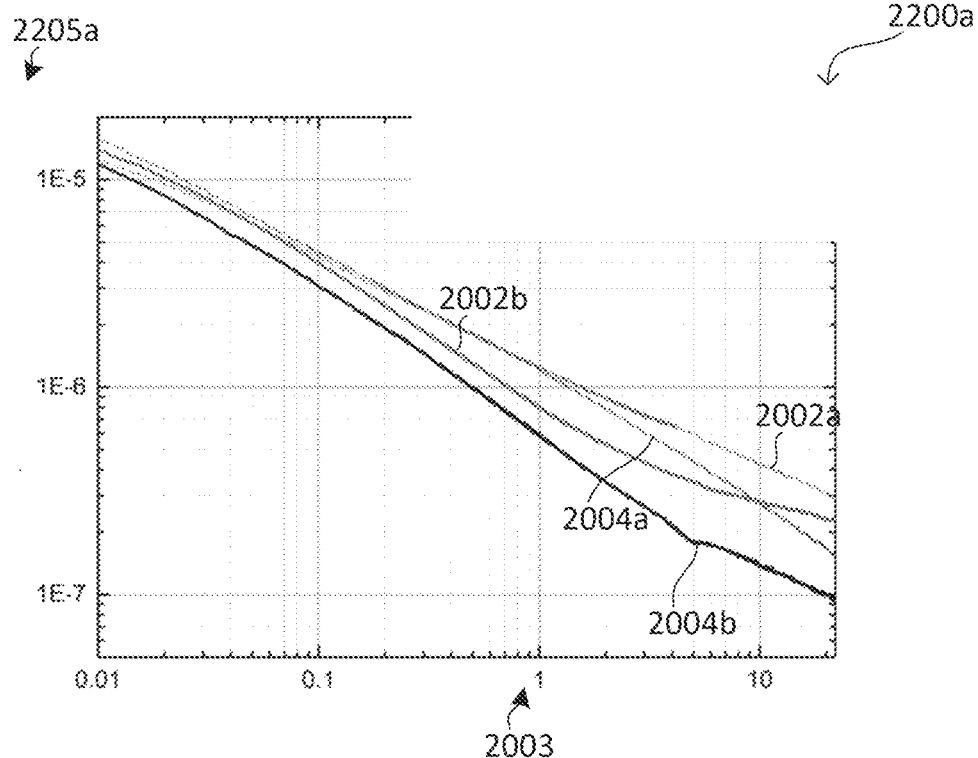
FIGS. 22A and 22B show a respective diagram according to various embodiments.
Figure 22B:
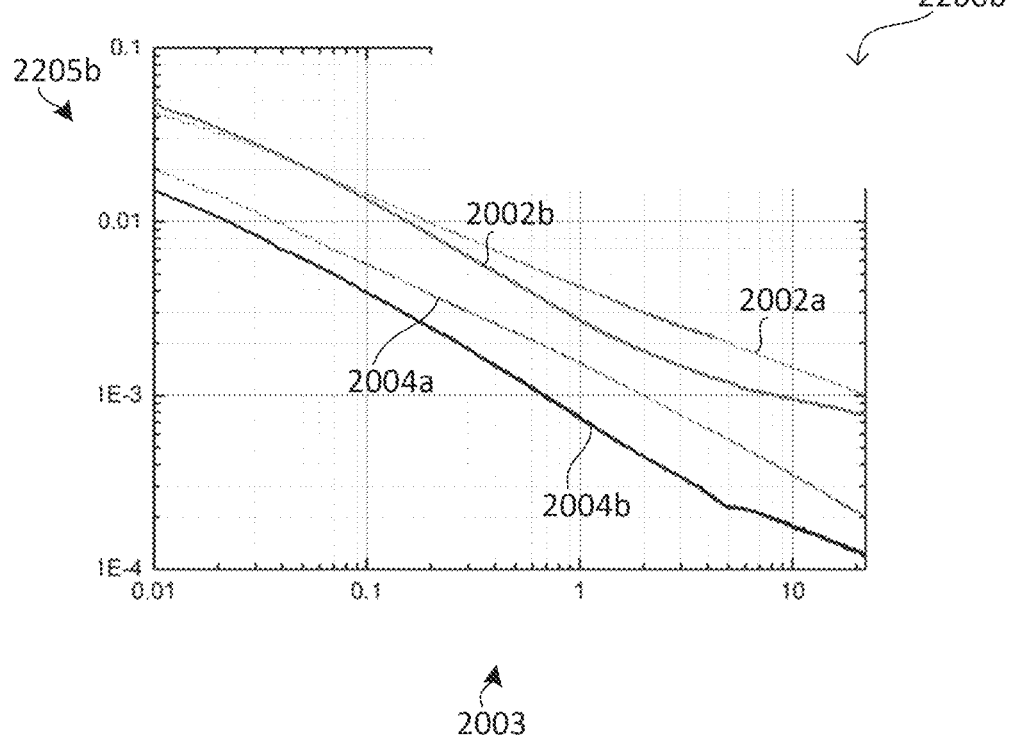

FIGS. 22A and 22B each visualize a diagram 2200a, 2200b according to various embodiments, wherein the desorption rate 2205a, standardized for volume (in millibar and liters per second and per cubic centimeter—mbar·l/(s·cm³)) or the desorption rate, standardized for surface area (in millibar and liters per second and per square centimeter—mbar·l/(s·cm²)) over time 2003 (in hours) are visualized.

The volume-related desorption of PSS (volume of the specimen approximately 14 milliliters, for example) is less than that of PEEK (volume of the specimen approximately 41 milliliters, for example) (by a factor of 1 to 2).

The desorption rate 2205a, standardized for volume, of the plastics material of the holding frame can be less than approximately $10^{-6}$ mbar·l/(s·cm³), for example less than approximately $5.8 \cdot 10^{-7}$ mbar·l/(s·cm³) (for example after 1 h) for PSS, for example less than approximately $2.2 \cdot 10^{-7}$ mbar·l/(s·cm³) (for example after 4 h) for PSS, for example less than approximately $1.4 \cdot 10^{-7}$ mbar·l/(s·cm³) (for example after 10 h) for PSS and/or for example less than approximately $7.9 \cdot 10^{-7}$ mbar·l/(s·cm³) (for example after 1 h) for PEEK, for example less than approximately $3.8 \cdot 10^{-7}$ mbar·l/(s·cm³) (for example after 4 h) for PEEK, for example less than approximately $2.8 \cdot 10^{-7}$ mbar·l/(s·cm³) (for example after 10 h) for PEEK.

The surface area-related desorption of PSS (surface area of the specimen approximately 110 cm², for example) is less than that of PEEK (surface area of the specimen approximately 120 cm², for example) (by a factor of approximately 4 to 5, for example).

The desorption rate 2205b, standardized for surface area, of the plastics material of the holding frame can be less than approximately $10^{-2}$ mbar·l/(s·cm²), for example less than approximately $7.5 \cdot 10^4$ mbar·l/(s·cm²) (for example after 1 h) for PSS, for example less than approximately $2.8 \cdot 10^{-4}$ mbar·l/(s·cm²) (for example after 4 h) for PSS, for example less than approximately $1.8 \cdot 10^{-4}$ mbar·l/(s·cm²) (for example after 10 h) for PSS and/or for example less than approximately $2.7 \cdot 10^{-3}$ mbar·l/(s·cm²) (for example after 1 h) for PEEK, for example less than approximately $1.3 \cdot 10^{-3}$ mbar·l/(s·cm²) (for example after 4 h) for PEEK, for example less than approximately $9.5 \cdot 10^{-4}$ mbar·l/(s·cm²) (for example after 10 h) for PEEK.

PSS can have a desorption rate that is lower than that of PEEK.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

What is claimed is:

1. A substrate transportation system comprising a substrate holding device and a transportation device for transporting the substrate holding device, wherein the substrate holding device comprises:
   a carrier plate comprising a cavity, wherein the cavity extends from an upper side of the carrier plate through the carrier plate to a lower side of the carrier plate;
   a holding frame, which has a frame opening and a supporting surface for holding a substrate in the cavity, wherein the substrate is directly supported on the supporting surface, said supporting surface at least partially surrounding the frame opening, wherein the cavity is substantially cuboid shaped and has four corner regions, and wherein the holding frame rests on the carrier plate only in the corner regions of the cavity;
   wherein the holding frame, when inserted into the cavity, partially rests on the carrier plate; and two holding regions at which the carrier plate can be supported for transporting the carrier plate, wherein the cavity is disposed between the two holding regions;
wherein the transportation device has two holding elements in such a manner that the carrier plate of the substrate holding device is held only in the two holding regions.

2. The substrate transportation system according to claim 1, the substrate holding device further comprising:
a further holding frame, which partially rests on the holding frame.

3. The substrate transportation system according to claim 2,
wherein the holding frame and the further holding frame are adapted in such a manner that a receiving space for receiving a peripheral portion of the substrate is provided between the holding frame and the further holding frame, when disposed in the cavity.

4. The substrate transportation system according to claim 2,
wherein the further holding frame has a further supporting surface for holding a further substrate above the substrate.

5. The substrate transportation system according to claim 2,
wherein the holding frame and the further holding frame are adapted in such a manner that they mutually engage in a form-fitting manner when the further holding frame is placed on the holding frame.

6. The substrate transportation system according to claim 5,
wherein the holding frame and the further holding frame comprise a plurality of centering structures that mutually match in pairs, such that the holding frame and the further holding frame are centered to each other when the further holding frame is placed onto the holding frame.

7. The substrate transportation system according to claim 2,
wherein a respective inner circumferential wall of the holding frame and the further holding frame has a chamfer.

8. The substrate transportation system according to claim 2, the substrate holding device further comprising:
another further holding frame, wherein the another further holding frame, when inserted into the cavity, is disposed above the further holding frame in such a manner that a receiving space for receiving a peripheral portion of a further substrate is provided between the another further holding frame and the further holding frame.

9. The substrate transportation system according to claim 2, the substrate holding device further comprising:
a vent opening for evacuating a gap between the holding frame and the further holding frame.

10. The substrate transportation system according to claim 2,
wherein the holding frame and the further holding frame, in a manner so as to match the cavity, comprise a substantially cuboid shaped external contour comprising four external corner portions, and wherein the holding frame and the further holding frame in the four external corner portions each comprise centering structures that mutually match in pairs.

11. The substrate transportation system according to claim 1, the holding frame furthermore comprising:
a recess, which is adjacent to the supporting surface and surrounds the latter at least partially.

12. The substrate transportation system according to claim 11,
wherein the recess is adjacent to an inner circumferential wall of the holding frame.

13. The substrate transportation system according to claim 1,
wherein the supporting surface is planar.

14. The substrate transportation system according to claim 1,
wherein the holding frame comprises or is formed from a metal.

15. The substrate transportation system according to claim 1,
wherein the holding frame comprises or is formed from a plastics material or a composite material; or
wherein the holding frame comprises or is formed from the plastics material and the composite material.

16. A processing assembly comprising:
a processing chamber for processing both sides of a plurality of substrates in a processing region of the processing chamber; and
a substrate transportation system for transporting or positioning the plurality of substrates in the processing region;
the substrate transportation system comprising a substrate holding device and a transportation device for transporting the substrate holding device, wherein the substrate holding device comprises:
a carrier plate comprising a cavity, wherein the cavity extends from an upper side of the carrier plate through the carrier plate to a lower side of the carrier plate;
a holding frame, which has a frame opening and a supporting surface for holding a substrate in the cavity, wherein the substrate is directly supported on the supporting surface, said supporting surface at least partially surrounding the frame opening, wherein the cavity is substantially cuboid shaped and has four corner regions, and wherein the holding frame rests on the carrier plate only in the corner regions of the cavity;
wherein the holding frame, when inserted into the cavity, partially rests on the carrier plate; and
two holding regions at which the carrier plate can be supported for transporting the carrier plate, wherein the cavity is disposed between the two holding regions;
wherein the transportation device has two holding elements in such a manner that the carrier plate of the substrate holding device is held only in the two holding regions.

17. The processing assembly according to claim 16, furthermore comprising:
two processing devices, wherein the transportation device is adapted for transporting or positioning the substrate holding device between the two processing devices.

18. A method for processing a substrate, the method comprising the following steps:
inserting a holding frame for holding the substrate into a cavity in a carrier plate, wherein the holding frame has a supporting surface for supporting the substrate, wherein the cavity is substantially cuboid shaped and has four corner regions, and wherein the holding frame rests on the carrier plate only in the corner regions of the cavity;

placing the substrate onto the supporting surface of the holding frame, wherein the substrate is directly supported on the supporting surface; and processing the substrate by a processing device through a frame opening while it is held in the cavity by means of the holding frame, wherein the processing device faces the frame opening;

transporting the carrier plate, wherein the carrier plate is held only in two holding regions, between which the cavity is disposed.

19. A substrate holding device comprising:

a carrier plate extending laterally;

two supporting regions that are laterally next to each other and extend parallel to each other at which the substrate holding device can be supported in order for the latter to be transported; and a plurality of substrate placement regions that are disposed between the two supporting regions, each of said substrate placement regions comprising a cavity, which from an upper side of the carrier plate extends through the carrier plate to a lower side of the carrier plate, and each of said substrate placement regions comprising a holding frame which has a frame opening and a supporting surface for holding a substrate in the cavity, wherein the substrate is directly supported on the supporting surface, said supporting surface at least partially surrounding the frame opening;

wherein the holding frame, when inserted into the cavity, partially rests on the carrier plate, wherein the cavity is substantially cuboid shaped and has four corner regions, and wherein the holding frame rests on the carrier plate only in the corner regions of the cavity.

* * * * *